(12) United States Patent
Maki et al.

(10) Patent No.: US 7,888,141 B2
(45) Date of Patent: Feb. 15, 2011

(54) MANUFACTURING METHOD FOR SEMICONDUCTOR INTEGRATED DEVICE

(75) Inventors: Hiroshi Maki, Tokyo (JP); Tsuyoshi Yokomori, Tokyo (JP); Tatsuyuki Okubo, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 128 days.

(21) Appl. No.: 12/137,522

(22) Filed: Jun. 11, 2008

(65) Prior Publication Data

US 2008/0318346 A1  Dec. 25, 2008

(30) Foreign Application Priority Data

| Jun. 19, 2007 | (JP) | 2007-160922 |
| Jun. 22, 2007 | (JP) | 2007-164820 |
| Apr. 8, 2008 | (JP) | 2008-099965 |

(51) Int. Cl.
  *H01L 21/00* (2006.01)
(52) U.S. Cl. .......... 438/5; 438/460
(58) Field of Classification Search .......... 438/5–18, 438/460–464
  See application file for complete search history.

(56) References Cited

U.S. PATENT DOCUMENTS

| 7,115,482 | B2 | 10/2006 | Maki et al. |
| 2005/0061856 | A1 | 3/2005 | Maki et al. |
| 2005/0200142 | A1 | 9/2005 | Isetani et al. |
| 2006/0252233 | A1* | 11/2006 | Honma et al. .......... 438/464 |
| 2007/0275544 | A1* | 11/2007 | Maki et al. .......... 438/464 |
| 2007/0287262 | A1 | 12/2007 | Maki et al. |

FOREIGN PATENT DOCUMENTS

| JP | 10-004258 A | 1/1998 |
| JP | 2003-133791 A | 5/2003 |
| JP | 2004-022995 A | 1/2004 |
| JP | 2004-023027 A | 1/2004 |
| JP | 2004-186352 A | 7/2004 |
| JP | 2004-009166 A | 1/2005 |
| JP | 2005-009166 A | 1/2005 |
| JP | 2005-093838 A | 4/2005 |
| JP | 2005-117019 A | 4/2005 |
| JP | 2005-150311 A | 6/2005 |
| JP | 2005-322815 A | 11/2005 |
| JP | 2006-165188 A | 6/2006 |
| JP | 2007-103777 A | 4/2007 |

* cited by examiner

*Primary Examiner*—Richard A. Booth
(74) *Attorney, Agent, or Firm*—Miles & Stockbridge P.C.

(57) ABSTRACT

In a chip pick-up process after dicing in an assembly process during manufacture of a semiconductor integrated circuit device it is an important subject to diminish a pick-up defect caused by the reduction in thickness of each chip which is proceeding in quick tempo. Particularly, bending of the chip peripheral portion caused by a peeling operation is very likely to induce cracking and chipping of the chip. In the present invention, to solve these problems, in case of peeling a chip from a dicing tape (adhesive tape) or the like while vacuum-chucking the chip by a chucking collet, the flow rate of a vacuum chucking system in the chucking collet is monitored to check a bent state of the chip before complete separation of the first chip from the adhesive tape.

24 Claims, 72 Drawing Sheets

MANUFACTURING METHOD FOR SEMICONDUCTOR INTEGRATED DEVICE

CLAIM OF PRIORITY

The present application claims priority from Japanese applications JP 2007-160922 filed on Jun. 19, 2007, JP 2007-164820 filed on Jun. 22, 2007 and JP 2008-099965 filed on Apr. 8, 2008, the contents of which are hereby incorporated by reference into this application.

FIELD OF THE INVENTION

The present invention relates to a technique applicable effectively to the die bonding technique or chip peeling technique (die pickup technique) in a manufacturing method for a semiconductor integrated circuit device (or a semiconductor device).

BACKGROUND OF THE INVENTION

In Japanese patent laid-open No. 2005-322815 (Patent Literature 1) there is disclosed a die bonding technique wherein die bonding is performed using a convex collet having elasticity, vacuum suction of the collet is released into atmospheric pressure to remove the chucking force for the chip, and the collet is raised in this state.

In Japanese patent laid-open No. Hei 10 (1998)-004258 (Patent Literature 2) there is disclosed a chip mounting technique wherein a through hole is formed in one side face of a collet for mounting a chip or the like to prevent solder from being sucked up during the mounting work.

In Japanese patent laid-open No. 2006-165188 (Patent Literature 3) there is disclosed a die bonding technique wherein vacuum suction holes are formed in only the peripheral portion of a collet rubber chip (hardness JIS-A60) having elasticity so as not to let voids remain in a thin-film chip and die bonding is preformed in a downwardly convex state of the chip.

In Japanese patent laid-open No. 2004-022995 (Patent Literature 4) or No. 2005-150311 (Patent Literature 5) there is disclosed a convex collet having elasticity.

In Japanese patent laid-open No. 2005-093838 (Patent Literature 6) or US patent laid-open No. 2005-0061856 (Patent Literature 7) there is disclosed a die bonding technique wherein temporary pressure bonding and eternal pressure bonding are carried out in separate stages.

In Japanese patent laid-open No. 2005 91662004-9166 (Patent Literature 8) or US patent laid-open No. 2005-0200142 (Patent Literature 9) it is disclosed that, in connection with a chucking nozzle such as an electronic part mounter, whether a part has been chucked or not is detected on the basis of a change in flow rate detected by an air flow sensor.

In Japanese patent laid-open No. 2003-133791 (Patent Literature 10), No. 2004-23027 (Patent Literature 11), or No. 2007-103777 (Patent Literature 12), it is disclosed that, when chucking and conveying an electronic part by a chucking nozzle such as an electronic part mounter, whether the part is in a properly chucked state or not is detected on the basis of a change in flow rate detected by an air flow sensor.

In Japanese patent laid-open No. 2004-186352 (Patent Literature 13) or US patent laid-open No. 2006-0252233 (Patent Literature 14) it is disclosed that, in connection with picking up a thin-film chip after wafer dicing, when applying ultrasonic oscillation from below a dicing tape and peeling the chip from an adhesive sheet (dicing tape) from above by a chucking collet, a chucking flow rate of the chucking collet is measured to make sure whether the chip was completely separated from the dicing tape and chucked by the chucking collet.

In Japanese patent laid-open No. 2005-117019 (Patent Literature 15) or U.S. Pat. No. 7,115,482 (Patent Literature 16) it is disclosed that, in connection with picking up a thin-film chip after wafer dicing, a lower surface of the chip is stuck up from below a dicing tape by a stick-up mechanism and the chip is peeled from an adhesive sheet (dicing tape) from above by a chucking collet.

[Patent Literatures]
1. Japanese patent laid-open No. 2005-322815
2. Japanese patent laid-open No. Hei 10 (1998)-004258
3. Japanese patent laid-open No. 2006-165188
4. Japanese patent laid-open No. 2004-022995
5. Japanese patent laid-open No. 2005-150311
6. Japanese patent laid-open No. 2005-093838
7. US patent laid-open No. 2005-0061856
8. Japanese patent laid-open No. 2004-9166
9. US patent laid-open No. 2005-0200142
10. Japanese patent laid-open No. 2003-133791
11. Japanese patent laid-open No. 2004-23027
12. Japanese patent laid-open No. 2007-103777
13. Japanese patent laid-open No. 2004-186352
14. US patent laid-open No. 2006-0252233
15. Japanese patent laid-open No. 2005-117019
16. U.S. Pat. No. 7,115,482

SUMMARY OF THE INVENTION

In a chip pick-up process or a die bonding process after dicing in an assembly process during manufacture of a semiconductor integrated circuit device, it is now an important subject to diminish a pick-up defect or a die bonding defect caused by the reduction in thickness of each chip which is proceeding in quick tempo. Particularly, according to investigations made by the present inventors it has become clear that bending of a chip peripheral portion resulting from a peeling operation is very likely to cause cracking or chipping of the chip and that the formation of voids caused by a vacuum chucking operation of a collet in die bonding is unignorable. The present invention has been accomplished for solving these problems.

It is an object of the present invention to provide a highly reliable manufacturing process for a semiconductor integrated circuit device.

The above and other objects and novel features of the present invention will become apparent from the following description and the accompanying drawings.

The following is an outline of typical inventions as disclosed herein.

According to one aspect of the present invention, in case of vacuum-chucking and peeling a chip from a dicing tape (adhesive tape) or the like with use of a chucking collet, the flow rate of a vacuum chucking system in the chucking collet is monitored to monitor the state of bending of the chip before complete separation of the first chip from the adhesive tape.

According to another aspect of the present invention, in case of vacuum-chucking and peeling a chip from a dicing tape (adhesive tape) or the like with use of a chucking collet or in case of vacuum-chucking a chip by a collet and performing die bonding, the vacuum-chucking operation of the chucking collet is stopped in an early stage to avoid the formation of voids which is attributable to the state of bending caused by vacuum chucking of the chip in die bonding.

The following is a brief description of effects obtained by the typical inventions as disclosed herein.

In the one aspect of the present invention, since the state of bending of the chip before complete separation from the adhesive tape can be monitored by monitoring the flow rate of the vacuum chucking system in the chucking collet, it is possible to provide a pick-up process free of cracking or chipping.

In the other aspect of the present invention, in case of vacuum-chucking the chip with a collet and performing die bonding, the vacuum-chucking operation of the chucking collet is stopped in an early stage, allowing the chip to land in the state of atmospheric pressure, thus permitting the provision of a die bonding process with few voids.

DETAILED DESCRIPTION OF THE PREFERRED EMBODIMENTS

Outline of Embodiments

Figure 1:
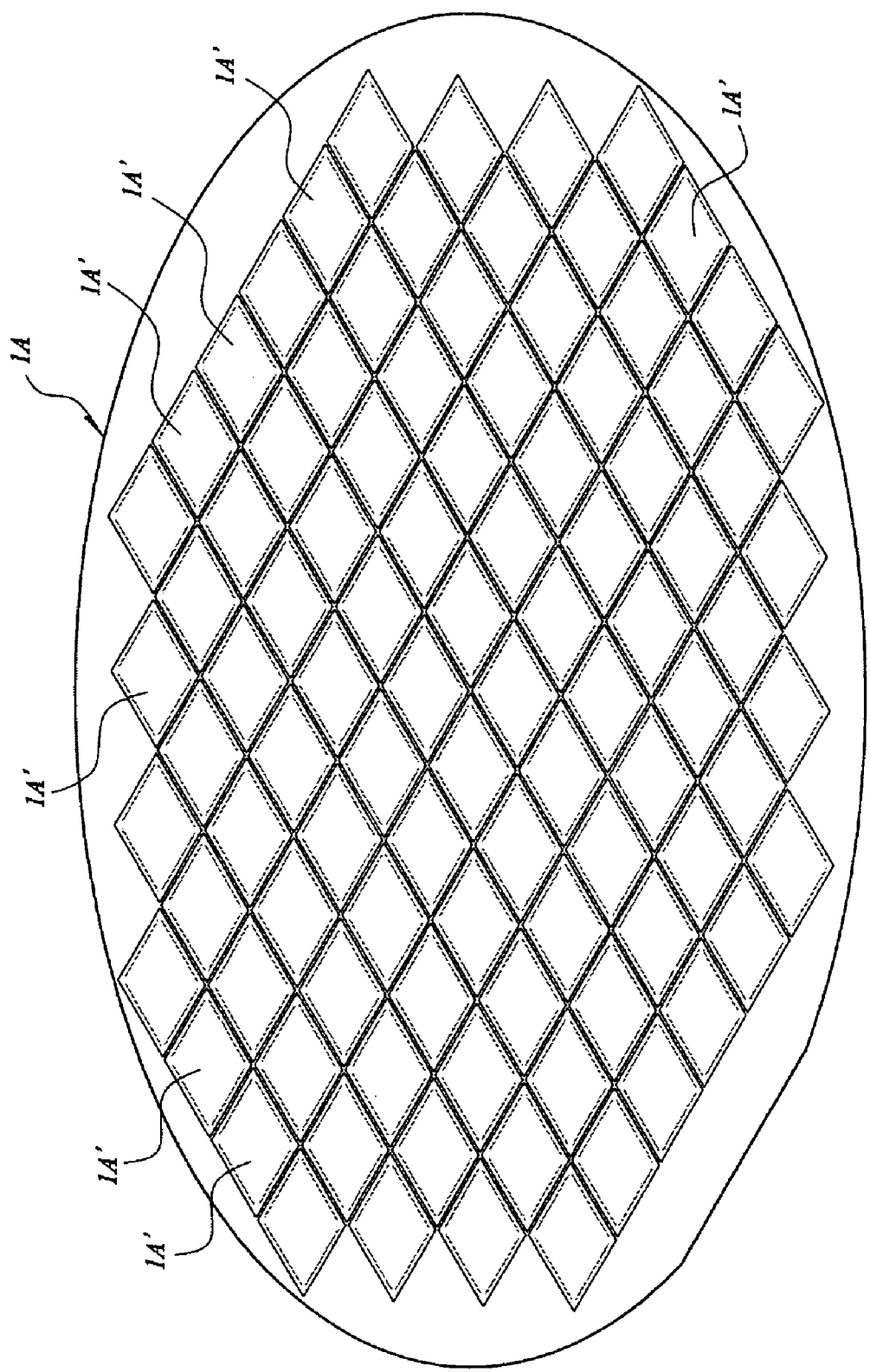
FIG. 1 is a perspective view of semiconductor chips used in a method for manufacturing a semiconductor integrated circuit device according to an embodiment of the present invention.

The following is an outline of typical embodiments of the present invention as disclosed herein.

1. A method for manufacturing a semiconductor integrated circuit device, comprising the steps of:

(a) supplying a plurality of chips divided in individual chip regions while being arranged substantially in their original two-dimensional layout upon a wafer, to a chip treating apparatus with their back surfaces fixed to an adhesive tape; and (b) vacuum-chucking a surface of a first chip out of the chips with a chucking collet and peeling the adhesive tape from the back surface of the first chip in a state in which the adhesive tape over the back surface of the first chip is vacuum-chucked to an upper surface of a lower base, the step (b) comprising a following sub-step of:

(b1) monitoring a bent state of the first chip before complete separation of the first chip from the adhesive tape by measuring the flow rate of a vacuum chucking system in the chucking collet.

2. A method according to the above 1, wherein the step (b) further comprises the following sub-steps of:

(b2) continuing or interrupting the peeling operation on the basis of the monitor information obtained in the sub-step (b1); and (b3) in case of interrupting the peeling operation, resuming the peeling operation on the basis of the monitor information obtained in the sub-step (b1).

3. A method according to the above 1 or 2, wherein the step (b) further comprises the following sub-steps of:

(b4) continuing or decelerating the peeling operation on the basis of the monitor information obtained in the sub-step (b1); and (b5) in case of decelerating the peeling operation, re-accelerating the peeling operation on the basis of the monitor information obtained in the sub-step (b1).

4. A method according to any of the above 1 to 3, wherein the step (b) further comprises a following sub-step of:

(b6) on the basis of the monitor information obtained in the sub-step (b1), continuing the peeling operation, or retreating the peeling operation until the bent state of the first chip falls under an allowable range.

5. A method according to any of the above 1 to 4, wherein the step (b) further comprises a following sub-step of:

(b7) on the basis of the monitor information obtained in the sub-step (b1), continuing the peeling operation, or decelerating the peeling operation until the bent state of the first chip falls under an allowable range.

6. A method according to any of the above 1 to 5, wherein the step (b) further comprises the following sub-steps of:

(b8) raising the chucking collet until the bent state of the first chip exceeds an allowable range; and (b9) after the sub-step (b8) and on the basis of the monitor information obtained in the sub-step (b1), continuing the rise of the chucking collet, or bringing down the chucking collet until the bent state of the first chip falls under the allowable range.

7. A method according to any of the above 1 to 6, wherein the step (b) further comprises the following sub-steps of:

(b10) raising the chucking collet until the bent state of the first chip exceeds an allowable range; and (b11) after the step (b10) and on the basis of the monitor information obtained in the sub-step (b1), continuing the rise of the chucking collet, or making the chucking collet stand by until the bent state of the first chip falls under the allowable range.

8. A method according to any of the above 1 to 7, wherein the step (b) further comprises the following sub-steps of:

(b12) raising the chucking collet until the bent state of the first chip exceeds an allowable range; and

(13) after the sub-step (b12) and on the basis of the monitor information obtained in the sub-step (b1), continuing the rise of the chucking collet, or decelerating the chucking collet until the bent state of the first chip falls under the allowable range.

9. A method according to any of the above 1 to 8, wherein the step (b) further comprises the following sub-steps of:

(b14) raising a stick-up block as a principal portion of the lower base together with the chucking collet;

(b15) after the sub-step (b14), bringing down only the stick-up block out of the stick-up block and the chucking collet until the bent state of the first chip exceeds an allowable range; and (b16) after the sub-step (b15) and on the basis of the monitor information obtained in the sub-step (b1), continuing the descent of the stick-up block, or raising the stick-up block until the bent state of the first chip falls under the allowable range.

10. A method according to any of the above 1 to 9, wherein the step (b) further comprises the following sub-steps of:

(b17) raising a stick-up block as a principal portion of the lower base together with the chucking collet;

(b18) after the sub-step (b17), bringing down only the stick-up block out of the stick-up block and the chucking collet until the bent state of the first chip exceeds an allowable range; and (b19) after the sub-step (b18) and on the basis of the monitor information obtained in the sub-step (b1), continuing the descent of the stick-up block, or making the stick-up block stand by until the bent state of the first chip falls under the allowable range.

11. A method according to any of the above 1 to 10, wherein the step (b) further comprises the following sub-steps of:

(b20) raising a stick-up block as a principal portion of the lower base together with the chucking collet;

(b21) after the sub-step (b20), bringing down only the stick-up block out of the stick-up block and the chucking collet until the bent state of the first chip exceeds an allowable range; and (b22) after the sub-step (b21) and on the basis of the monitor information obtained in the sub-step (b1), continuing the descent of the stick-up block, or decelerating the descent of the stick-up block until the bent state of the first chip falls under the allowable range.

12. A method according to any of the above 1 to 11, wherein the step (b) further comprises the following sub-steps of:

(b23) causing a slide plate serving as a principal portion of the lower base to slide so as to decrease an overlap thereof with the first chip until the bent state of the first chip exceeds an allowable range; and (b24) on the basis of the monitor information obtained in the sub-step (b1), making the slide plate stand by until the bent state of the first chip falls under the allowable range.

13. A method according to any of the above 1 to 12, wherein the step (b) further comprises the following sub-steps of:

(b25) continuing or interrupting the peeling operation on the basis of the monitor information obtained in the sub-step (b1); and (b26) in case of interrupting the peeling operation, resuming the peeling operation, or retreating the peeling operation until the bent state of the first chip falls under the allowable range, on the basis of the monitor information obtained in the sub-step (b1).

14. A method according to any of the above 1 to 13, wherein the step (b) further comprises the following steps of:

(b27) continuing or decelerating the peeling operation on the basis of the monitor information obtained in the sub-step (b1); and (b28) in case of decelerating the peeling operation, re-accelerating the peeling operation, or retreating the peeling operation until the bent state of the first chip falls under an allowable range, on the basis of the monitor information obtained in the sub-step (b1).

15. A method according to any of the above 1 to 14, wherein the step (b) further comprises the following sub-steps of:

(b29) raising the chucking collet until the bent state of the first chip exceeds an allowable range;

(b30) after the sub-step (b29) and on the basis of the monitor information obtained in the sub-step (b1), continuing the rise of the chucking collet, or making the chucking collet stand by until the bent state of the first chip falls under the allowable range; and (b31) in case of making the chucking collet stand by until the bent state of the first chip falls under the allowable range, resuming the rise of the chucking collet, or bringing down the chucking collet until the bent state of the first chip falls under the allowable range, on the basis of the monitor information obtained in the sub-step (b1).

16. A method according to any of the above 1 to 15, wherein the step (b) further comprises the following sub-steps of:

(b32) raising a stick-up block as a principal portion of the lower base together with the chucking collet;

(b33) after the sub-step (b32), bringing down only the stick-up block out of the stick-up block and the chucking collet until the bent state of the first chip exceeds an allowable range;

(b34) after the sub-step (b33) and on the basis of the monitor information obtained in the sub-step (b1), continuing the descent of the stick-up block, or making the stick-up block stand by until the bent state of the first chip falls under the allowable range; and (b35) in case of making the stick-up block stand by until the bent state of the first block falls under the allowable range, resuming the descent of the stick-up block, or raising the stick-up block until the bent state of the first chip falls under the allowable range, on the basis of the monitor information obtained in the sub-step (b1).

17. A method according to any of the above 1 to 16, wherein the step (b) further comprises the following sub-steps of:

(b36) raising the chucking collet until the bent state of the first chip exceeds an allowable range;

(b37) after the sub-step (b36) and on the basis of the monitor information obtained in the sub-step (b1), continuing the rise of the chucking collet, or decelerating the chucking collet until the bent state of the first chip falls under the allowable range; and (b38) in case of decelerating the chucking collet until the bent state of the first chip falls under the allowable range, resuming the rise of the chucking collet, or bringing down the chucking collet until the bent state of the first chip falls under the allowable range, on the basis of the monitor information obtained in the sub-step (b1).

18. A method according to any of the above 1 to 17, wherein the step (b) further comprises the following sub-steps of:

(b39) raising a stick-up block as a principal portion of the lower base together with the chucking collet;

(b40) after the sub-step (b39), bringing down only the stick-up block out of the stick-up block and the chucking collet until the bent state of the first chip exceeds an allowable range;

(b41) after the sub-step (b40) and on the basis of the monitor information obtained in the sub-step (b1), continuing the descent of the stick-up block, or decelerating the descent of the stick-up block until the bent state of the first chip falls under the allowable range; and (b42) in case of making the stick-up block stand by until the bent state of the first chip falls under the allowable range, resuming the descent of the stick-up block, or raising the stick-up block until the bent state of the first chip falls under the allowable range, on the basis of the monitor information obtained in the sub-step (b1).

19. A method according to any of the above 1 to 18, wherein an adhesive layer is formed beforehand over the back surface of the first chip.

20. A method for manufacturing a semiconductor integrated circuit device, comprising the steps of:

(a) supplying a plurality of chips divided in individual chip regions while being arranged substantially in their original two-dimensional layout upon a wafer, to a chip treating apparatus with their back surfaces fixed to an adhesive tape;

(b) vacuum-chucking a surface of a first chip out of the chips with a chucking collet and peeling the adhesive tape from the back surface of the first chip in a state in which the the adhesive tape over the back surface of the first chip is vacuum-chucked to an upper surface of a lower base;

the step (b) comprising the following sub-steps of:

(b1) monitoring a bent state of the first chip before complete separation of the first chip from the adhesive tape by measuring the flow rate of a vacuum chucking system in the chucking collet, and (b2) determining an optimum speed (a speed to be applied to a subsequent chip) of the peeling operation on the basis of the monitor information obtained in the sub-step (b1), the method further comprising a following step of:

(c) after the step (b), vacuum-chucking a surface of a second chip out of the plural chips with the chucking collet, and in a state in which the adhesive tape over the back surface of the second chip is vacuum-chucked to the upper surface of the lower base, carrying out the peeling operation at the optimum speed to peel the adhesive tape from the back surface of the second chip.

21. A method according to the above 20, wherein the first chip may be a non-product chip (or may be a product chip).

22. A method according to the above 20, wherein the second chip is a product chip.

23. A method according to any of the above 20 to 22, wherein an adhesive layer for die bonding is formed beforehand over the back surface of the first chip and that of the second chip.

24. A method for manufacturing a semiconductor integrated circuit device, comprising the steps of:

(a) supplying a plurality of chips divided in individual chip regions while being arranged substantially in their original two-dimensional layout upon a wafer, to a chip treating apparatus with their back surfaces fixed to an adhesive tape;

(b) vacuum-chucking a surface of a first chip out of the chips with a chucking collet and peeling the adhesive tape from the back surface of the first chip in a state in which the adhesive tape over the back surface of the first chip is vacuum-chucked to an upper surface of a lower base, the step (b) comprising the following sub-steps of:

(b1) monitoring a bent state of the first chip before complete separation of the first chip from the adhesive tape by measuring the flow rate of a vacuum chucking system in the chucking collet;

(b2) raising a stick-up block as a principal portion of the lower base together with the chucking collet; and (b3) determining an optimum rising height of the stick-up block on the basis of the monitor information obtained in the sub-step (b1), the method further comprising a following step of:

(c) after the step (b), vacuum-chucking a surface of a second chip out of the chips with a chucking collet and raising the stick-up block by only a distance corresponding to the optimum rising height in a state in which the adhesive tape over the back surface of the second chip is vacuum-chucked to the upper surface of the lower base.

25. A method according to the above 24, wherein the first chip is a non-product chip (or may be a product chip).

26. A method according to the above 24, wherein the second chip is a product chip.

27. A method according to any of the above 24 to 26, wherein an adhesive layer for die bonding is formed beforehand over the back surface of the first chip and that of the second chip.

28. A method for manufacturing a semiconductor integrated circuit device, comprising the steps of:

(a) supplying a plurality of chips divided in individual chip regions while being arranged substantially in their original two-dimensional layout upon a wafer, to a chip treating apparatus with their back surfaces fixed to an adhesive tape;

(b) vacuum-chucking a surface of a first chip out of the chips with a chucking collet and peeling the adhesive tape from the back surface of the first chip in a state in which the adhesive tape over the back surface of the first chip is vacuum-chucked to an upper surface of a lower base, the step (b) comprising the following steps of:

(b1) monitoring a bent state of the first chip before complete separation of the first chip from the adhesive tape by measuring the flow rate of a vacuum chucking system in the chucking collet;

(b2) causing a slide plate as a principal portion of the lower base to slide so as to decrease an overlap thereof with the first chip until the bent state of the first chip exceeds an allowable range; and (b3) determining an optimum sliding speed of the slide plate on the basis of the monitor information obtained in the sub-step (b1), the method further comprising a following step of:

(c) after the step (b), vacuum-chucking a surface of a second chip out of the chips with a chucking collet and, in a state in which the back surface of the second chip is vacuum-chucked to the upper surface of the lower base, causing the slide plate to slide at the optimum sliding speed so as to decrease an overlap thereof with the second chip, thereby peeling the adhesive tape from the back surface of the second chip.

29. A method according to the above 28, wherein the first chip is a non-product chip (or may be a product chip).

30. A method according to the above 29, wherein the second chip is a product chip.

31. A method according to any of the above 28 to 30, wherein an adhesive layer for die bonding is formed beforehand over the back surface of the first chip and that of the second chip.

Next, other typical embodiments of the present invention as disclosed herein will be outlined below.

1. A method for manufacturing a semiconductor integrated circuit device, comprising the steps of:

(a) supplying a plurality of chips to a chip pick-up section of a chip treating apparatus;

(b) in a state in which a surface of a first chip out of the chips supplied to the chip pick-up section is vacuum-chucked to a lower surface of a rubber chip of a chucking collet, conveying the first chip toward a die bonding section of the chip treating apparatus;

(c) after the step (b), in a state in which mainly the surface of the first chip is held by physical chucking (chucking no using a vacuum source, this is true also in the following) between it and the lower surface of the rubber chip, causing a back surface side of the first chip to be landed over an upper surface of a wiring substrate placed in the die bonding section of the chip treating apparatus; and (d) after the step (c), pressing the surface of the first chip downward by the lower surface of the rubber chip, thereby fixing the first chip to the upper surface of the wiring substrate through an adhesive layer formed between the back surface of the first chip and the upper surface of the wiring substrate.

2. A method according to the above 1, wherein in the steps (c) to (d) the vacuum chucking is OFF (chucking not using vacuum chucking, i.e., chucking not using a vacuum source, this is true also in the following).

3. A method according to the above 1 or 2, wherein the rubber chip has a central vacuum suction hole. (It is not always necessary to have such a central vacuum suction hole. Vacuum suction holes may be formed in one row in only the peripheral portion in case of not utilizing leak detection. Even in case of detecting leak, at least plural groups of vacuum suction holes different in the distance from the center will suffice. This is also true in the following.)

4. A method according to any of the above 1 to 3, wherein the step (b) comprises the following sub-steps of:

(b1) bringing down the first chip at a first speed toward the upper surface of the wiring substrate; and (b2) subsequent to the step (b1), bringing down the first chip toward the upper surface of the wiring substrate at a second speed lower than the first speed, further, the step (c) comprises a following sub-step of:

(c1) bringing down the first chip toward the upper surface of the wiring substrate at the second speed until landing.

5. A method according to any of the above 1 to 4, wherein the rubber chip contains elastomer as a principal component and has a hardness of 10 or higher and lower than 70.

6. A method according to any of the above 1 to 4, wherein the rubber chip contains elastomer as a principal component and has a hardness of 15 or higher and lower than 55.

7. A method according to any of the above 1 to 4, wherein the rubber chip contains elastomer as a principal component and has a hardness of 20 or higher and lower than 40.

8. A method according to any of the above 1 to 7, wherein the elastomer is a thermosetting elastomer.

9. A method according to any of the above 1 to 8, wherein the elastomer is a silicone-based elastomer.

10. A method according to any of the above 1 to 9, wherein the adhesive layer is a DAF layer.

11. A method according to any of the above 1 to 10, further comprising a following step of:

(e) before the step (b), radiating UV light from an adhesive tape side to the chips whose back surfaces are fixed to the adhesive tape.

12. A method for manufacturing a semiconductor integrated circuit device, comprising the steps of:

(a) supplying a plurality of chips divided in individual chip regions while being arranged substantially in their original two-dimensional layout upon a wafer, to a chip treating apparatus with their back surfaces fixed to an adhesive tape; and (b) vacuum-chucking a surface of a first chip out of the chips to a lower surface of a rubber chip of a chucking collet and, in a state in which the adhesive tape over the back surface of the first chip is vacuum-chucked to an upper surface of a lower base, peeling the adhesive tape from the back surface of the first chip, the rubber chip containing elastomer as a principal component and having a hardness of 15 or higher and lower than 55.

13. A method according to the above 12, wherein the hardness is 20 or higher and lower than 40.

14. A method according to the above 12 or 13, wherein the elastomer is a thermosetting elastomer.

15. A method according to any of the above 12 to 14, wherein the elastomer is a silicone-based elastomer.

16. A method for manufacturing a semiconductor integrated circuit device, comprising the steps of:

(a) supplying a plurality of chips to a chip pick-up section of a chip treating apparatus;

(b) in a state in which a surface of a first chip out of the chips supplied to the chip pick-up section is vacuum-chucked to a lower surface of a rubber chip of a chucking collet, conveying the first chip toward a die bonding section of the chip treating apparatus;

(c) after the step (b), in a state in which mainly the surface of the first chip is chucked to the lower surface of the rubber chip, causing a back surface side of the first chip to be landed over an upper surface of a wiring substrate placed in the die bonding section of the chip treating apparatus; and (d) after the step (c), pressing the surface of the first chip downward by the lower surface of the rubber chip, thereby fixing the first chip to the upper surface of the wiring substrate through an adhesive layer formed between the back surface of the first chip and the upper surface of the wiring substrate, the rubber chip containing elastomer as a principal component and having a hardness of 15 or higher and lower than 55.

17. A method according to the above 16, wherein the hardness of the elastomer is 20 or higher and lower than 40.

18. A method according to the above 16 or 17, wherein the elastomer is a thermosetting elastomer.

19. A method according to any of the above 16 to 18, wherein the elastomer is a silicone-based elastomer.

20. A method according to any of the above 16 to 19, wherein a leak hole is formed in a vacuum suction system provided within a body of the chucking collet and vacuum chucking is carried out in a leaking state through the leak hole.

21. A method according to any of the above 16 to 20, wherein the adhesive layer is a DAF layer.

22. A method according to any of the above 16 to 21, further comprising a following step of:

(e) before the step (b), radiating UV light from the adhesive tape side to the chips whose back surfaces are fixed to the adhesive tape.

23. A method for manufacturing a semiconductor integrated circuit device, comprising the steps of:

(a) supplying a plurality of chips divided in individual chip regions while being arranged in their original two-dimensional layout upon a wafer, to a chip treating apparatus with their back surfaces fixed to an adhesive tape;

(b) vacuum-chucking a surface of a first chip out of the chips to a lower surface of a rubber chip of the chucking collet and, in a state in which the adhesive tape over the back surface of the first chip is vacuum-chucked to an upper surface of a lower base, peeling the adhesive tape from the back surface of the first chip;

(c) after the step (b), conveying the first chip toward a die bonding section of the chip treating apparatus in a state in which the surface of the first chip is chucked to the lower surface of the rubber chip of the chucking collet;

(d) after the step (c), causing the back surface side of the first chip to be landed over an upper surface of a wiring substrate placed in the die bonding section of the chip treating apparatus in a state in which the surface of the first chip is chucked to the lower surface of the rubber chip; and (e) after the step (d), pressing the surface of the first chip by the lower surface of the rubber chip, thereby fixing the first chip to the upper surface of the wiring substrate through an adhesive layer formed between the back surface of the first chip and the upper surface of the wiring substrate, the rubber chip containing elastomer as a principal component and having a hardness of 15 or higher and lower than 55.

24. A method according to the above 23, wherein the hardness is 20 or higher and lower than 40.

25. A method according to the above 23 or 24, wherein the elastomer is a thermosetting elastomer.

26. A method according to any of the above 23 to 25, wherein the elastomer is a silicone-based elastomer.

27. A method according to any of the above 23 to 26, wherein a leak hole is formed in a vacuum suction system provided within a body of the chucking collet and vacuum chucking is performed in a leaking state through the leak hole.

28. A method according to any of the above 23 to 27, wherein the adhesive layer is a DAF layer.

29. A method according to any of the above 23 to 28, further comprising a following step of:

(e) before the step (b), radiating UV light to the chips from the adhesive tape side of the chips whose back surfaces are fixed to the adhesive tape.

30. A method for manufacturing a semiconductor integrated circuit device, comprising the steps of:

(a) supplying a plurality of chips to a chip pick-up section of a chip treating apparatus;

(b) in a state in which a surface of a first chip out of the chips supplied to the chip pick-up section is vacuum-chucked to a lower surface of a rubber chip of a chucking collet, conveying the first chip toward a die bonding section of the chip treating apparatus;

(c) after the sep (b), in a state in which the surface of the first chip is chucked to the lower surface of the rubber chip, causing a back surface side of the first chip to be landed over an upper surface of a wiring substrate placed in the die bonding section of the chip treating apparatus; and (d) after the step (c), pressing the surface of the first chip downward by the lower surface of the rubber chip, thereby fixing the first chip to the upper surface of the wiring substrate through an adhesive layer formed between the back surface of the first chip and the upper surface of the wiring substrate, the rubber chip having a central vacuum suction hole, containing elastomer as a principal component and having a hardness of 10 or higher and lower than 70.

31. A method according to the above 30, wherein the elastomer is a thermosetting elastomer.

32. A method according to the above 30 or 31, wherein the elastomer is a silicone-based elastomer.

33. A method according to any of the above 30 to 32, wherein a leak hole is formed in a vacuum suction system provided within a body of the chucking collet and vacuum chucking is performed in a leaking state through the leak hole.

34. A method according to any of the above 30 to 33, wherein the adhesive layer is a DAF member layer.

35. A method according to any of the above 30 to 34, further comprising a following step of:

(e) before the step (b), radiating UV light to the chips from the adhesive tape side of the chips whose back surfaces are fixed to the pressure-sensitive adhesive tape.

36. A method according to any of the above 30 to 35, wherein the chucking to the lower surface of the rubber chip in the step (c) is done mainly by physical chucking.

37. A method according to any of the above 30 to 36, wherein the vacuum chucking is turned OFF in the steps (c) to (d).

38. A method for manufacturing a semiconductor integrated circuit device, comprising the steps of:

(a) supplying a plurality of chips to a chip pick-up section of a chip treating apparatus;

(b) in a state in which a surface of a first chip out of the chips supplied to the chip pick-up section is vacuum-chucked to a lower surface of a rubber chip of a chucking collet, conveying the first chip toward a die bonding section of the chip treating apparatus;

(c) after the step (b), in a state in which mainly the surface of the first chip is chucked to the lower surface of the rubber chip, causing a back surface side of the first chip to be landed over an upper surface of a wiring substrate placed in the die bonding section of the chip treating apparatus; and (d) after the step (c), pressing the surface of the first chip downward by the lower surface of the rubber chip, thereby fixing the first chip to the upper surface of the wiring substrate through an adhesive layer formed between the back surface of the first chip and the upper surface of the wiring substrate, wherein a leak hole is formed in a vacuum suction system provided within a body of the chucking collet and vacuum chucking is carried out in a leaking state through the leak hole.

39. A method according to the above 38, wherein the rubber chip has a central vacuum suction hole and containing elastomer as a principal component, the elastomer having a hardness of 10 or higher and lower than 70.

40. A method according to the above 38 or 39, wherein the adhesive layer is a DAF layer.

41. A method according to any of the above 38 to 40, further comprising a following step of:

(e) before the step (b), radiating UV light to the chips from the adhesive tape side of the chips whose back surfaces are fixed to the adhesive tape.

42. A method according to any of the above 38 to 41, wherein the chucking to the lower surface of the rubber chip in the step (c) is done mainly by physical chucking.

43. A method according to any of the above 38 to 42, wherein the vacuum chucking is turned OFF in the steps (c) to (d).

44. A method for manufacturing a semiconductor integrated circuit device, comprising the steps of:

(a) supplying a plurality of chips to a chip pick-up section of a chip treating apparatus;

(b) in a state in which a surface of a first chip out of the chips supplied to the chip pick-up section is vacuum-chucked to a lower surface of a rubber chip of a chucking collet, conveying the first chip toward a die bonding section of the chip treating apparatus;

(c) after the step (b), in a state in which mainly the surface of the first chip is held by physical chucking between it and the lower surface of the rubber chip, causing a back surface side of the first chip to be landed over an upper surface of a wiring substrate placed in the die bonding section of the chip treating apparatus;

(d) after the step (c), pressing the surface of the first chip downward by the lower surface of the rubber chip, thereby fixing the first chip to the upper surface of the wiring substrate through an adhesive layer formed between the back surface of the first chip and the upper surface of the wiring substrate;

(e) in a state in which a surface of a second chip out of the chips supplied to the chip pick-up section is vacuum-chucked to the lower surface of the rubber chip of the chucking collet, conveying the second chip toward the die bonding section of the chip treating apparatus;

(f) after the step (e), in a state in which mainly the surface of the second chip is held by physical chucking between it and the lower surface of the rubber chip, causing a back surface side of the second chip to be landed over the upper surface of the wiring substrate placed in the die bonding section of the chip treating apparatus;

(g) after the step (f), pressing the surface of the second chip downward by the lower surface of the rubber chip, thereby fixing the second chip to the upper surface of the wiring substrate through the adhesive layer formed between the back surface of the first chip and the upper surface of the wiring substrate; and (h) after the step (g), pressing the surface side of the first chip and that of the second chip together by a member different from the collet to accelerate theremocompression bonding thereof with the upper surface of the wiring substrate.

45. A method according to the above 44, wherein the rubber chip has a central vacuum suction hole, contains elastomer as a principal component and has a hardness of 10 or higher and lower than 70.

46. A method according to the above 44 or 45, wherein the adhesive layer is a DAF layer.

47. A method according to any of the above 44 to 46, further comprising a following step of:

(e) before the step (b), radiating UV light to the chips from the adhesive tape side of the chips whose back surfaces are fixed to the adhesive tape.

48. A method according to any of the above 44 to 47, wherein the chucking to the lower surface of the rubber chip in the steps (c) and (f) is done mainly by physical chucking.

49. A method according to any of the above 44 to 48, wherein the vacuum chucking is turned OFF in the steps (c) to (d) and (f) to (g).

50. A method according to any of the above 44 and 46 to 49, wherein the rubber chip contains elastomer as a principal component and has a hardness of 10 or higher and lower than 70.

Next, further embodiments of the present invention as disclosed herein will be outlined below.

51. A method for manufacturing a semiconductor integrated circuit device, comprising the steps of:

(a) supplying a plurality of chips divided in individual chip regions while being arranged substantially in their original two-dimensional layout upon a wafer, to a chip treating apparatus with their back surfaces fixed to an adhesive tape; and (b) vacuum-chucking a surface of a first chip out of the chips to a lower surface of a rubber chip of a chucking collet and peeling the adhesive tape from the back surface of the first chip in a state in which the adhesive tape over the back surface of the first chip is vacuum-chucked to an upper surface of a lower base, the step (b) comprising a following sub-step of:

(b1) monitoring a bent state of the first chip before complete separation of the first chip from the adhesive tape by measuring the flow rate of a vacuum chucking system in the chucking collet, the rubber chip containing elastomer as a principal component and having a hardness of 10 or higher and lower than 70.

52. A method according to the above 51, wherein the step (b) further comprises the following sub-steps of:

(b2) continuing or interrupting the peeling operation on the basis of the monitor information obtained in the sub-step (b1); and (b3) in case of interrupting the peeling operation, resuming the peeling operation on the basis of the monitor information obtained in the sub-step (b1).

53. A method according to the above 51 or 52, wherein the step (b) further comprises the following sub-steps of:

(b4) continuing or decelerating the peeling operation on the basis of the monitor information obtained in the sub-step (b1); and (b5) in case of decelerating the peeling operation, re-accelerating the peeling operation on the basis of the monitor information obtained in the sub-step (b1).

54. A method according to any of the above 51 to 53, wherein the step (b) further comprises a following sub-step of:

(b6) on the basis of the monitor information obtained in the sub-step (b1), continuing the peeling operation, or retreating the peeling operation until the bent state of the first chip falls under an allowable range.

55. A method according to any of the above 51 to 54, wherein the step (b) further comprises a following sub-step of:

(b7) on the basis of the monitor information obtained in the sub-step (b1), continuing the peeling operation, or decelerating the peeling operation until the bent state of the first chip falls under an allowable range.

56. A method according to any of the above 51 to 55, wherein the step (b) further comprises the following sub-steps of:

(b8) raising the chucking collet until the bent state of the first chip exceeds an allowable range; and (b9) after the sub-step (b8) and on the basis of the monitor information obtained in the sub-step (b1), continuing the rise of the chucking collet, or bringing down the chucking collet until the bent state of the first chip falls under the allowable range.

57. A method according to any of the above 51 to 56, wherein the step (b) further comprises the following sub-steps of:

(b10) raising the chucking collet until the bent state of the first chip exceeds an allowable range; and (b11) after the sub-step (b10) and on the basis of the monitor information obtained in the sub-step (b1), continuing the rise of the chucking collet, or making the chucking collet stand by until the bent state of the first chip falls under the allowable range.

58. A method according to any of the above 51 to 57, wherein the step (b) further comprises the following sub-steps of:

(b12) raising the chucking collet until the bent state of the first chip exceeds an allowable range; and (b13) after the sub-step (b12) and on the basis of the monitor information obtained in the sub-step (b1), continuing the rise of the chucking collet, or decelerating the chucking collet until the bent state of the first chip falls under the allowable range.

59. A method according to any of the above 51 to 58, wherein the step (b) further comprises the following sub-steps of:

(b14) raising a stick-up block as a principal portion of the lower base together with the chucking collet;

(b15) after the sub-step (b14), bringing down only the stick-up block out of the stick-up block and the chucking collet until the bent state of the first chip exceeds an allowable range; and (b16) after the sub-step (b15) and on the basis of the monitor information obtained in the sub-step (b1), continuing the descent of the stick-up block, or raising the stick-up block until the bent state of the first chip falls under the allowable range.

60. A method according to any of the above 51 to 59, wherein the step (b) further comprises the following sub-steps of:

(b17) raising a stick-up block as a principal portion of the lower base together with the chucking collet;

(b18) after the sub-step (b17), bringing down only the stick-up block out of the stick-up block and the chucking collet until the bent state of the first chip exceeds an allowable range; and (b19) after the sub-step (b18) and on the basis of the monitor information obtained in the sub-step (b1), continuing the descent of the stick-up block, or making the stick-up block stand by until the bent state of the first chip falls under the allowable range.

61. A method according to any of the above 51 to 60, wherein the step (b) further comprises the following steps of:

(b20) raising a stick-up block as a principal portion of the lower base together with the chucking collet;

(b21) after the sub-step (b20), bringing down only the stick-up block out of the stick-up block and the chucking collet until the bent state of the first chip exceeds an allowable range; and (b22) after the sub-step (b21) and on the basis of the monitor information obtained in the sub-step (b1), continuing the descent of the stick-up block, or decelerating the descent of the stick-up block until the bent state of the first chip falls under the allowable range.

62. A method according to any of the above 51 to 61, wherein the step (b) further comprises the following steps of:

(b23) causing a slide plate as a principal portion of the lower base to slide so as to decrease an overlap thereof with the first chip until the bent state of the first chip exceeds an allowable range; and (b24) on the basis of the monitor information obtained in the sub-step (b1), making the slide plate stand by until the bent state of the first chip falls under the allowable range.

63. A method according to any of the above 51 to 62, wherein the step (b) further comprises the following sub-steps of:

(b25) continuing or interrupting the peeling operation on the basis of the monitor information obtained in the sub-step (b1); and (b26) in case of interrupting the peeling operation, resuming the peeling operation, or retreating the peeling operation until the bent state of the first chip falls under the allowable range, on the basis of the monitor information obtained in the sub-step (b1).

64. A method according to any of the above 51 to 63, wherein the step (b) further comprises the following sub-steps of:

(b27) continuing or decelerating the peeling operation on the basis of the monitor information obtained in the sub-step (b1); and (b28) in case of decelerating the peeling operation, re-accelerating the peeling operation, or retreating the peeling operation until the bent state of the first chip falls under the allowable range, on the basis of the monitor information obtained in the sub-step (b1).

65. A method according to any of the above 51 to 64, wherein the step (b) further comprises the following sub-steps of:

(b29) raising the chucking collet until the bent state of the first chip falls under an allowable range;

(b30) after the sub-step (b29) and on the basis of the monitor information obtained in the sub-step (b1), continuing the rise of the chucking collet, or making the chucking collet stand by until the bent state of the first chip falls under the allowable range; and (b31) in case of making the chucking collet stand by until the bent state of the first chip falls under the allowable range, resuming the rise of the chucking collet, or bringing down the chucking collet until the bent state of the first chip falls under the allowable range, on the basis of the monitor information obtained in the sub-step (b1).

66. A method according to any of the above 51 to 65, wherein the step (b) further comprises the following sub-steps of:

(b32) raising a stick-up block as a principal portion of the lower base together with the chucking collet;

(b33) after the step (b32), bringing down only the stick-up block out of the stick-up block and the chucking collet until the bent state of the first chip exceeds an allowable range;

(b34) after the sub-step (b33) and on the basis of the monitor information obtained in the sub-step (b1), continuing the descent of the stick-up block, or making the stick-up block stand by until the bent state of the first chip falls under the allowable range; and (b35) in case of making the stick-up block stand by until the bent state of the first chip falls under the allowable range, resuming the descent of the stick-up block, or raising the stick-up block until the bent state of the first chip falls under the allowable range, on the basis of the monitor information obtained in the sub-step (b1).

67. A method according to any of the above 51 to 66, wherein the step (b) further comprises the following sub-steps of:

(b36) raising the chucking collet until the bent state of the first chip exceeds an allowable range;

(b37) after the sub-step (b36) and on the basis of the monitor information obtained in the sub-step (b1), continuing the rise of the chucking collet, or decelerating the chucking collet until the bent state of the first chip falls under the allowable range; and (b38) in case of decelerating the chucking collet until the bent state of the first chip falls under the allowable range, resuming the rise of the chucking collet, or bringing down the chucking collet until the bent state of the first chip falls under the allowable range, on the basis of the monitor information obtained in the sub-step (b1).

68. A method according to any of the above 51 to 67, wherein the step (b) further comprises the following sub-steps of:

(b39) raising a stick-up block as a principal portion of the lower base together with the chucking collet;

(b40) after the step (b), bringing down only the stick-up block out of the stick-up block and the chucking collet until the bent state of the first chip exceeds an allowable range;

(b41) after the sub-step (b40) and on the basis of the monitor information obtained in the sub-step (b1), continuing the descent of the stick-up block, or decelerating the descent of the stick-up block until the bent state of the first chip falls under the allowable range; and (b42) in case of making the stick-up block stand by until the bent state of the first chip falls under the allowable range, resuming the descent of the stick-up block, or raising the stick-up block until the bent state of the first chip falls under the allowable range, on the basis of the monitor information obtained in the sub-step (b1).

69. A method according to any of the above 51 to 68, wherein an adhesive layer for die bonding is formed beforehand over the back surface of the first chip.

70. A method according to any of the above 51 to 69, wherein the elastomer has a hardness of 15 or higher and lower than 55.

71. A method according to any of the above 51 to 69, wherein the elastomer has a hardness of 20 or higher and lower than 40.

Still further embodiments of the present invention as disclosed herein will be outlined below.

1. A method for manufacturing a semiconductor integrated circuit device, comprising the steps of:

(a) supplying a plurality of chips divided in individual chip regions while being arranged substantially in their original two-dimensional layout upon a wafer, to a chip treating apparatus with their back surfaces fixed to an adhesive tape;

(b) vacuum-chucking a surface of a first chip out of the chips to a lower surface of a rubber chip of a chucking collet and peeling the adhesive tape from the back surface of the first chip in a state in which the adhesive tape over the back surface of the first chip is vacuum-chucked to an upper surface of a lower base, the rubber chip containing elastomer as a principal component and having the following portions:

(i) a rubber chip main portion including a central part;

(ii) a plurality of vacuum suction holes formed in the peripheral portion of the rubber chip and extending through the rubber chip main portion from an upper to a lower surface of the main portion; and (iii) a ring-like rubber chip peripheral portion extending around the rubber chip main portion and having a thickness smaller than that of the rubber chip main portion.

2. A method according to the above 1, wherein the rubber chip further has the following portion:

(iv) a singular or plural vacuum suction grooves formed in a lower surface of the rubber chip peripheral portion and coupled with the vacuum suction holes.

3. A method according to the above 1 or 2, wherein the rubber chip has the following portion:

(v) the rubber chip peripheral portion lying on the lower surface side of the rubber chip main portion.

4. A method according to any of the above 1 to 3, wherein the rubber chip further has the following portion:

(vi) a ring-like groove formed between upper and lower surfaces of the rubber chip peripheral portion.

5. A method according to any of the above 1 to 4, wherein the rubber chip has a hardness of 10 or higher and lower than 70.

6. A method according to any of the above 1 to 4, wherein the rubber chip has a hardness of 15 or higher and lower than 55.

7. A method according to any of the above 1 to 4, wherein the rubber chip has a hardness of 25 or higher and lower than 65.

8. A method according to any of the above 1 to 7, wherein the peeling of the first chip from the adhesive tape in the step (b) is carried out by stick-up of a portion of the lower base toward the first chip, the portion being located just under the first chip.

9. A method according to any of the above 1 to 7, wherein the peeling of the first chip from the pressure-sensitive adhesive in the step (b) is carried out by sideways retraction of a portion of the lower base from under the first chip, the portion being located just under the first chip.

[Description Form, Basic Terms, and How to Use, in the Present Application]

1. An embodiment of the present invention may be described dividedly into plural sections where required for the sake of convenience, but unless otherwise mentioned, it is to be understood that the divided sections are not independent of each other, but constitute portions of a single example, or in a relation such that one is a partial detail of the other or is a modification of part or the whole of the other. As to similar portions, repetition thereof is omitted in principle. Constituent elements in an embodiment are not essential unless otherwise mentioned and except the case where they are limited theoretically to specified numbers thereof, further, except the case where they are clearly essential contextually.

2. Likewise, in the description of an embodiment or the like, as to "X comprising A" or the like with respect to material and composition, selection of any other element than A as one of principal constituent elements is not excluded unless otherwise mentioned and except the case where an opposite answer is evident contextually. For example, by the above description is meant "X including A as a principal component" when viewed from the standpoint of component. For example, "silicon member" is not limited to pure silicon, but it goes without saying that the silicon member in question covers SiGe alloy, other multi-element alloys containing silicon as a principal component, as well as those containing silicon and other additives.

3. Although suitable examples will be shown as to figure, position and attribute, it goes without saying that no strict limitation is made to those examples unless otherwise mentioned and except the case where it is evident contextually that limitation is made thereto.

4. When reference is made to a specific numerical value or quantity, a numerical value larger or smaller than the specific numerical value will also do unless otherwise mentioned and except the case where limitation is made to the specific numerical value theoretically, further, except the case where a negative answer is evident contextually.

5. By "wafer" is usually meant a single crystal silicon wafer with semiconductor integrated circuit devices (also true of semiconductor devices and electronic devices) formed thereon. But it goes without saying that the "wafer" in question covers an epitaxial wafer and composite wafers, e.g., a combination of an insulating substrate and a semiconductor layer.

6. By "chip" or "die" is generally meant a completely separated one after a wafer dividing process (blade dicing, laser dicing or pelletizing process). In the present application, for the sake of convenience, each chip region before separation is also represented by the same term. For example, in the so-called DBG (Dicing before Grinding) process, half-cut dicing is followed by grinding for ultimate separation into chips, then in this state the back surfaces of the chips are affixed to a pressure-sensitive adhesive tape and thereafter the processing flow advances to a peeling process. Taking such a case also into consideration, for example once "wafer" is separated, it is no longer a wafer in a strict sense. Likewise, chips before separation correspond to chip regions, not chips, and the time of separation depends on each individual process, so these are comprehensively designated "wafer," "chip," or "die."

7. By "wiring substrate" is generally meant a organic wiring substrate, a ceramic wiring substrate, a lead frame, or any other thin film-like integrated circuit device, including chip and wafer. More particularly, the stacking technique of stacking several tens of chips on a chip with use of an adhesive has recently been in wide use and the present invention as disclosed herein is applied to a wide range including such a technique.

8. "Lower base" is also generally designated "chucking piece." The lower base, which is the nucleus of a chip peeling mechanism in a "chip treating apparatus," is for vacuum-chucking a pressure-sensitive adhesive sheet with a wafer fixed thereto (a group of chips fixed to the pressure-sensitive adhesive sheet in a substantially two-dimensionally arranged state upon the wafer) to fix the position of the wafer. In a certain chip treating apparatus, a central portion of the lower base is a "stick-up block," while in another apparatus, it is a "slide plate." The lower base comprises the central portion and a peripheral portion, the peripheral portion functioning to chuck and fix the pressure-sensitive adhesive tape and the chips positioned around the chip to be picked up. Both central portion and peripheral portion are of a structure vacuum-chucked through suction holes and gaps. They are in a sucked state almost constantly except the case where alignment is performed.

9. "Chucking collet" has heretofore been formed as an integral member using, for example, metal (e.g., stainless steel), ceramic material or polymer. However, for a thin-film wafer or chip (mainly 150 µm or less, especially 100 µm or less, in thickness) mainly used in the present invention, the chucking collet comprises a rubber chip and a chucking collet body or a rubber chip holder for holding the rubber chip, the rubber chip containing a polymer such as elastomer as a principal component which comes into direct contact with a chip, in order to avoid cracking or the like of the chip. The rubber chip generally contains a thermosetting elastomer such as fluorine-containing rubber, nitrile rubber or silicone rubber or an elastic polymer material such as a thermoplastic elastomer as a principal component. In the following concrete description, vertical movements of the collet and the stick-up block will be described with respect to the peripheral portion of the lower base (assuming that the peripheral portion does not move). Basically, however, such vertical movements are considered to be a relative motion.

10. The hardness of the rubber chip is shown in accordance with International Organization for Standardization, ISO, Standard 7619, Durometer Type A (U.S. Standard Shore A; JIS K 6253).

11. When "ring-like" is referred to in connection with the rubber chip, it goes without saying that its outline or external, internal and contour shapes are not limited to a circular or elliptic shape, but includes square and rectangular shapes, as well as figures resulting from removal of corners of square and rectangular shapes, and other similar shapes.

Details of Embodiments

Embodiments of the present invention will be described in detail. In all of the drawings, the same or similar portions are identified by the same or similar reference numerals, and explanations thereof will not be repeated in principle.

As to the technique of monitoring the flow rate of the collet vacuum system to control the peeling operation, it is described in detail in Japanese Patent Application No. 2007-160922 (filing date: Jun. 19, 2007) related to an invention completed by the present inventors.

1. Entire Process and Equipment (Mainly FIGS. 1 to 30)

In an embodiment of the present invention to be described the invention is applied to the manufacture of a semiconductor package with a chip mounted on a wiring substrate. This manufacturing method will be described below in the order of steps with reference to FIGS. 1 to 29.

As typical prior applications of an invention of the present inventors in a related technical field there are Japanese Patent Application No. 2006-143277 (filing date: May 23, 2006) and corresponding U.S. Ser. No. 11/735,741 (filing date: Apr. 12, 2007).

Integrated circuits are formed over a main surface of such a wafer 1A as shown in FIG. 1, which is formed of a single crystal silicon, in accordance with a known manufacturing process, then the integrated circuits formed respectively in plural chip-forming regions 1A' partitioned by lattice-like scribing lines are subjected to electrical tests to determine the quality thereof. Each chip-forming region 1A' on the wafer 1A used in this embodiment has a square plane shape of equal length and width. Although in this embodiment such a square chip is referred to as an example for the convenience of plotting, it goes without saying that a more general rectangular chip will do as well without no problem. In the case where a rectangular chip is used, it is more suitable for blocks and collet shown in FIG. 33 or 36 to have a rectangular plane shape.

Figure 2:
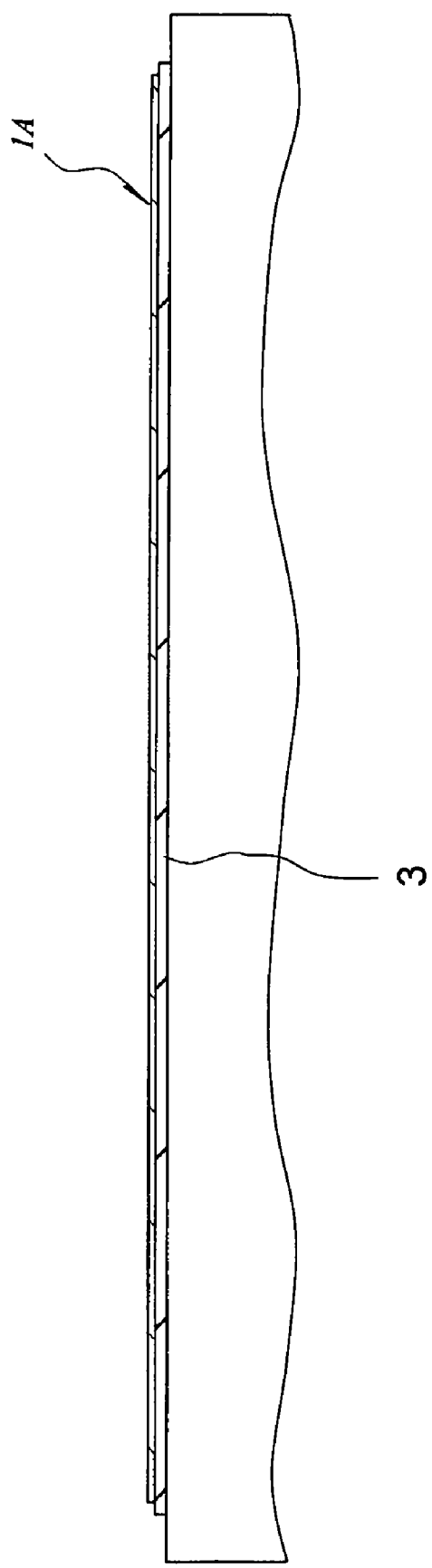
FIG. 2 is a side view showing a semiconductor wafer grinding process.

Next, as shown in FIG. 2, a back grinding tape 3 for protection of the integrated circuits is affixed to the integrated circuits-formed surface (the lower surface side in the figure) of the wafer 1A. In this state a back surface (the upper surface side in the figure) of the wafer 1A is ground with a grinder. Subsequently, a damaged layer in the back surface resulting from the grinding is removed by such a method as wet etching, dry polishing or plasma etching, thereby reducing the thickness of the wafer 1A to 100 μm or less, e.g., 90-15 μm. The above treating method, i.e., wet etching, dry polishing or plasma etching, is advantageous in that although the speed of treatment which advances in the wafer thickness direction is lower than the speed of grinding performed by the grinder, not only the damage to the interior of the wafer is smaller than that in the grinding performed by the grinder, but also a damaged layer in the wafer interior resulting from the grinding performed by the grinder can be removed and the wafer 1A and chip become difficult to be cracked.

Figure 3:
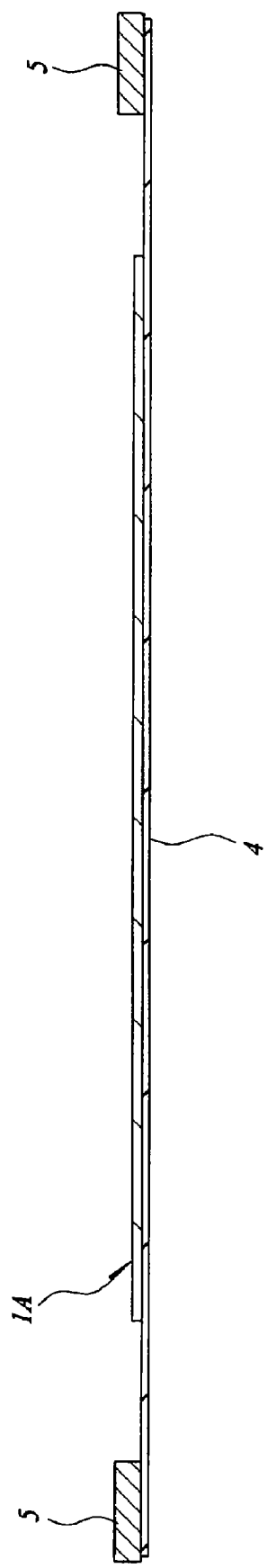
FIG. 3 is a side view showing a process of affixing a dicing tape to the semiconductor wafer.

Next, after removal of the back grinding tape 3, a dicing tape 4 is affixed to the back surface (the surface opposite to the integrated circuits-formed surface) of the wafer 1A and in this state the peripheral portion of the dicing tape 4 is fixed to a wafer ring 5, as shown in FIG. 3. The dicing tape 4 is obtained by applying a pressure-sensitive to the surface of a tape base material such as, for example, polyolefin (PO), polyvinyl chloride (PVC) or polyethylene terephthalate (PET) to afford a pressure-sensitive adhesive tape having tackiness and subsequently cutting the pressure-sensitive adhesive tape circularly or cutting a UV curing type adhesive tape circularly.

Figure 4:
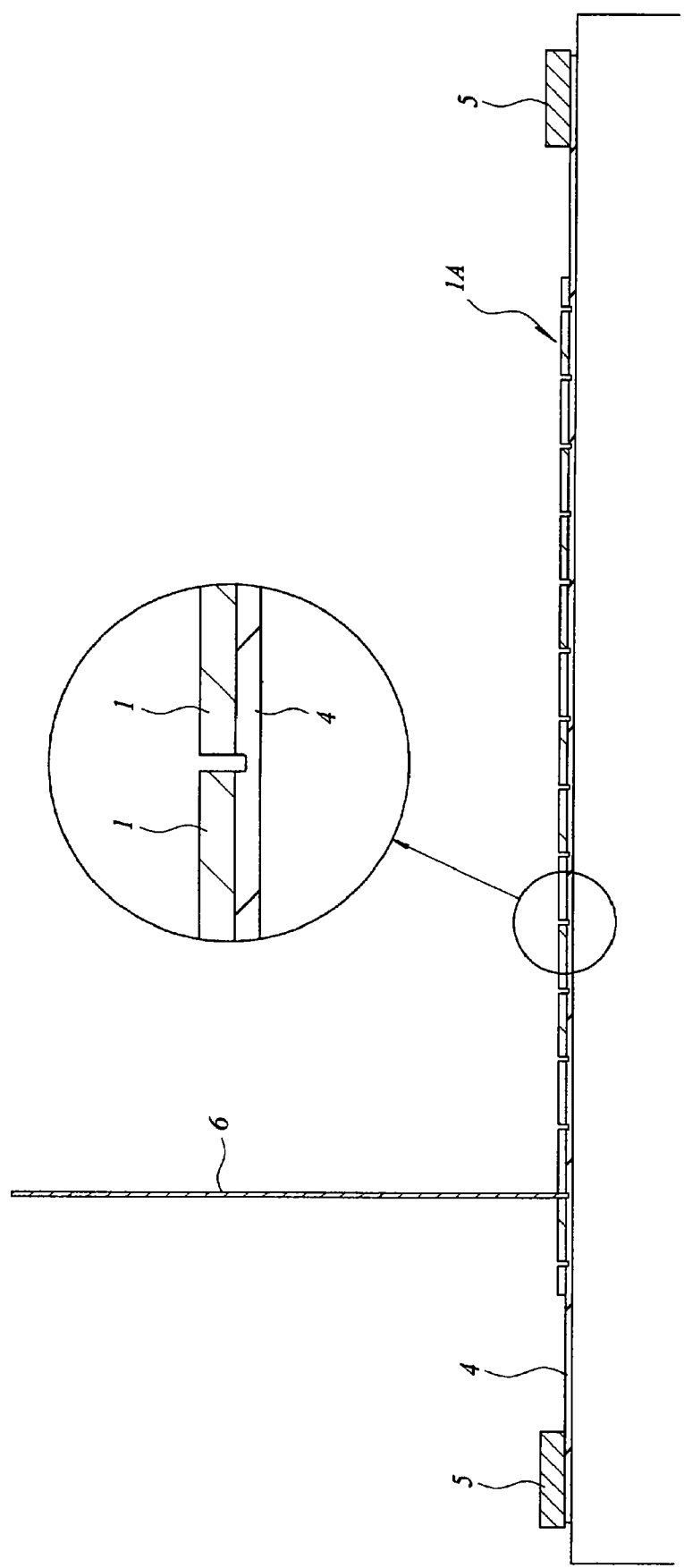
FIG. 4 is a side view showing a semiconductor wafer dicing process.

Then, as shown in FIG. 4, the wafer 1A is diced using a known dicing blade 6 to divide the chip-forming regions 1A' into individual square chips 1. At this time it is necessary that the divided chips 1 be each allowed to remain over the circular dicing tape 4. Therefore, the dicing tape is cut only about half in its thickness direction. In case of using a UV curing type adhesive tape as the dicing tape 4, ultraviolet light is radiated to the dicing tape before the peeling process to weaken the tackiness of the pressure-sensitive adhesive.

Figure 5:
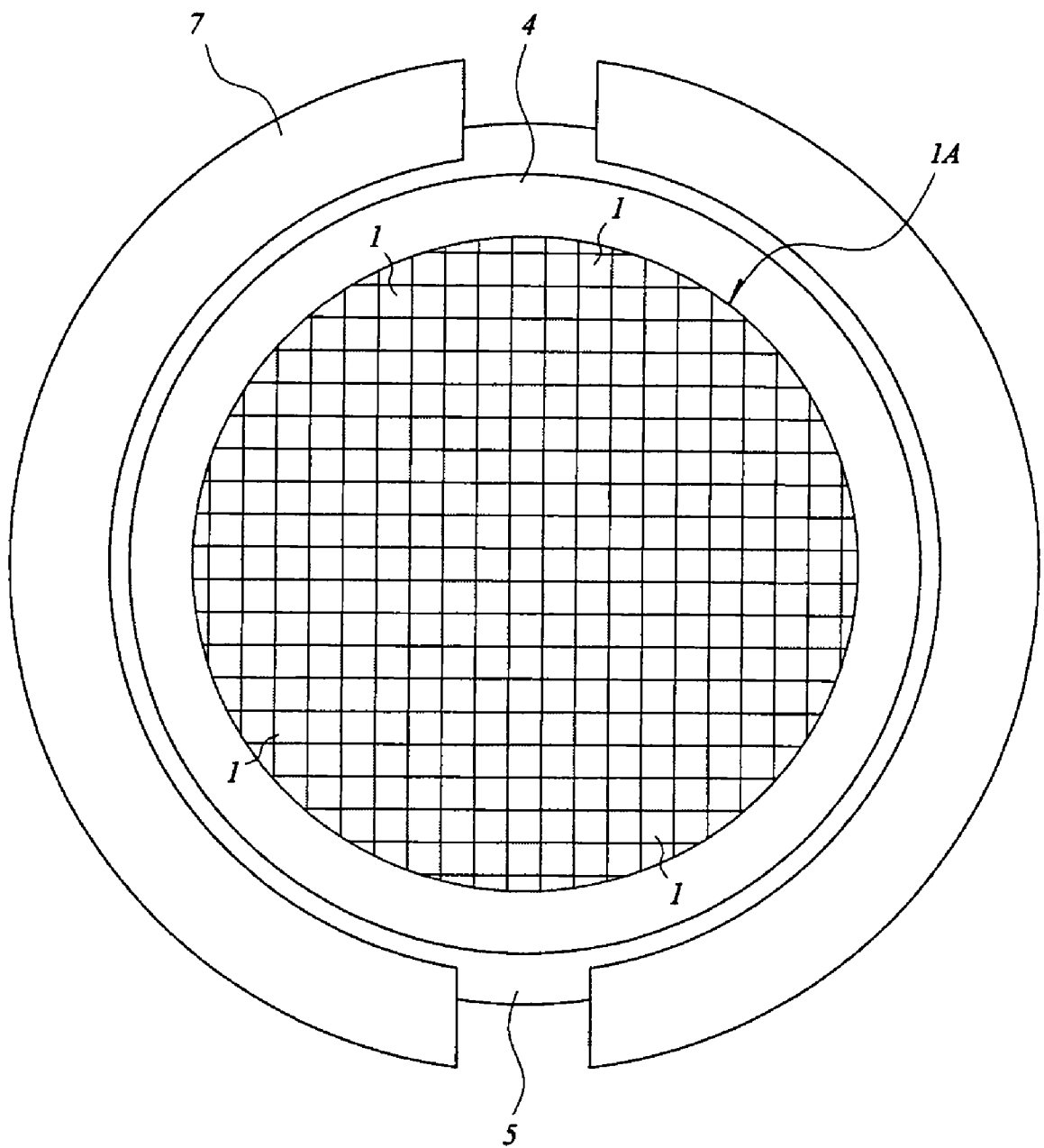
FIG. 5 is a plan view showing a state in which the semiconductor wafer and the dicing tape are fixed to a wafer ring, presser plates are disposed thereabove, and an expand ring is disposed therebelow.
Figure 6:
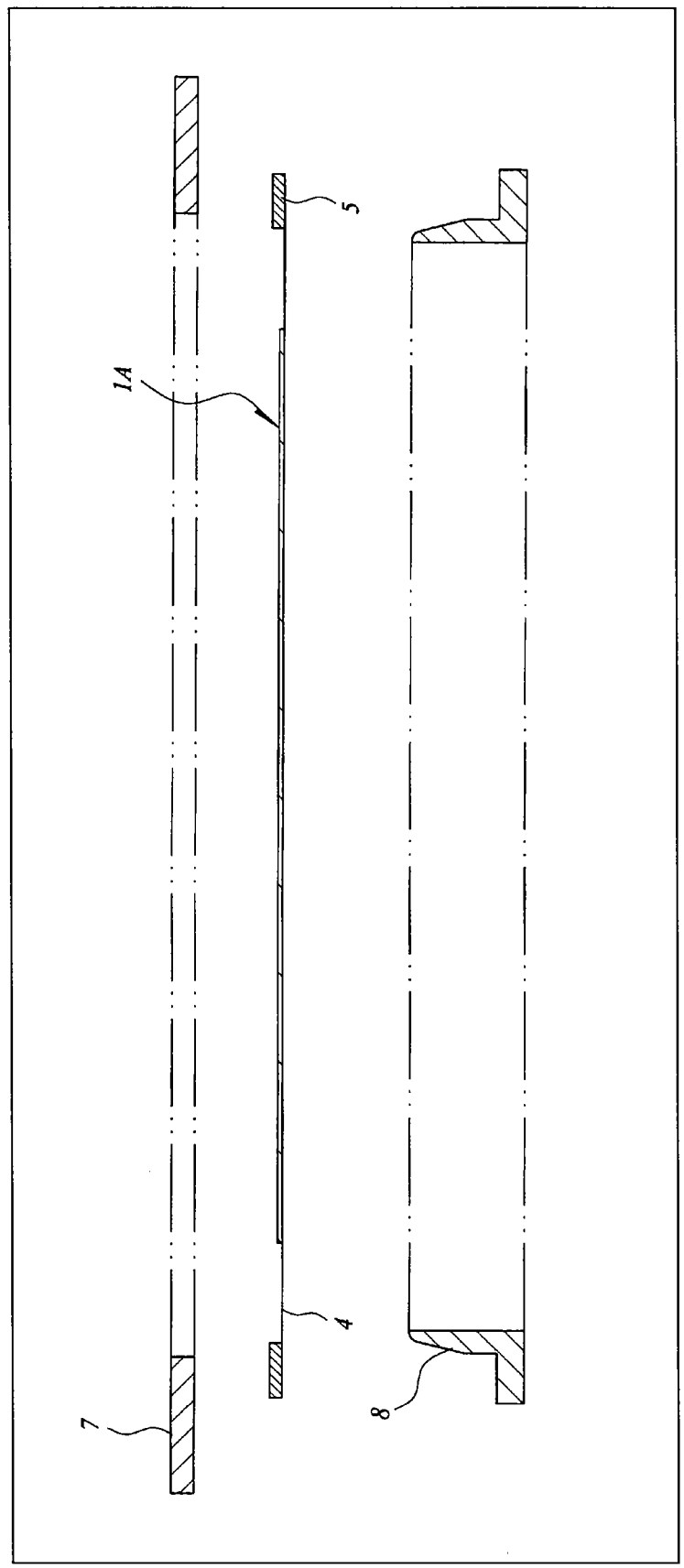
FIG. 6 is a sectional view thereof.
Figure 7:
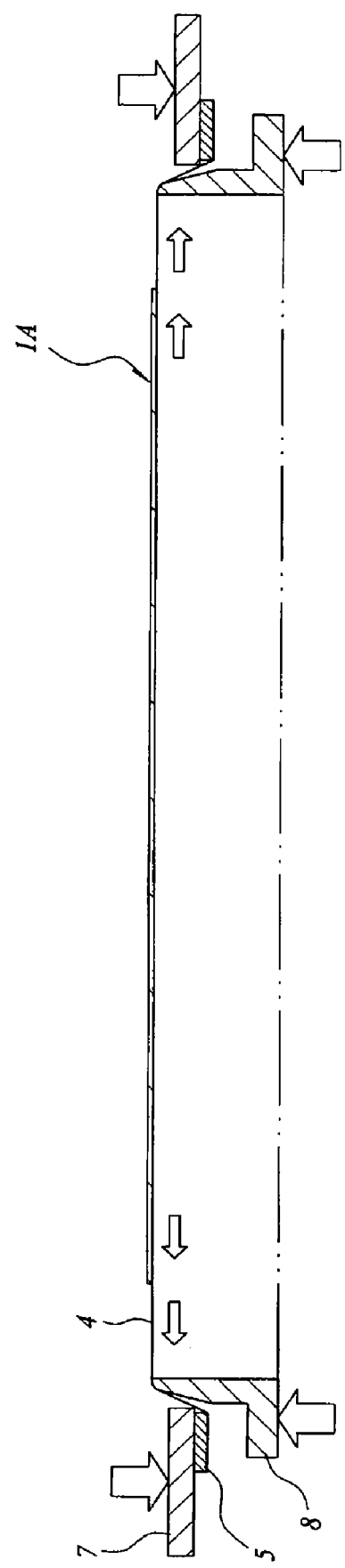
FIG. 7 is a sectional view showing a state in which tension is applied to the dicing tape by sandwiching the wafer ring in between the presser plates and the expand ring.

Next, as shown in FIG. 5 (plan view) and FIG. 6 (sectional view), presser plates 7 are disposed above the dicing tape 4 fixed to the wafer ring 5, while an expand ring 8 is disposed below the dicing tape. Then, as shown in FIG. 7, the presser plates 7 are pushed against an upper surface of the wafer ring 5, thereby pushing the peripheral portion of a back surface of the dicing tape 4 against the expand ring 8. As a result, the dicing tape 4 undergoes a strong tension acting toward the peripheral portion from the central portion thereof and is therefore stretched out without looseness in the horizontal direction.

Figure 8:
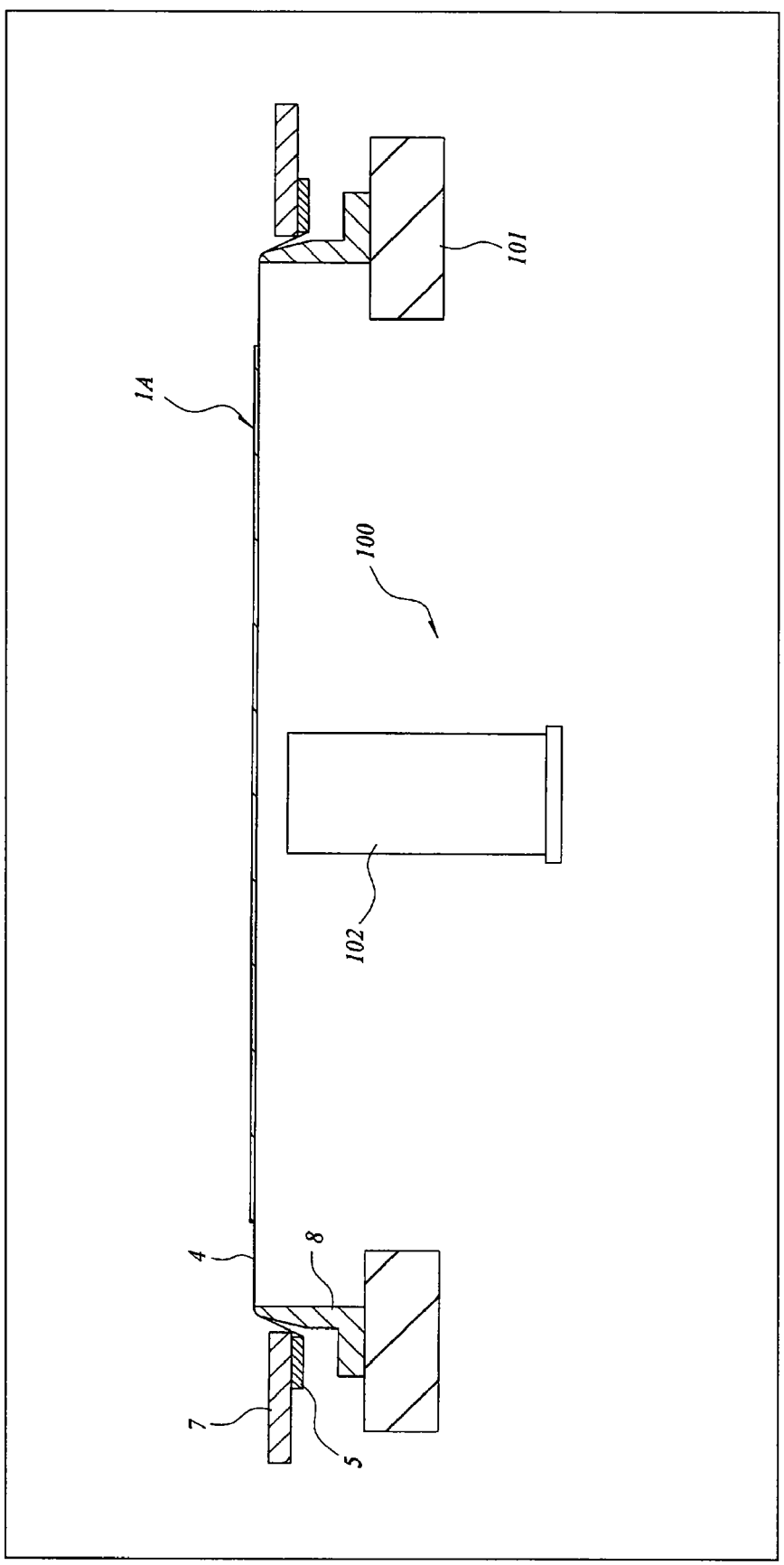
FIG. 8 is a sectional view of a principal portion of a chip peeling device for explaining a method for peeling a semiconductor chip with the dicing tape affixed thereto.

Then, in this state, the expand ring 8 is positioned over a stage 101 of a chip peeling device 100 shown in FIG. 8 and is held horizontally. Centrally of the stage 101 is disposed a chucking piece 102 adapted to be moved horizontally and vertically by a drive mechanism (not shown). The dicing tape 4 is held in such a manner that its back surface is opposed to an upper surface of the chucking piece 102.

Figure 9:
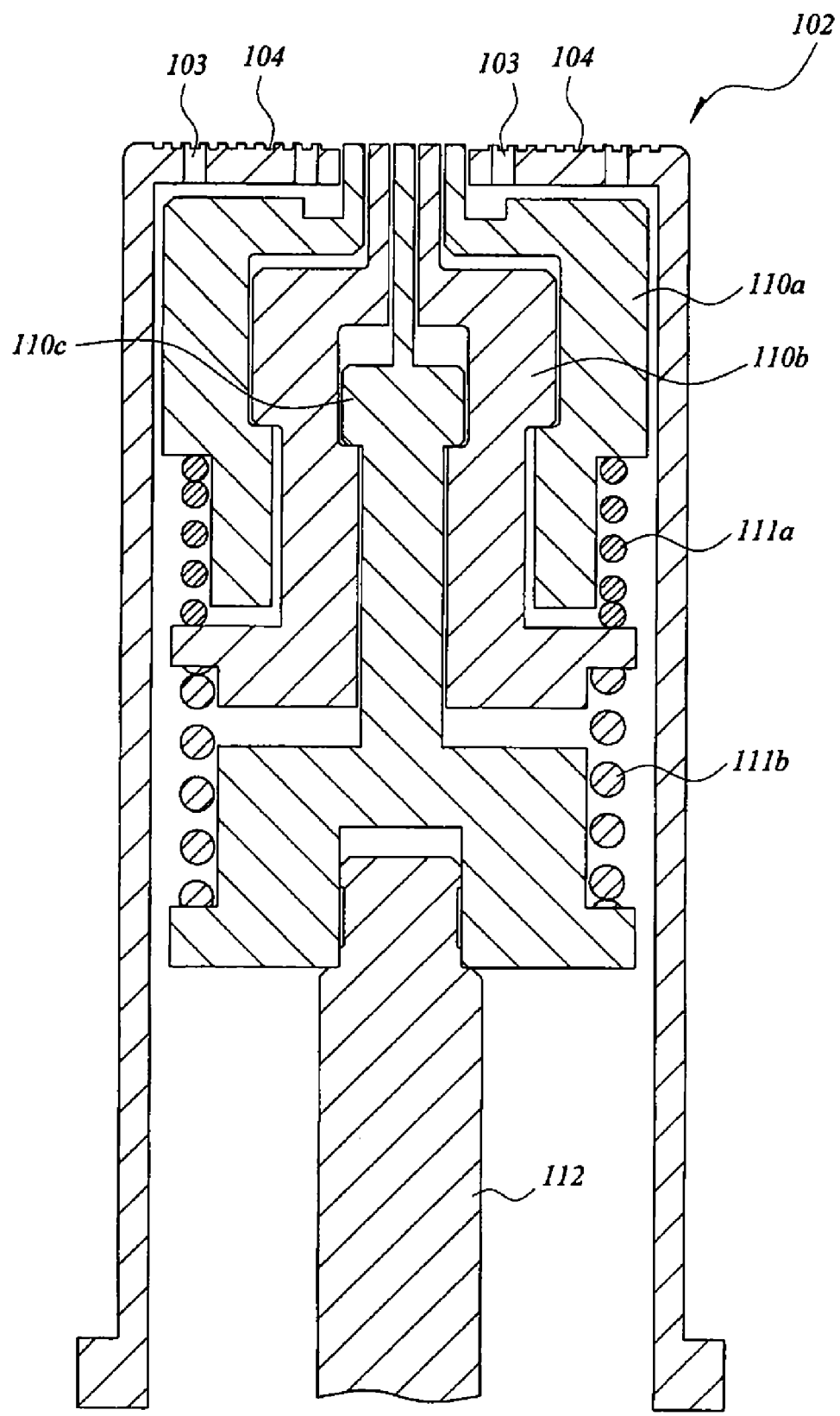
FIG. 9 is a sectional view showing a chucking piece of the chip peeling device.
Figure 10:
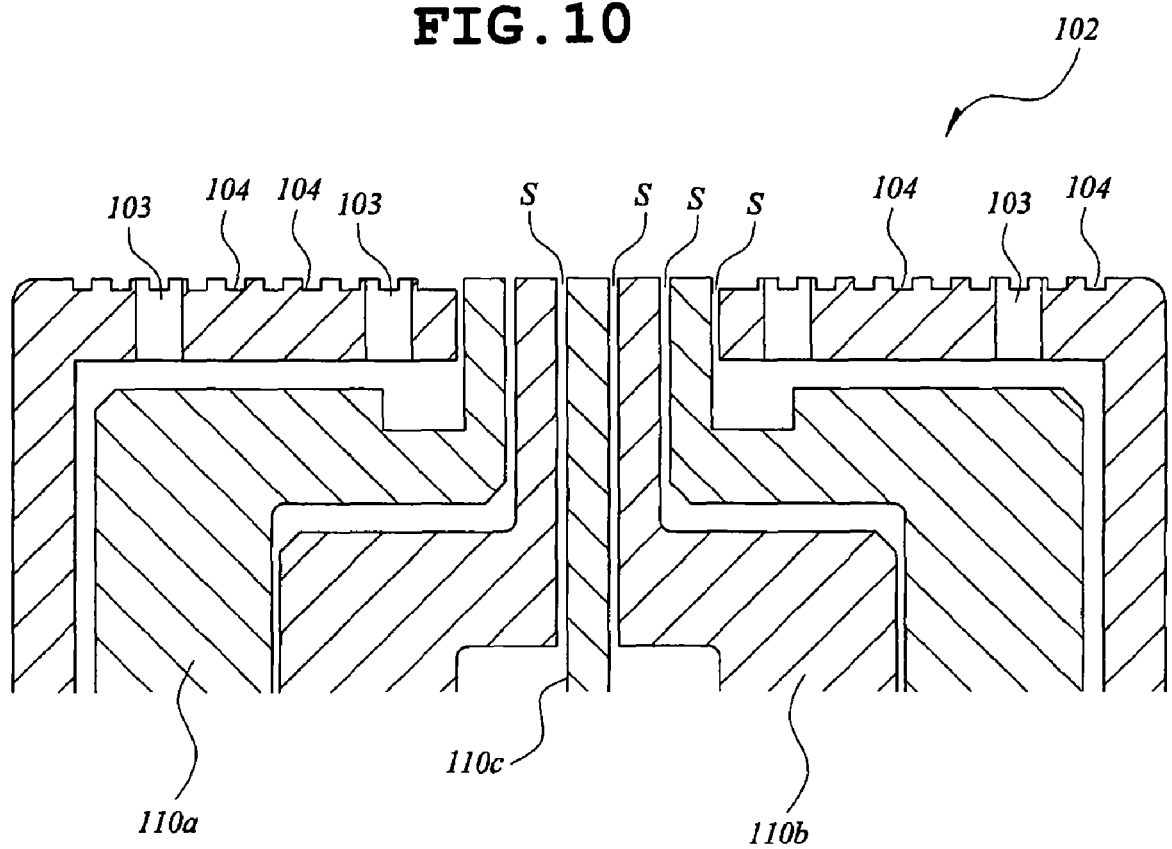
FIG. 10 is an enlarged sectional view of an upper surface and the vicinity thereof of the chucking piece.
Figure 11:
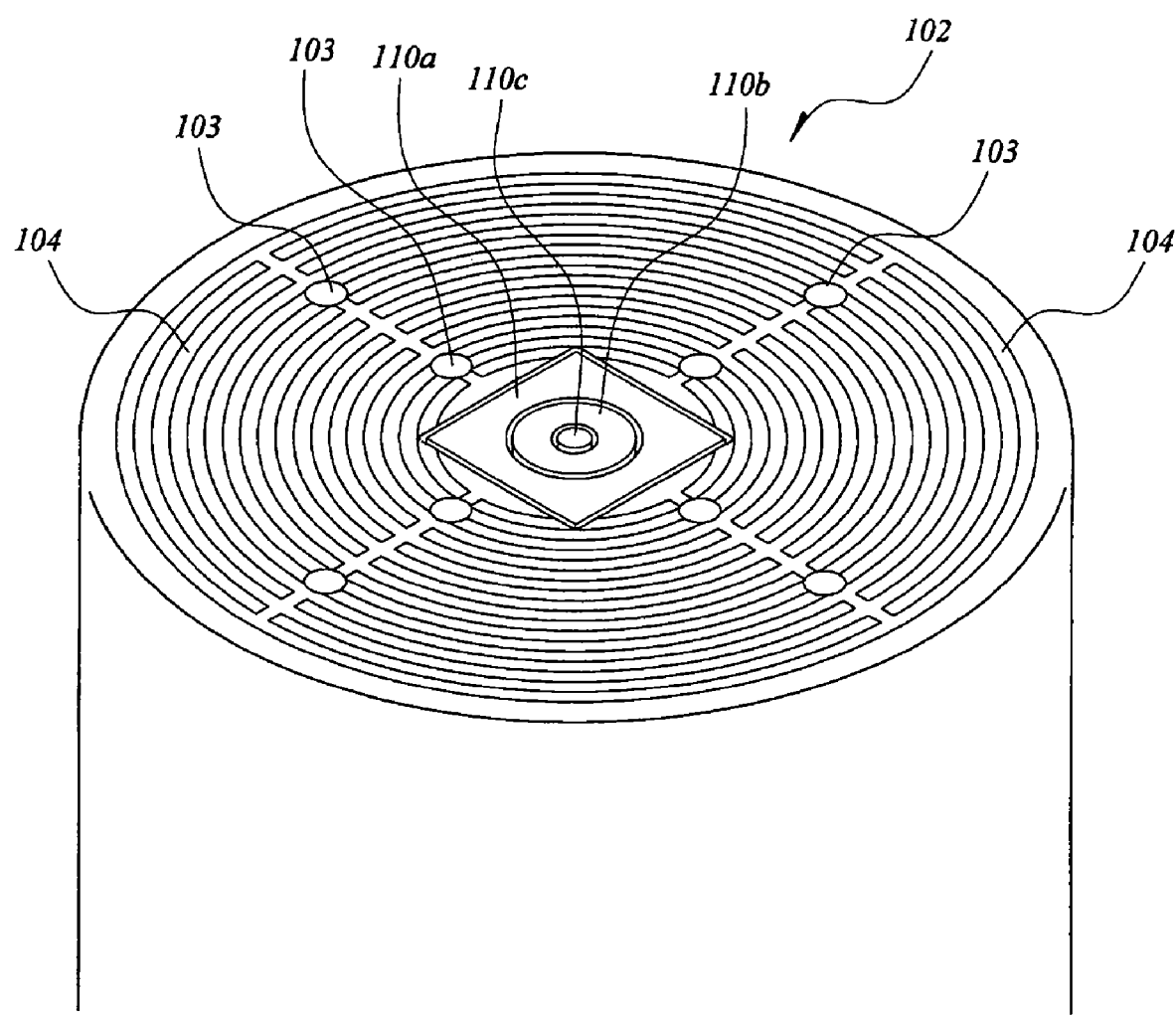
FIG. 11 is an enlarged perspective view thereof.
Figure 12:
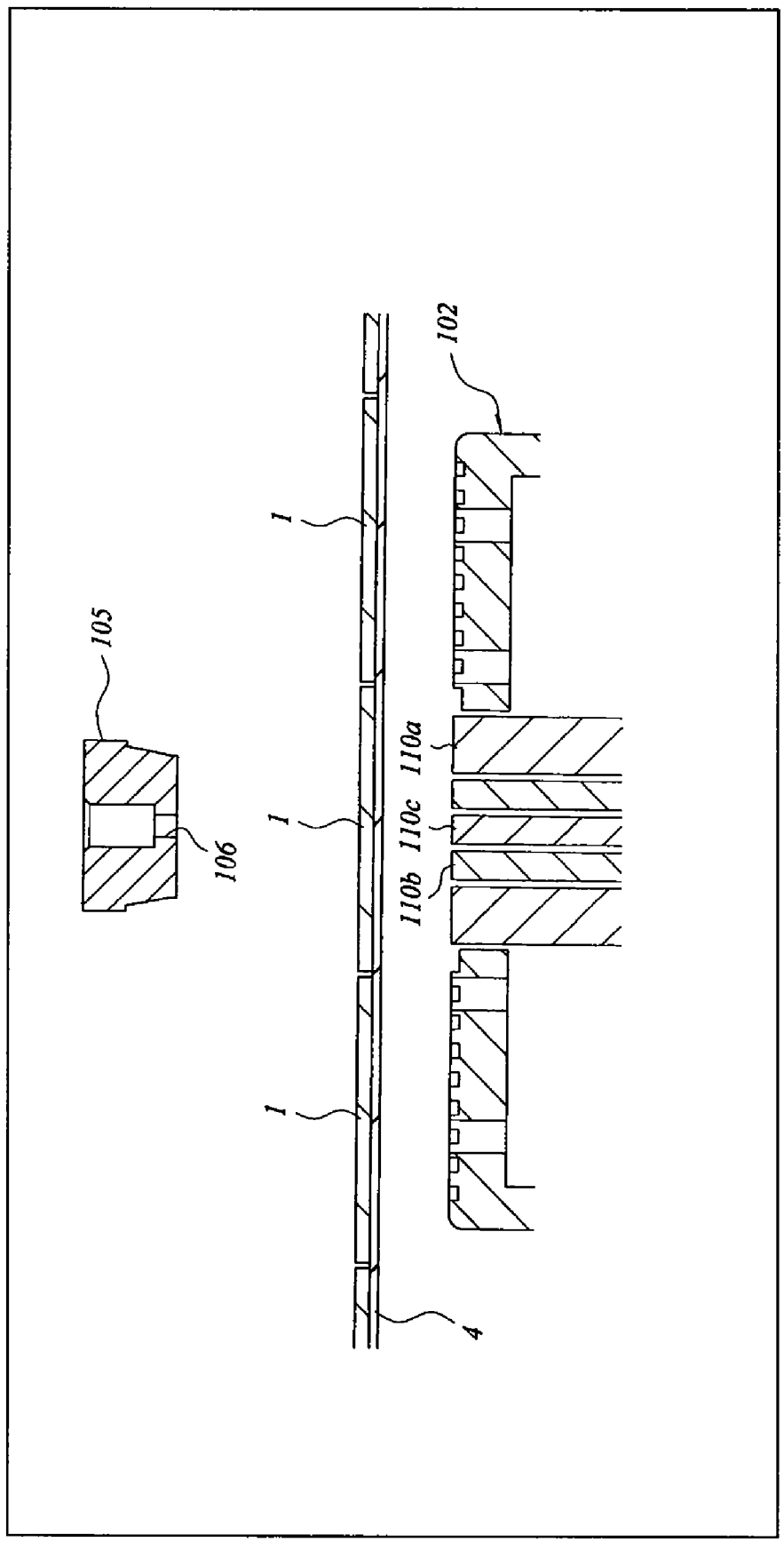
FIG. 12 is an enlarged sectional view of the upper surface and the vicinity thereof of the chucking piece for explaining a semiconductor chip peeling method.

FIG. 9 is a sectional view of the chucking piece 102, FIG. 10 is an enlarged sectional view of an upper surface and the vicinity thereof of the chucking piece 102, and FIG. 11 is an enlarged perspective view thereof.

In a certain case both plural suction holes 103 and plural concentric grooves 104 are formed in the peripheral portion of the upper surface of the chucking piece 102 and in another case only plural suction holes are formed in the peripheral portion. When the chucking piece 102 is raised and its upper surface is brought into contact with the back surface of the dicing tape 4, the interiors of the suction holes 103 and of the grooves 104 are reduced in pressure by a suction mechanism (not shown). At this time, the back surface of the dicing tape 4 is sucked downward and comes into close contact with the upper surface of the chucking piece 102.

When sucking the dicing tape 4 downward, if the grooves 104 are large in width and depth, there may occur a case where when the dicing tape 4 which underlies a chip 1 adjacent to the chip 1 to be peeled off is sucked to the grooves 104, the interface between the adjacent chip 1 and the dicing tape 4 which underlies the adjacent chip peels off above the grooves 4. Such peeling is apt to occur particularly in case of the dicing tape 4 using a pressure-sensitive adhesive of a relatively weak tackiness. Once such a phenomenon occurs, the adjacent chip 1 may fall off the dicing tape 4 while peeling the to-be-peeled chip 1 from the dicing tape 4. This is undesirable. An effective method for preventing the occurrence of such a phenomenon is to make the aforesaid width and depth of the grooves 104 as small as possible and minimize the likelihood of gap formation between the dicing tape 4 which underlies the adjacent chip 1 and the upper surface of the chucking piece 102. Increasing the number of suction holes and not forming the grooves is also effective.

Three blocks 110a-110c for sticking up the dicing tape 4 are built in the central portion of the chucking piece 102. The three blocks 110a-110c are arranged in such a manner that inside the first block 110a which is the largest in outline there is disposed the second block 110b smaller in outline than the first block and the third block 110c which is the smallest in outline is disposed inside the second block 110b. The three blocks 110a-110c are adapted to move vertically in interlock with a first compression coil spring 111a interposed between the outer block 110a and the intermediate block 110b, a second compression spring 111b interposed between the intermediate block 110b and the inner block 110c and having a spring constant larger than that of the first compression coil spring 111a, and pusher 112 coupled to the inner block 110c and moved vertically by a drive mechanism (not shown).

The outer block 110a of the largest outline among the three blocks 110a-110c is preferably a size smaller (for example, about 0.5-3 mm or so) in outline than the chip 1 to be peeled. For example, when the chip 1 is square, it is preferable that the outer block 110a be in a square shape which is a size smaller than the square of the chip. As will be described in other embodiments later, when the chip 1 is rectangular, it is preferable for the outer block 110a to be in a rectangular shape of a size smaller. As a result, the corners as outer peripheral portions of an upper surface of the block 110a are positioned slightly inside the outer edges of the chip 1, so that a force for separating the chip 1 and the dicing tape 4 from each other can be concentrated on the portion (the outermost periphery portion of the chip 1) which serves as a starting point of the separation.

It is preferable for the upper surface of the block 110a to be flat or have a large radius of curvature in order to ensure a sufficient area of contact with the dicing tape 4. If the area of contact between the upper surface of the block 110a and the dicing tape 4 is small, a large bending stress is concentrated on the peripheral portion of the chip 1 which is supported from below by the upper surface of the block 110a, with consequent fear of cracking of the chip peripheral portion.

The intermediate block 110b disposed inside the block 110a has an outline which is about 1-3 mm smaller than the outline of the block 110a. The block 110c of the smallest outline disposed inside the intermediate block 110b has an outline which is about 1-3 mm smaller than the outline of the block 110b. In this embodiment, the intermediate block 110b and the inner block 110c are each columnar taking the easiness of machining into account. However, like the outer block 110a, they may be in the shape of a quadrangular prism or a shape similar thereto. In an initial state (when the blocks 110a-110c are not in operation), upper surfaces of the three blocks 110a-110c are equal in height to one another and are also equal in height to the peripheral portion of the upper surface of the chucking piece 102.

As shown on a larger scale in FIG. 10, gaps (S) are formed respectively between the peripheral portion of the chucking piece 102 and the outer block 110a and among the three blocks 110a-110c. The interiors of the gaps (S) are pressure-reduced by a suction mechanism (not shown), so that upon contact of the back surface of the dicing tape 4 with the upper surface of the chucking piece 102 the dicing tape 4 is sucked downward into close contact with the upper surfaces of the blocks 110a-110c.

For peeling the chip from the dicing tape 4 with use of the chip peeling device 100 having such a chucking piece 102 as described above, first, as shown in FIG. 12, a central portion (the blocks 110a-110c) of the chucking piece 102 is moved to the position just under one chip 1 (the chip 1 positioned centrally of the figure) to be peeled off and a chucking collet 105 is moved to a position above the chip 1. A chucking hole 106 with the interior thereof reduced in pressure is formed centrally of a bottom of the chucking collet 105 which is supported by a moving mechanism (not shown). Only one chip 1 to be peeled off can be chucked and held selectively through the chucking hole 106. In FIGS. 12 to 31, a detailed structure of the collet 105 is omitted for ensuring simplicity. The structure of the collet will be described in detail later with reference to FIG. 32 et seq.

Figure 13:
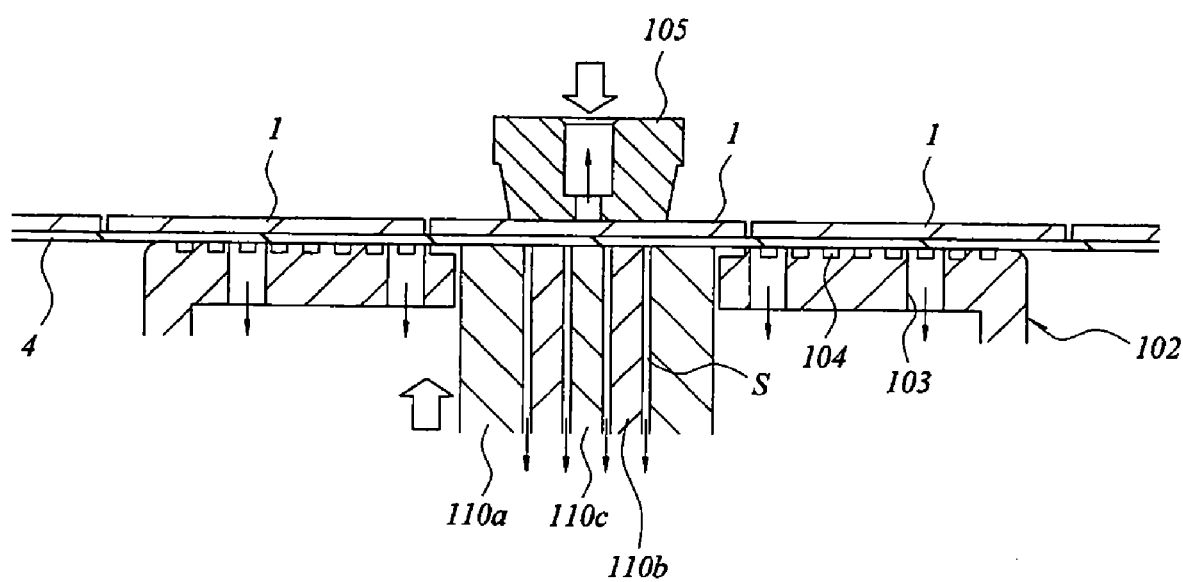
FIG. 13 is an enlarged sectional view of the upper surface and the vicinity thereof of the chucking piece for explaining the semiconductor chip peeling method.

Then, as shown in FIG. 13, the chucking piece 102 is raised until its upper surface comes into contact with the back surface of the dicing tape 4 and the interiors of the suction holes 103, grooves 104 and gaps (S) are pressure-reduced. As a result, the dicing tape 4 which is in contact with the chip 1 to be peeled off comes into close contact with the upper surfaces of the blocks 110a-110c. At the same time, the dicing tape 4 which is in contact with other chips adjacent to the to-be-peeled chip 1 comes into close contact with the peripheral portion of the upper surface of the chucking piece 102. At this time, if the chucking piece 102 is stuck up slightly (for example, about 400 μm), a further tension can be applied to the dicing tape 4 on which is imposed the horizontal tension by the presser plates 7 and the expand ring 8 as described above, so that the chucking piece 102 and the dicing tape 4 can be brought into close contact with each other positively.

The chucking collet 105 is brought down nearly simultaneously with the rise of the chucking piece 102, causing the bottom of the chucking collet 1 to come into contact with an upper surface of the chip 1 to be peeled off, whereby the chip 1 is chucked and is pressed down lightly. Thus, if the chip 1 is sucked upward by the chucking collet 105 when sucking the dicing tape 4 downward with use of the chucking piece 102, it is possible to promote the separation between the dicing tape 4 and the chip 1 which is done by a stick-up motion of the blocks 110a-110c.

Figure 14:
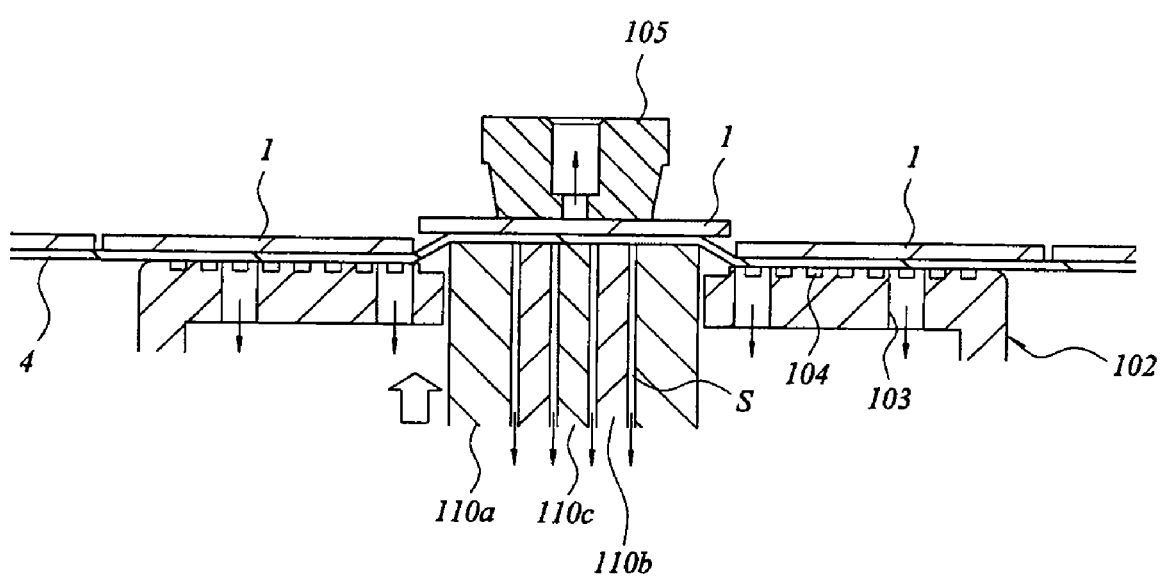
FIG. 14 is an enlarged sectional view of the upper surface and the vicinity thereof of the chucking piece for explaining the semiconductor chip peeling method.
Figure 15:
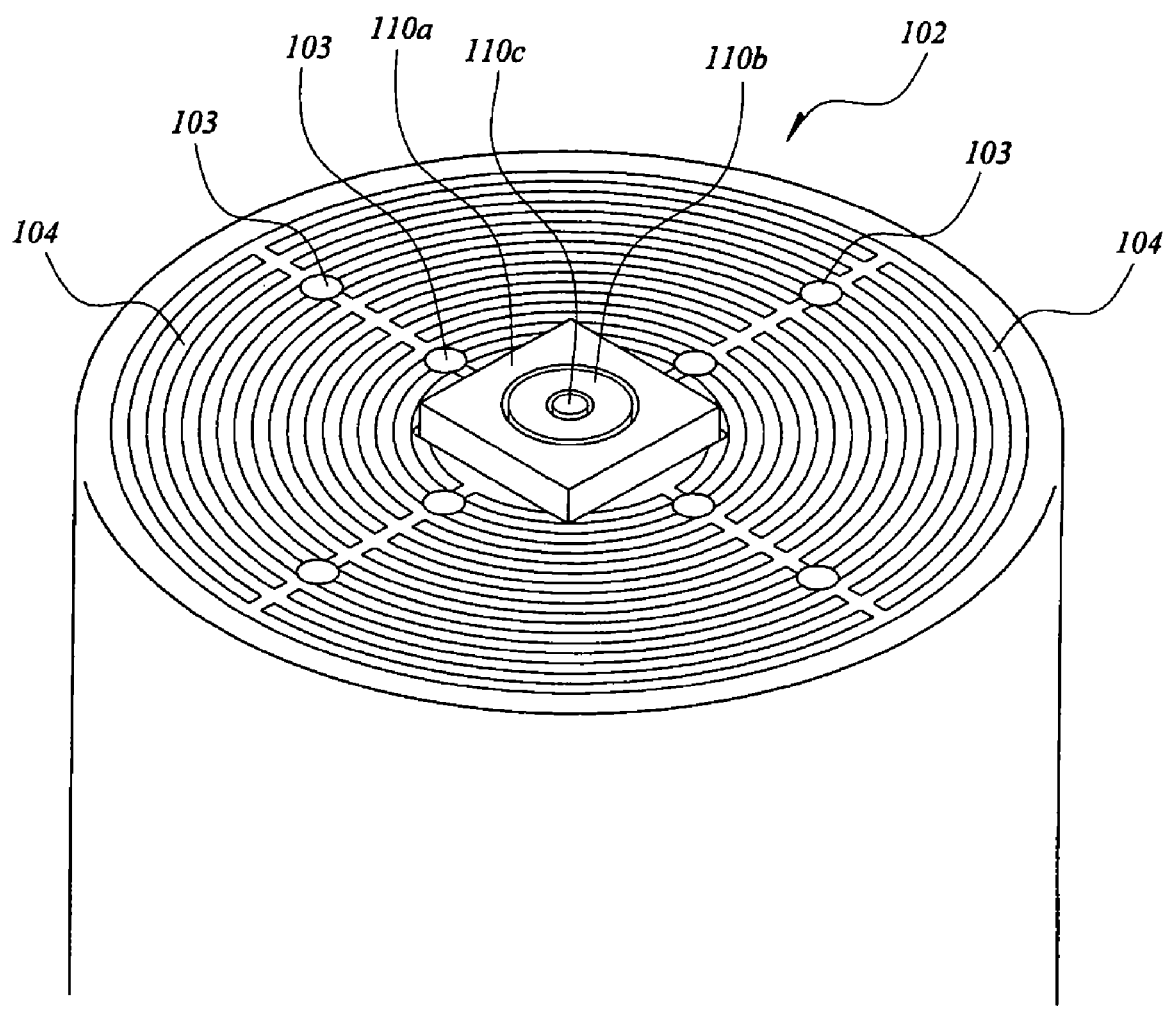
FIG. 15 is an enlarged perspective view of the upper surface and the vicinity thereof of the chucking piece for explaining the semiconductor chip peeling method.

Next, as shown in FIG. 14, the three blocks 110a-110c are stuck up at a time to impose an upward load on the back surface of the dicing tape 4, thereby pushing up the chip 1 and the dicing tape 4. At this time, the back surface of the chip 1 is supported by the upper surfaces (contact surfaces) of the blocks 110a-110c through the dicing tape 4 to diminish the bending stress imposed on the chip 1. Moreover, the outer periphery (corners) of the upper surface of the block 110a is disposed inside the outer periphery of the chip 1. As a result, a peeling stress is concentrated on the interface as a peeling start point between the chip 1 and the dicing tape 4 and the peripheral edge portion of the chip 1 is peeled efficiently from the dicing tape 4. At this time, by sucking downward the dicing tape 4 which underlies other chips 1 adjacent to the chip 1 to be peeled off, causing the dicing tape to come into close contact with the peripheral portion of the upper surface of the chucking piece 102, it is possible to promote peeling of the dicing tape 4 in the peripheral edge portion of the chip 1. FIG. 15 is an enlarged perspective view showing the upper surface and the vicinity thereof of the chucking piece 102 in this state (the chip 1 and the dicing tape 4 are not shown).

A stick-up quantity (stroke) of the blocks 110a-110c is, for example, about 0.2-0.4 mm, but is preferably increased or decreased according to the size of the chip 1. More particularly, when the size of the chip 1 is large, the area of contact between the chip 1 and the dicing tape 4 is large and hence the tackiness of the two is also large, so it is necessary to increase the stroke. On the other hand, when the size of the chip 1 is small, the area of contact between the chip 1 and the dicing tape 4 is small and hence the tackiness of the two is also small, so that easy separation is ensured even if the stroke is set small. The pressure-sensitive adhesive applied to the dicing tape 4 differs in tackiness depending on manufacturer and type. Therefore, even in the case of chips of the same size, if there is used a pressure-sensitive adhesive of high tackiness, it is necessary to increase the stroke.

When sticking up the blocks 110a-110c to impose a load on the back surface of the chip 1, it is preferable that at the outermost periphery portion of the chip the bending stress acting in a direction orthogonal to the chip outer periphery be made smaller than the bending stress acting in a direction parallel to the chip outer periphery. In the outermost periphery portion of the chip 1 there remain fine cracks which occurred when dicing the wafer 1A with use of the dicing blade 6 described above. Therefore, if a strong bending stress acting in a direction orthogonal to the chip outer periphery is applied to the outermost peripheral portion of the chip 1 when sticking up the blocks 110a to 110c, there is a fear that the cracks may grow and cause breakage of the chip 1. In this embodiment, since an equal load is applied slightly inside the outermost periphery portion of the chip 1 with use of the block 110a having an upper surface a size smaller than the size of the chip 1, the entire peripheral edge portion of the chip 1 can be peeled uniformly from the dicing tape 4 while avoiding the above-mentioned problem.

Figure 16:
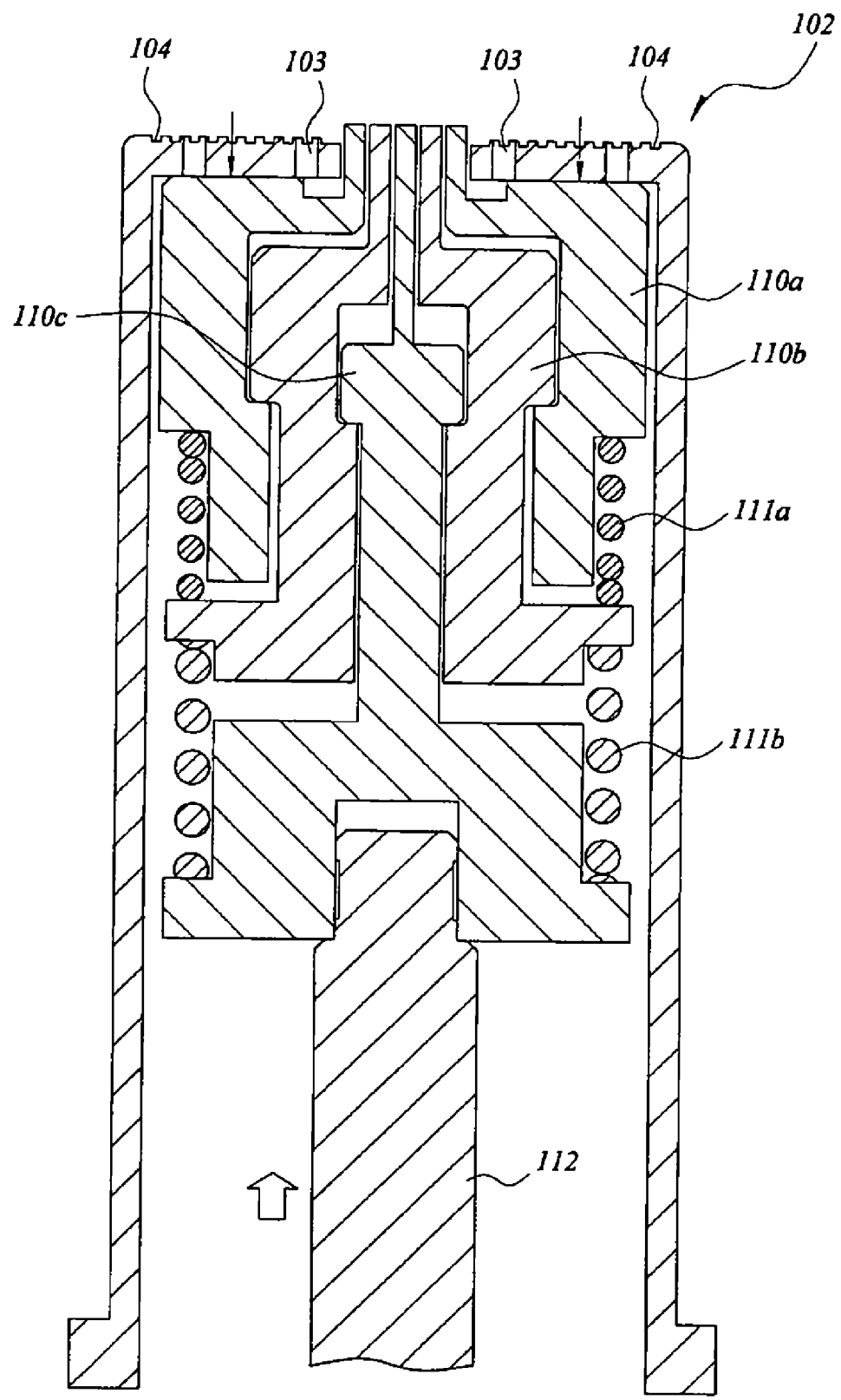
FIG. 16 is a sectional view of the chucking piece for explaining the semiconductor chip peeling method.

For sticking up the three blocks 110a to 110c simultaneously, the pusher 112 is pushed up to push up the inner block 110c coupled to the pusher 112, as shown in FIG. 16. Consequently, the intermediate block 110b is pushed up with the biasing force of the compression coil spring 111b interposed between the inner block 110c and the intermediate block 110b. Further, the outer block 110a is pushed up with the biasing force of the compression coil spring interposed between the outer block 110a and the intermediate block 110b. As a result, the three blocks 110a-110c are pushed up simultaneously, and by contact of a part (the surface indicated by arrows in the figure) of the outer block 110a with the peripheral portion of the chucking piece 102, the rise of the blocks 110a-110c stops. At this time, the greater part of the chip 1 to be peeled off is supported by the upper surfaces of the three blocks 110a-110c and in the area outside the outer periphery (corners) of the upper surface of the block 110a the peeling of the chip proceeds efficiently at the interface between the chip 1 and the dicing tape 4.

When sticking up the three blocks 110a-110c simultaneously, the pusher 112 pushes up the block 110c with such a weak force as does not cause contraction of the compression coil spring 111a whose biasing force is weak. By so doing, there is no further stick-up of the intermediate block 110b and the inner block 110c until a part of the outer block 110a comes into contact with the peripheral portion of the chucking piece 102.

It is necessary for the compression coil spring 111a to have at least resilience which can lift the block 110a against the tension of the dicing tape 4. If the biasing force of the compression coil spring 111a is smaller than the tension of the dicing tape 4, the outer block 110a is not lifted even if the pusher 112 is pushed up, so that the chip 1 can no longer be supported by the upper surface of the outer block 110a. In this case, since it is impossible to let a sufficient stress be concentrated on the start point of separation between the chip 1 and the dicing tape 4, it is likely that a lowering of the peeling speed may result or the chip 1 may be cracked with an excess bending stress applied to the chip 1.

Figure 17:
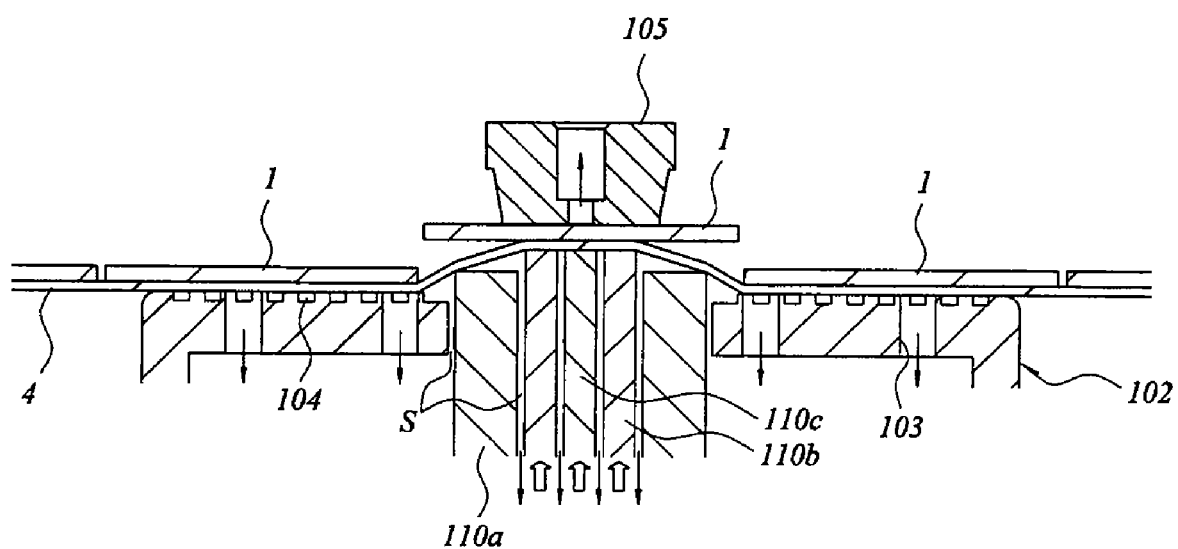
FIG. 17 is an enlarged sectional view of the supper surface and the vicinity thereof of the chucking piece for explaining the semiconductor chip peeling method.
Figure 18:
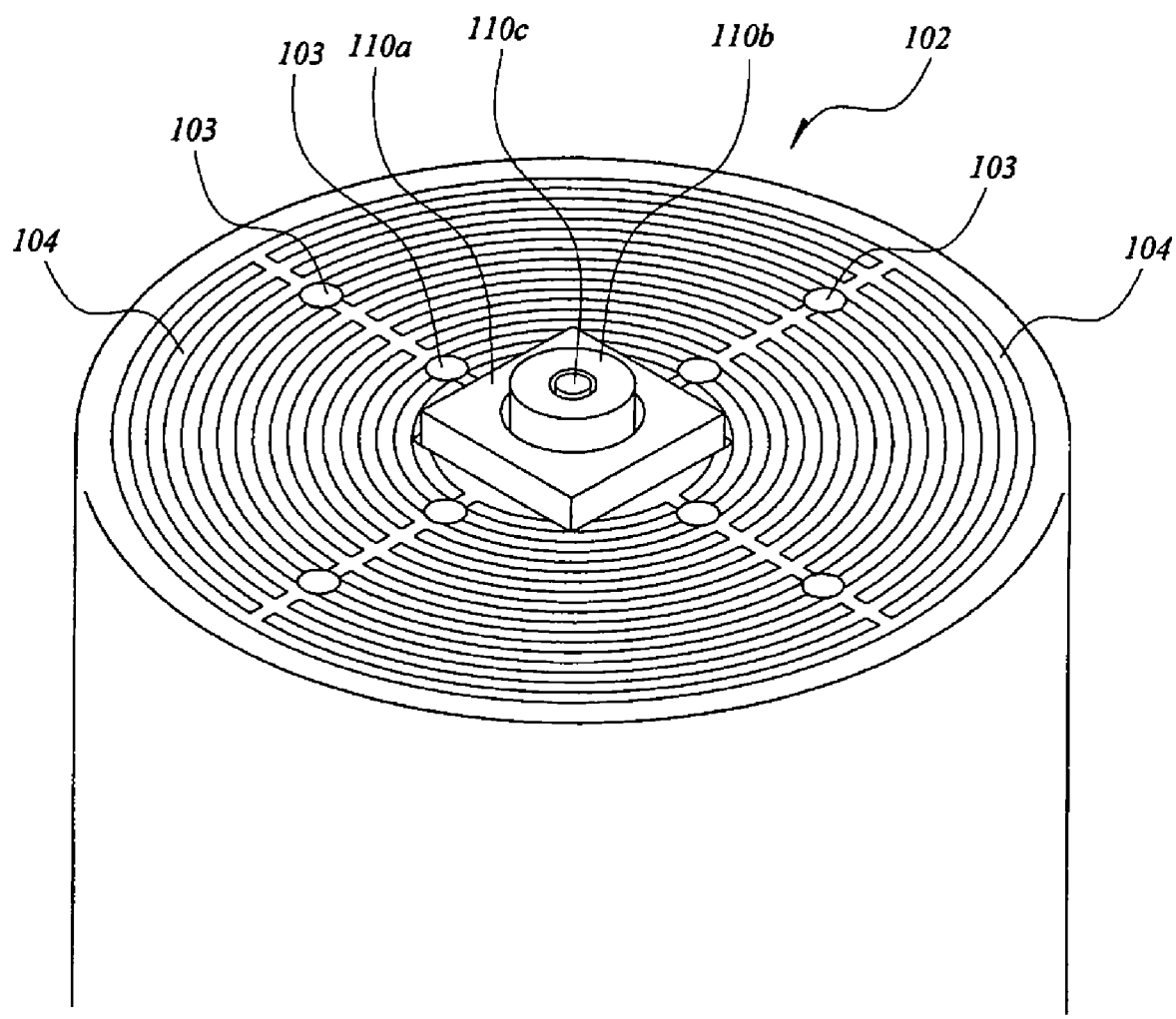
FIG. 18 is an enlarged perspective view thereof.

Next, as shown in FIG. 17, the intermediate block 110b and the inner block 110c are stuck up simultaneously to push up the dicing tape 4. Consequently, the position of the outer periphery (corners) of the upper surface of the block 110b which supports the chip 1 shifts more inside in comparison with the state supported by the block 110a, so that the separation between the chip 1 and the dicing tape 4 proceeds toward the center of the chip 1 from the area located outside the outer periphery of the upper surface of the block 110b. FIG. 18 is an enlarged perspective view showing the upper surface and the vicinity thereof of the chucking piece 102 in this state (the chip 1 and the dicing tape 4 are not shown).

Figure 19:
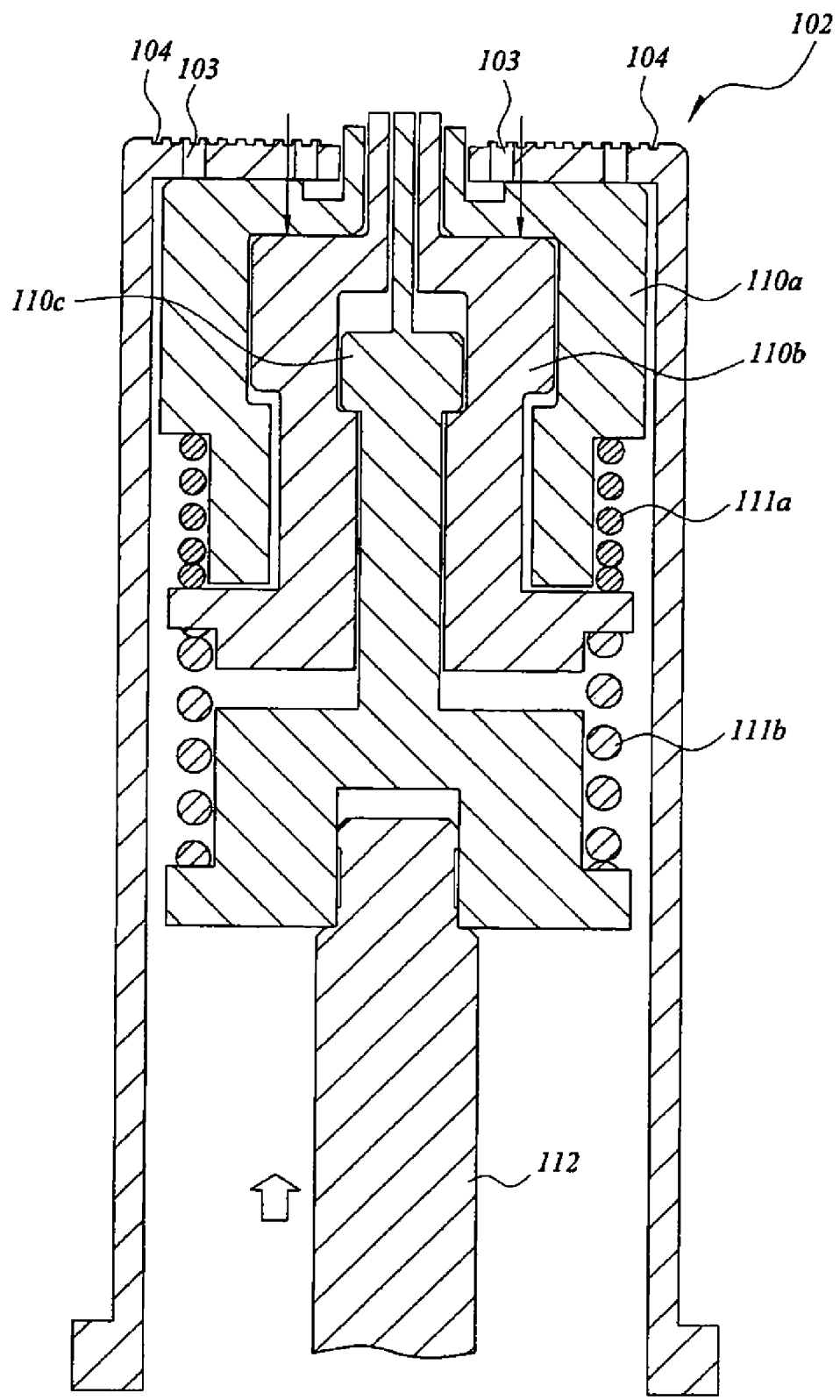
FIG. 19 is a sectional view of the chucking piece for explaining the semiconductor chip peeling method.

For sticking up the two blocks 110b and 110c simultaneously, the pusher 112 is pushed up to further push up the block 110c coupled to the pusher, as shown in FIG. 19. At this time, the intermediate block 110b is pushed up with the biasing force of the compression coil spring 111b, so that the two blocks 110b and 110c are pushed up simultaneously. The rise of the blocks 110b and 110c stops upon contact of a part (the surface indicated by arrows in the figure) of the intermediate block 110b with the outer block 110a. The force of the pusher 112 to push up the block 110c is set a magnitude which causes contraction of the compression coil spring 111a of a weak resilience but does not cause contraction of the compression coil spring 111b of a strong resilience. By so doing, until a part of the intermediate block 110b comes into contact with the outer block 110a, there is no fear of a further stick-up of the inner block 110c.

When sticking up the two blocks 110b and 110c, for the purpose of promoting the separation between the chip 1 and the dicing tape 4, the interiors of the gaps (S) in the blocks 110a-110c are pressure-reduced to suck the dicing tape 4 in contact with the chip 1 downward. Further, the interiors of the grooves 104 are pressure-reduced, causing the dicing tape 4 in contact with the peripheral portion of the upper surface of the chucking piece 102 to come into close contact with the upper surface of the chucking piece 102 (FIG. 17).

Figure 20:
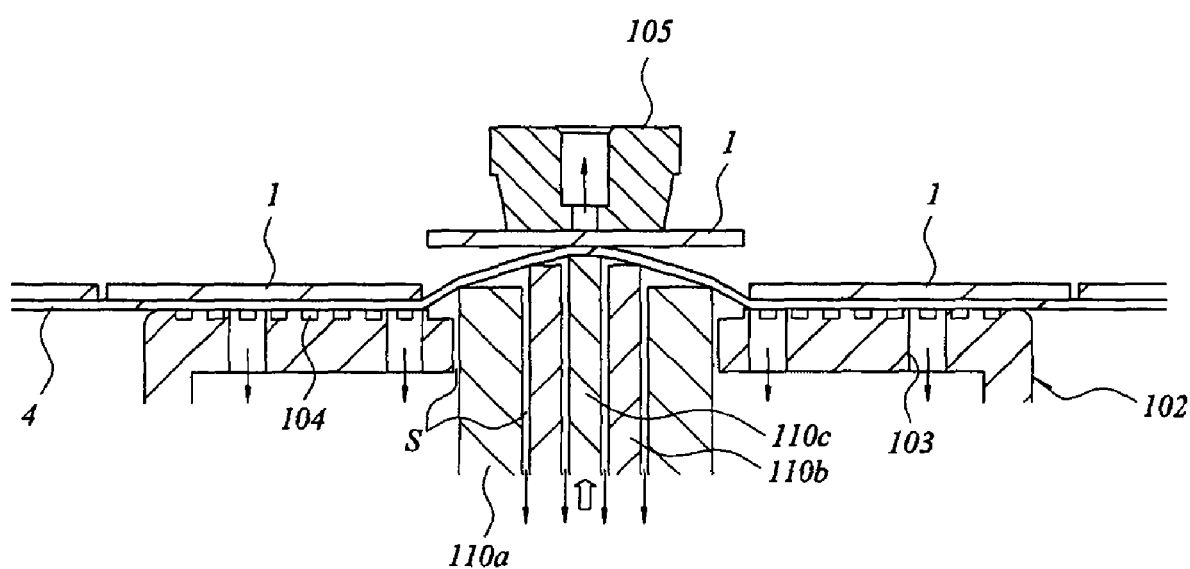
FIG. 20 is an enlarged sectional view of the upper surface and the vicinity thereof of the chucking piece for explaining the semiconductor chip peeling method.
Figure 21:
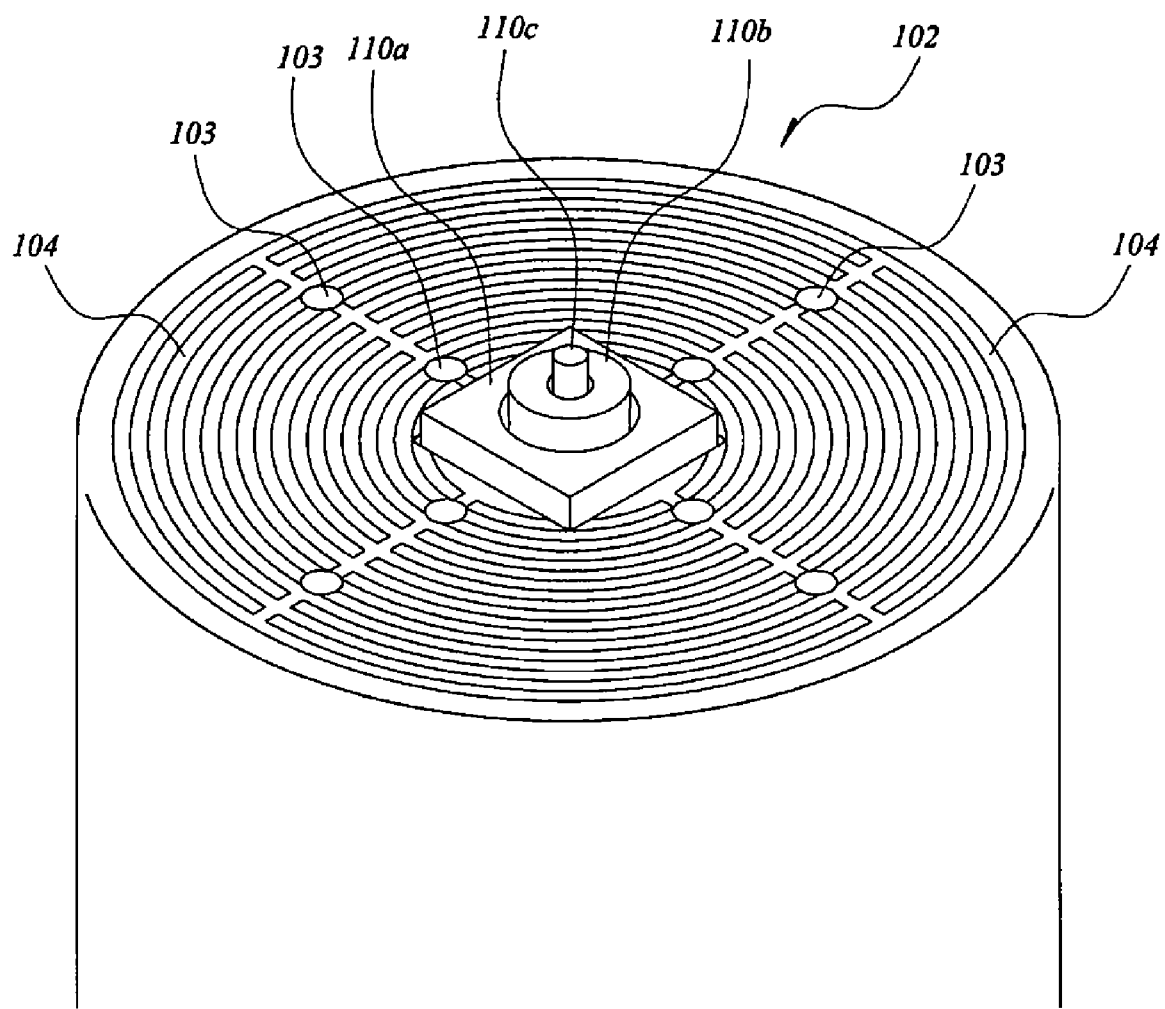
FIG. 21 is an enlarged perspective view thereof.
Figure 22:
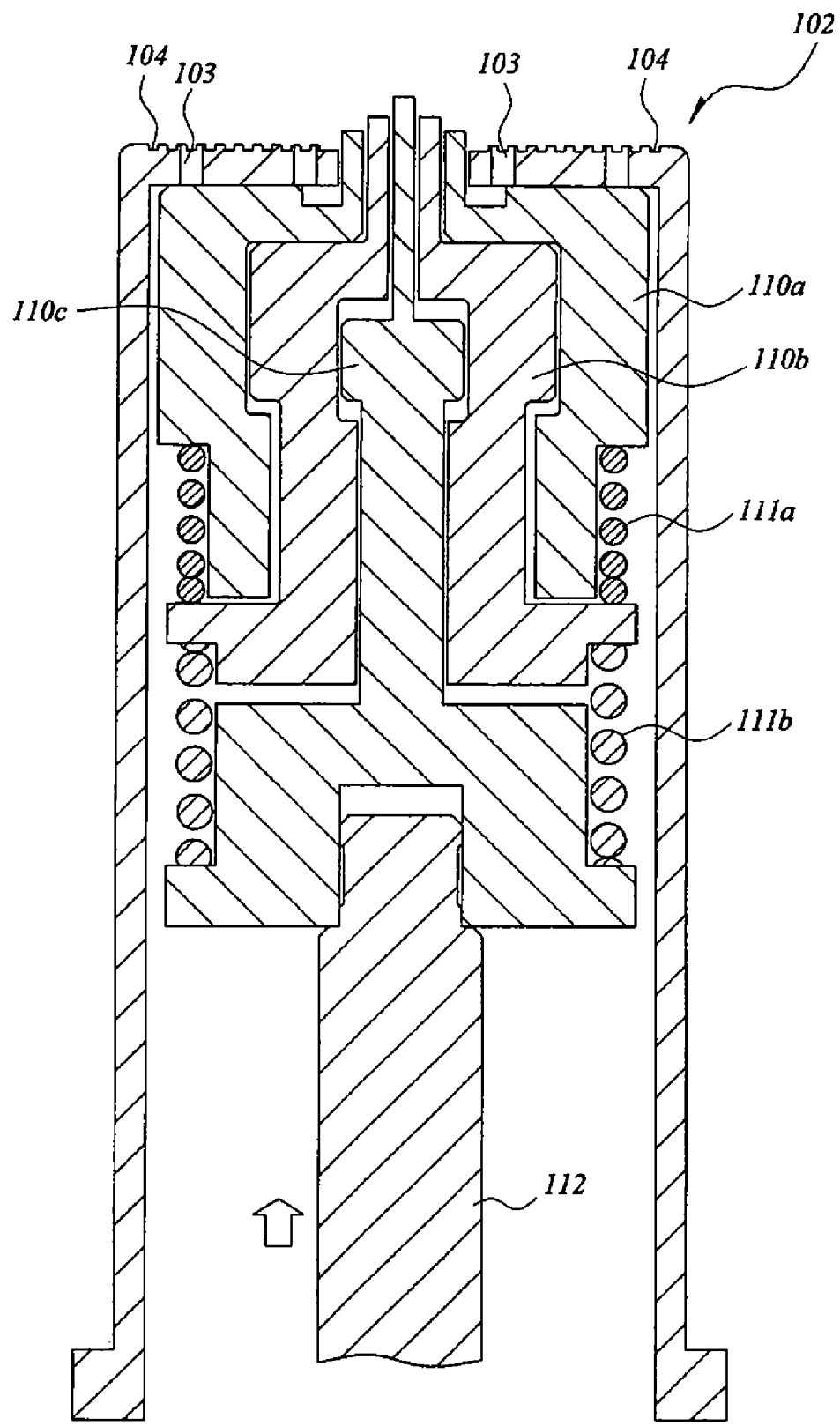
FIG. 22 is a sectional view of the chucking piece for explaining the semiconductor chip peeling method.

Next, as shown in FIG. 20, the inner block 110c is further stuck up to push up the back surface of the dicing tape 4 and support the back surface of the chip 1 at the upper surface of the block 110c. FIG. 21 is an enlarged perspective view showing the upper surface and the vicinity thereof of the chucking piece in this state (the chip 1 and the dicing tape 4 are not shown). For sticking up the inner block 110c, the block 110c is pushed up with such a strong force as causes contraction of the compression coil spring 111b, as shown in FIG. 22. As a result, the separation between the chip 1 and the dicing tape 4 proceeds in the area outside the outer periphery (corners) of the upper surface of the block 110c which is in contact with the dicing tape.

Figure 23:
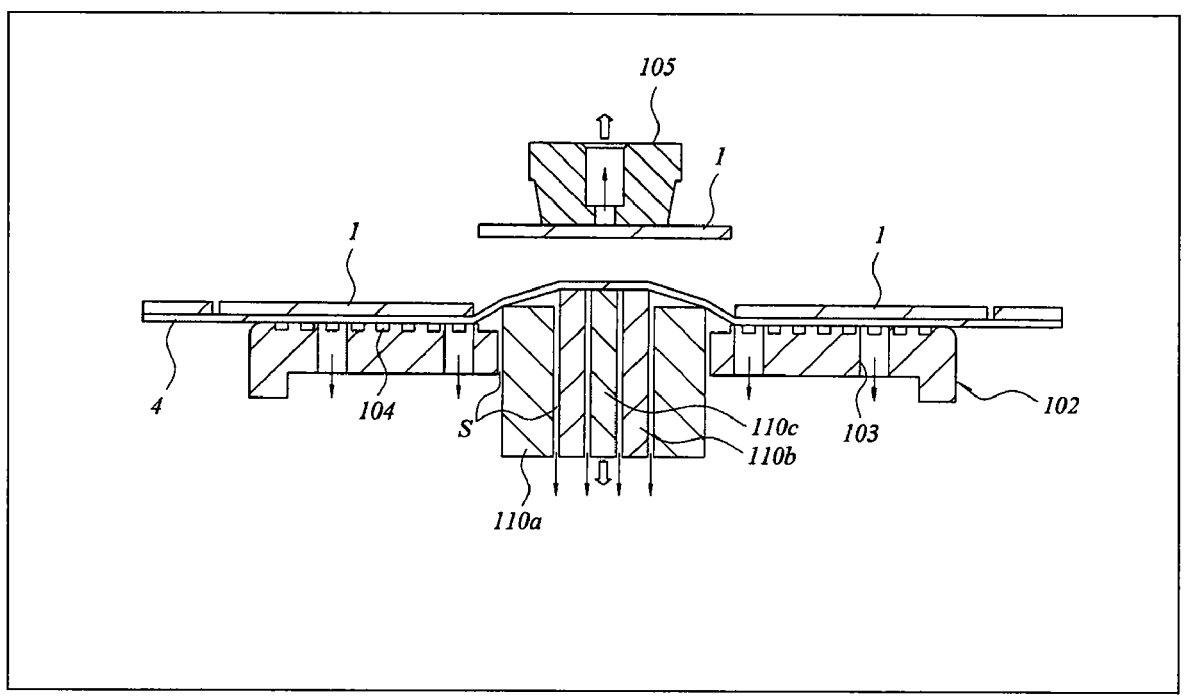
FIG. 23 is an enlarged sectional view of the upper surface and the vicinity thereof of the chucking piece for explaining the semiconductor chip peeling method.

Subsequently, as shown in FIG. 23, the block 110c is pulled down and the chucking collet 105 is pulled up, whereby the work for peeling the chip 1 from the dicing tape 4 is completed.

It is necessary for the upper surface of the block 110c to have a small area to the extent that the chip 1 is peeled from the dicing tape 4 with only the suction force of the chucking collet 105 when the block 110c is stuck up. If the area of the upper surface of the block 110c is large, the area of contact between the chip 1 and the dicing tape 4 becomes large and so does the tackiness of the two, resulting in that with only the suction force of the chucking collet 105 for the chip 1 it is impossible to peel the chip 1 from the dicing tape 4.

On the other hand, if the area of the upper surface of the block 110c is made small, a strong load is applied concentratively to the narrow area (central portion) of the chip 1 when the block 110c pushes up the back surface of the dicing tape 4, so that in an extremely case there is a fear of cracking of the chip 1. Therefore, when sticking up the block 110c, it is preferable to decrease the stick-up speed, or shorten the time of contact of the upper surface of the block 110c with the dicing tape 4, or decrease the stroke of the block 110c (for example, about 0.2-0.4 mm), thereby preventing a strong load from being imposed on the narrow area of the chip 1.

One effective method for increasing the suction force of the chucking collet 105 is to decrease the pulling-up speed of the chucking collet 105. If the chucking collet 10 is pulled up rapidly in a state in which a part of the chip 1 is in close contact with the dicing tape 4, there will arise a gap between the bottom of the chucking collet 105 and the upper surface of the chip 1, with consequent lowering of the degree of vacuum in the interior of the chucking collet 105 and hence lowering of the chip sucking force. On the other hand, if the pulling-up speed of the chucking collet 105 is set low, the time required for peeling the chip 1 from the dicing tape 4 becomes longer. Therefore, it is preferable to make the pulling-up speed of the chucking collet 105 variable. More specifically, it is preferable that at the beginning of the pulling-up operation the pulling-up speed is made low to ensure a sufficient suction force, while when the area of contact between the chip 1 and the dicing tape 4 becomes small to a certain extent, the pulling-up speed is increased to prevent delay of the peeling time. Making the bottom area of the chucking collet 105 larger than the upper surface area of the block 110c is also an effective method for increasing the suction force of the chucking collet 105.

Thus, by making the suction force of the chucking piece 105 large, the chip 1 can be peeled from the dicing tape 4 with only the suction force of the chucking collet 105 even when the area of contact between the chip 1 and the dicing tape 4 is relatively large, so that not only the peeling time can be shortened, but also it is possible to avoid the aforesaid problem which arises when the upper surface area of the block 110c is set small.

If the block 110c is pulled down in a state in which the chip 1 is pressed down by the chucking collet 105, there is a fear of the chip 1 striking against the block 110c and being cracked because the chucking collet 105 also moves downward. Therefore, when pulling down the block 110c, it is preferable that the chucking collet 105 be pulled up just before the pulling-down motion of the block or the position of the chucking collet 105 be fixed to at least present a downward movement of the chucking collet.

The chip 1 thus peeled from the dicing tape 4 is conveyed to the next process (pellet mounting process) while being chucked and held by the chucking collet 105 (generally conveyed from a pick-up stage to a die bonding stage 132 or a die bonding section 300 in the same apparatus). When the chucking collet 105 which has conveyed the chip to the next step returns to the chip peeling device 100 (chip peeling section), the next chip 1 is peeled from the dicing tape 4 in accordance with the procedure shown in FIGS. 12 to 23. Thereafter, the chips 1 are peeled one by one from the dicing tape 4 in accordance with the same procedure as above.

Figure 24:
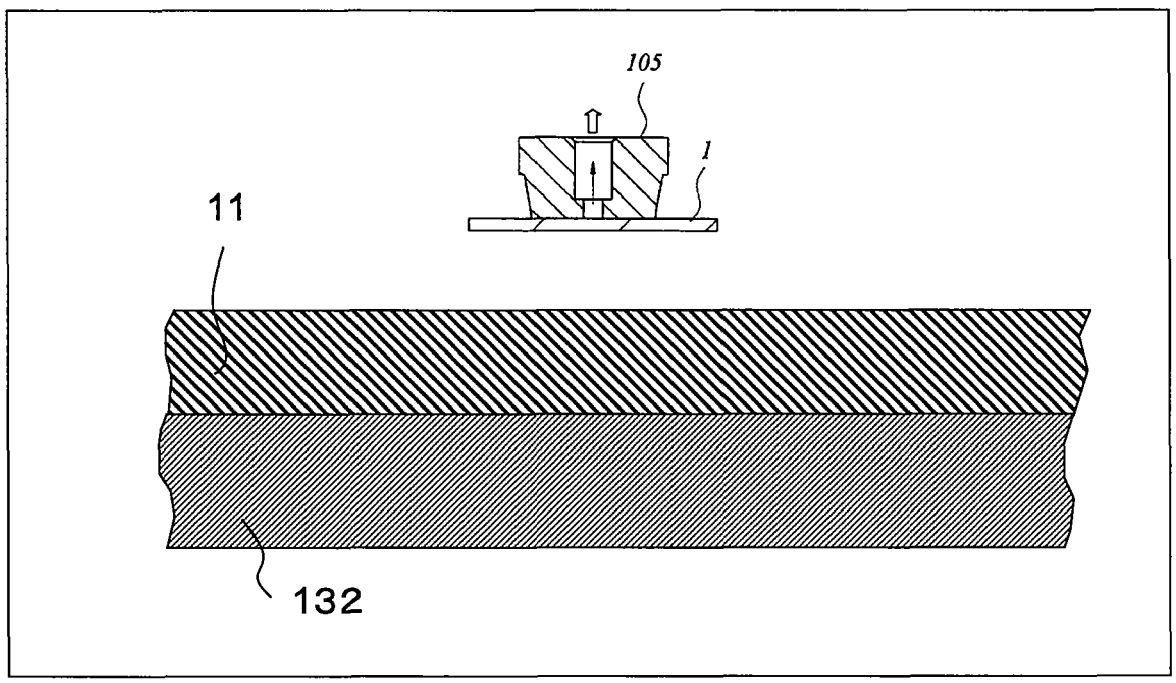
FIG. 24 is a sectional view showing in what manner the semiconductor chip peeled in FIG. 23 is conveyed to a die bonding section.

Now, a description will be given first about a pellet mounting process in which vacuum suction is turned OFF after confirmation of chip landing. As shown in FIG. 24, the chip 1 having been conveyed to the pellet mounting process is mounted over a wiring substrate 11 through an adhesive layer or adhesive 10. (Usually a double-coated adhesive sheet for die bonding or an adhesive layer for die bonding, called DAF, i.e., "die attach film," is affixed to the back surface of the wafer before dividing the wafer into chips, for example, when or before affixing the dicing tape, or a liquid adhesive is applied or dropped to the wiring substrate just before die bonding. DAF is generally affixed in a sandwiched form in between the back surface of the wafer and the dicing tape and is divided together with chips at the time of dicing. When picking up a chip, DAF is picked up together with the chip. Pre-affixing the dicing film eliminates the need of re-forming an adhesive layer at the time of die bonding and is thus advantageous in point of mass production.) That is, the chip 1 peeled from the dicing tape 4 descends in a vacuum-chucked state by the chucking collet 105 toward the wiring substrate 11 placed on the die bonding stage 132 heated to a temperature of about 100° to 150° C.

Figure 25:
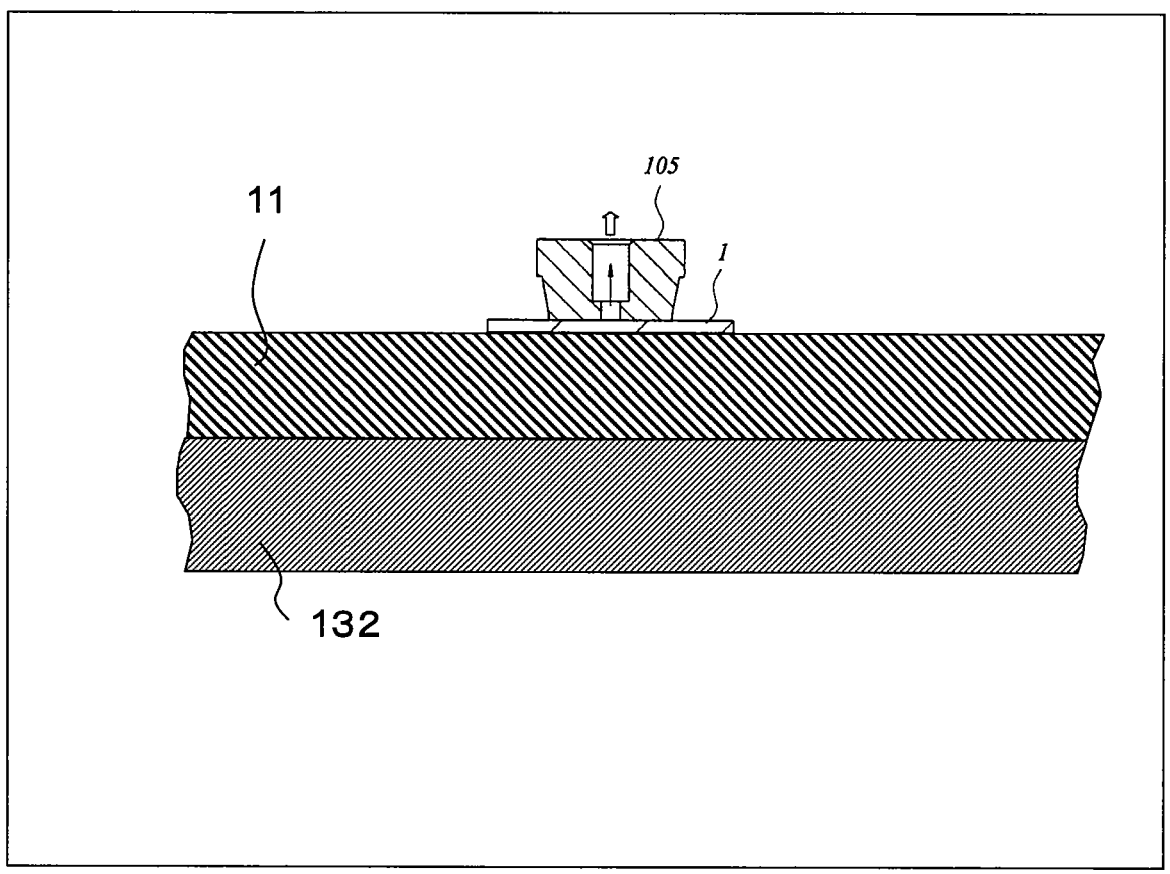
FIG. 25 is a sectional view showing a state in which the semiconductor chip peeled in FIG. 23 has been conveyed to the die bonding section and landed on a wiring substrate.

As shown in FIG. 25, once the landing of the chip 1 onto the wiring substrate 11 is confirmed, the collet 105 turns OFF vacuum suction while pressing down the chip 1 and stays as it is at that position for a predetermined time (for example, one to several seconds). Thermocompression bonding proceeds during this period.

Figure 26:
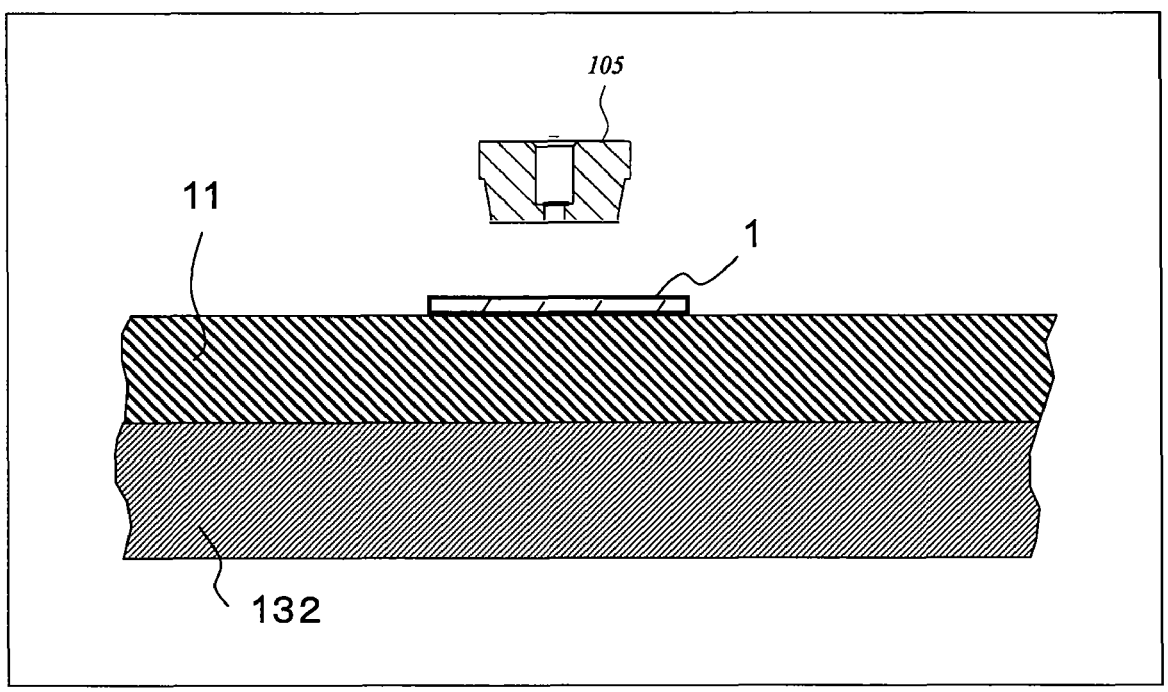
FIG. 26 is a sectional view showing a state in which the semiconductor chip peeled in FIG. 23 has been bonded onto the wiring substrate in the die bonding section.

Thereafter, as shown in FIG. 26, the collet 105 leaves the chip 1 while keeping vacuum suction OFF.

Figure 27:
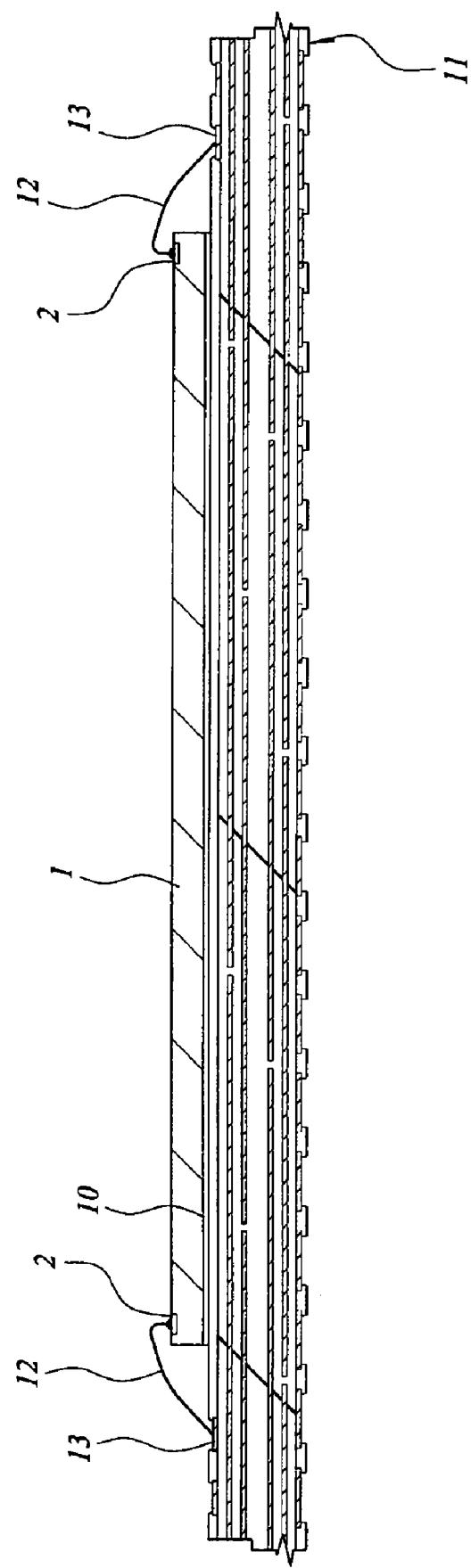
FIG. 27 is a sectional view of the wiring substrate, showing a pellet mounting step for the semiconductor chip.

The chip 1 after the compression of thermocompression bonding is electrically coupled to electrodes 13 through Au wires 12, as shown in FIG. 27.

Next, a description will be given about a pellet mounting process (die bonding process) in which vacuum suction is turned OFF before chip landing. As shown in FIG. 24, the chip 1 having been conveyed to the pellet mounting process is mounted over the wiring substrate 11 through an adhesive or adhesive layer 10. (Usually, a double-coated adhesive sheet for die bonding or an adhesive layer for die bonding, called DAF, i.e., "die attach film," is affixed to the back surface of the wafer before dividing the wafer into chips or when or before affixing the dicing tape, or a liquid adhesive is applied or dropped to the wiring substrate just before die bonding (that is, an adhesive layer is to be interposed between the chip and the wiring substrate at the time of die bonding). DAF is generally stretched in a sandwiched form in between the back surface of the wafer and the dicing tape and is divided together with chips at the time of dicing. When picking up a chip, DAF is picked up together with the chip. Pre-affixing the die attach film eliminates the need of re-forming an adhesive layer at the time of die bonding and is thus advantageous in point of mass production.) That is, the chip 1 having been peeled from the dicing tape 4 is chucked by physical chucking while vacuum suction is turned OFF by the chucking collet 105 and descends toward the wiring substrate 11 placed over the die bonding stage 132 heated to a temperature of about 100° to 150° C. (Since the glass transition temperature of an organic wiring substrate is generally about 240° to 330° C., the substrate temperature may be in the range of 100° to 200° C., but a temperature in the range of 100° to 150° C. is preferred in order to minimize deformation of the substrate. However, it is at least required that the substrate temperature be not higher than the glass transition temperature of the substrate used.) As shown in FIG. 25, once the landing of the chip 1 onto the wiring substrate 11 is confirmed, the collet 105 stays at that position for a predetermined time (for example, one to several seconds) while pressing down the chip 1 at a predetermined pressure and while keeping vacuum suction OFF. Thermocompression bonding proceeds during this period.

Thereafter, as shown in FIG. 26, the collet 105 leaves the chip 1 while keeping vacuum suction OFF.

The chip 1 after the completion of thermocompression bonding is electrically coupled to the electrodes 13 of the wiring substrate 11 through Au wires, as shown in FIG. 27. By so doing, landing of the chip is performed with vacuum suction OFF, so even if the thin-film chip is bent at the time of peeling and chucking, the bent state is remedied at the time of chip landing. Thus, there is no fear of bending or undesirable stress remaining on the chip after die bonding. A description common to both the above cases will be given below.

Figure 28:
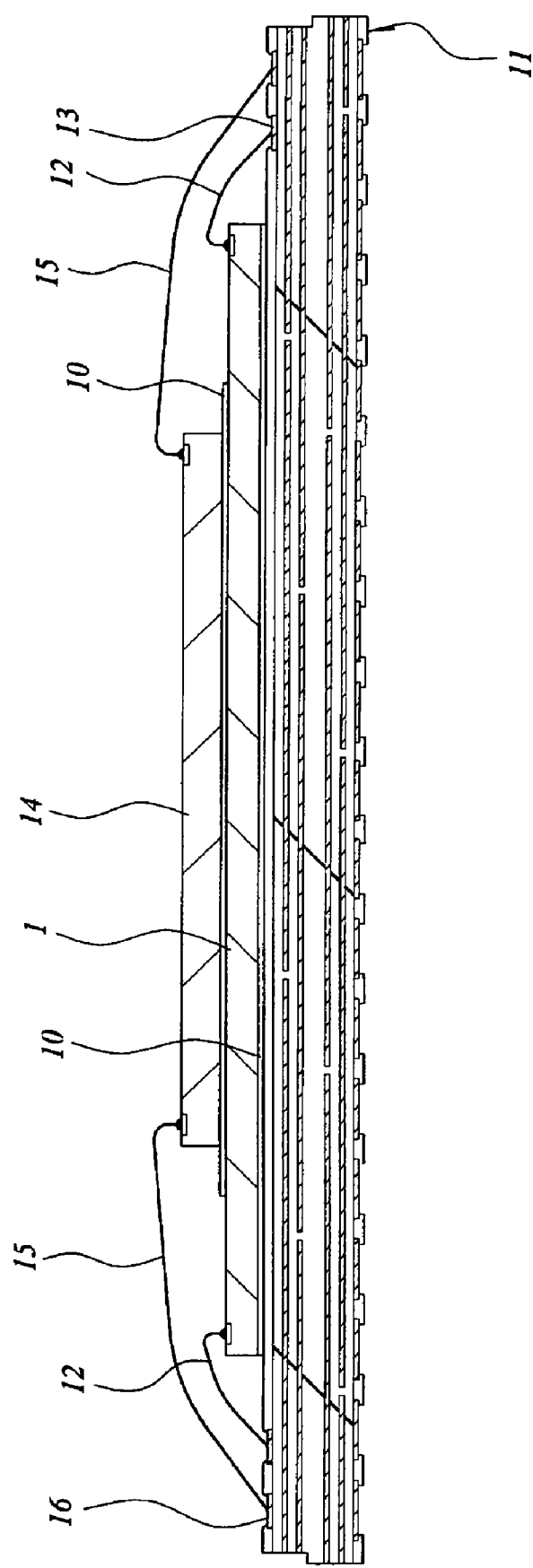
FIG. 28 is a sectional view of the wiring substrate, showing a semiconductor chip stacking and wire bonding step.

Next, as shown in FIG. 28, a second chip 14 is stacked through the adhesive 10 or the like onto the chip 1 mounted over the wiring substrate 11 and is electrically coupled through Au wires 15 to electrodes 16 formed on the wiring substrate 11. The second chip 14 is a silicon chip with an integrated circuit different from that of the chip 1 formed thereon. After being peeled from the dicing tape 4 by the method described above, the second chip 14 is conveyed to the pellet mounting process and is stacked onto the chip 1.

Figure 29:
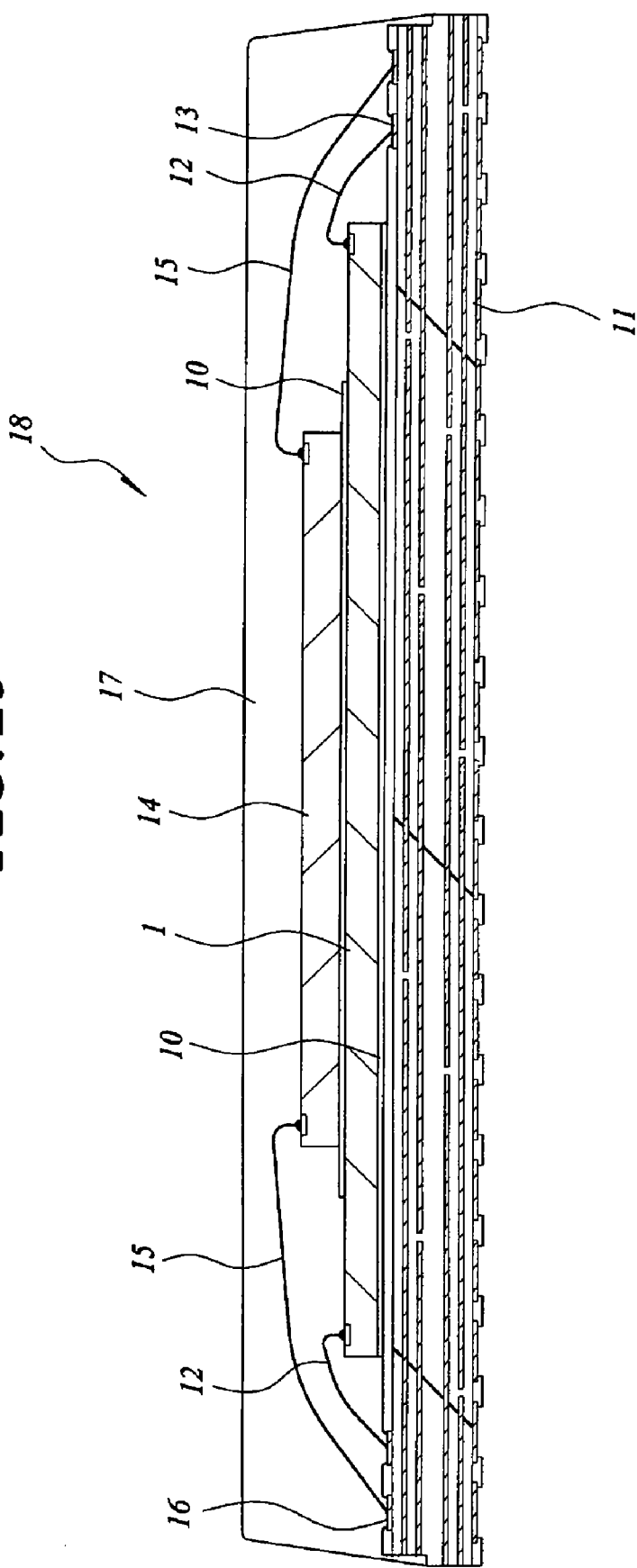
FIG. 29 is a sectional view of the wiring substrate, showing a resin sealing step for the semiconductor chip.
Figure 30:
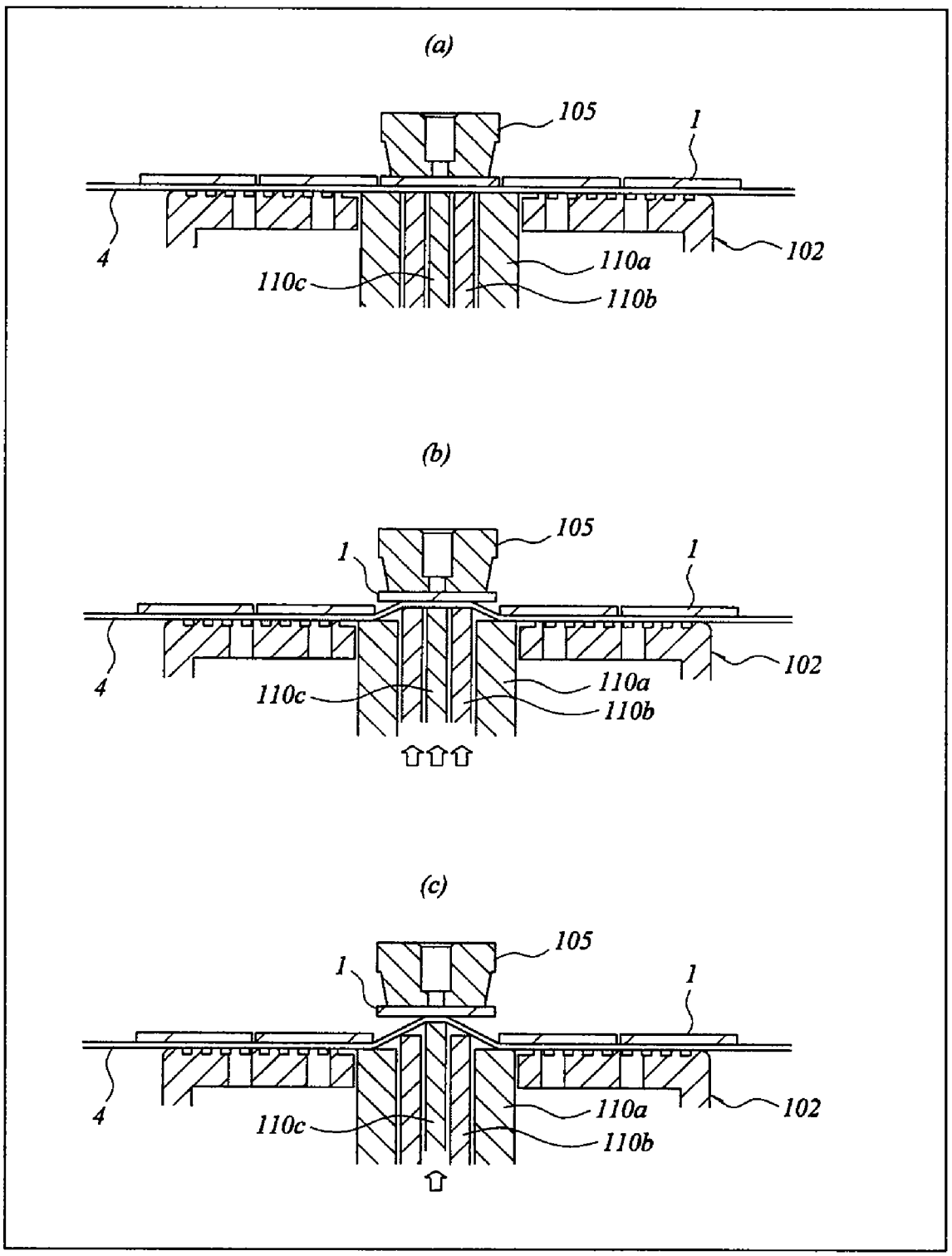
FIGS. 30(a) to 30(c) are sectional views of the upper surface and the vicinity thereof of the chucking piece for explaining another example of the semiconductor chip peeling method.

Thereafter, the wiring substrate 11 is conveyed to a molding process, in which, as shown in FIG. 29, the chips 1 and 14 are sealed with molding resin 17 to complete a stacked package 18.

In this embodiment a description has been given above about the case where the chip 1 to be peeled off is a size larger than the outer block 110a, but for example, as shown in FIG. 30(a), when the chip 1 to be peeled off is smaller than the outer block 110a and larger than the intermediate block 110b, first, as shown in FIG. 30(b), the intermediate block 110b may be stuck up to peel the peripheral edge portion of the chip 1 from the dicing tape 4 and then, as shown in FIG. 30(c), the inner block 110c may be stuck up to peel the central portion of the chip 1 from the dicing tape 4. In this case, for example, a spacer is inserted between the chucking piece 102 and the outer block 110a to prevent lifting of the outer block 110a even when the pusher 112 is pushed up.

Although the method adopted in this embodiment uses three blocks (110a-110c) to peel each chip from the dicing tape, the number of such blocks is not limited to three. Four or more blocks may be used in the case where the size of the chip 1 to be peeled off is large, or two blocks may be used in the case where the size of the chip 1 to be peeled off is very small.

2. Details of Pick-Up Section and Environs Thereof (Mainly FIGS. 31 to 38)

With reference to FIGS. 31 to 38, a description will be given below about peeling operation control and a detailed structure of the collet 105, as well as a relation between them and the lower base 102 (chucking piece).

FIGS. 31(a) and 31(b) comprises a conceptual diagram (FIG. 31a) showing a pick-up section and a control system thereof, a time chart (FIG. 31b) and a sectional view (FIG. 31b). A pick-up operation starts from when the chip 1 to be picked up on the dicing table 4 is positioned on the collet 105. Upon completion of the positioning, vacuum suction is carried out through the suction holes 103 and the gaps S in the chucking piece 102, whereby the dicing tape 4 is chucked to the upper surface of the chucking piece 102. In this state, a valve 143 (a three-way valve adapted to be closed on its vacuum supply source side and be opened to the atmosphere on its collet side when vacuum chucking is OFF) in a vacuum suction system 107 (e.g., suction pressure: minus 80 to 90 kilopascal, suction flow rate: 7 L/min.) opens in accordance with a command provided from a pick-up section control system 144, whereby vacuum is supplied from a factory vacuum supply source through a vacuum supply pipe 141 and the collet 105 descends and lands while carrying out vacuum suction toward the device surface of the chip 1. When the stick-up blocks 110 as a principal portion of the chucking piece 102 rise, the chip 1 rises while being sandwiched in between the collet 105 and the stick-up blocks 110, but since the peripheral portion of the dicing tape 4 remains vacuum-chucked by the peripheral portion, indicated at 102a, of the chucking piece, there occurs tension in the peripheral portion of the chip 1, resulting in the dicing tape 4 being peeled from the chip peripheral portion. At this time, however, the chip peripheral portion undergoes stress on its underside and bends. As a result, a gap is formed between the chip and the lower surface of the collet 105 and air flows into the vacuum suction system 107 of the collet 105. This is indicated by an increase of a suction quantity output in a gas flow rate sensor 21 disposed in the vacuum suction system 107. In this case, if the rise of the stick-up blocks 110 is stopped and the stand-by state is maintained in accordance with a command provided from the pick-up section control system 144, then in many cases the peeling of the dicing tape 4 proceeds and the bent state of the chip 1 is mitigated and reverts to its allowable range. FIG. 31b shows changes in the suction quantity output (digital and analog output signals) of the gas flow rate sensor 21 in this process. When the collet descends, a large suction quantity is exhibited correspondingly to the open condition. Upon landing at $t_1$, the flow rate decreases rapidly, and it becomes nearly "0" at $t_2$. Even if the stick-up blocks start rising, leak does not occur for a while because of low tension. At $t_3$ there starts leak due to bending of the chip. The leak in which the rise of the blocks 110 is stopped and a stand-by condition thereof is maintained stops. At $t_4$ the flow rate again returns to nearly "0." It goes without saying that the gas flow rate sensor 21 is not specially limited insofar as it can measure the gas flow rate or any other corresponding physical quantity. But it is considered preferable from the standpoint of preventing cracking in the chip peripheral portion that the shape and dimension of the rubber chip be made almost equal to the shape and dimension of the chip concerned (the rubber chip is rectangular if the chip shape is rectangular) (provided a little larger or smaller size of the rubber chip is not excluded) This is also true of the stick-up blocks. Although in this embodiment there is shown a little smaller size of the stick-up blocks than the chips, no limitation is made thereto. The stick-up blocks may be almost equal to or somewhat larger than the chip in shape and dimension.

FIGS. 32 to 38 illustrate a detailed structure of the chucking collet 105, especially its lower end portion, i.e., a rubber chip 125, and its variations, as well as a relation between them and the lower base 102 (chucking piece). FIG. 32a is a top view of the stick-up blocks 110 corresponding to the illustrations of FIGS. 1 to 30, showing a positional relation between the stick-up blocks 110 and the rubber chip 125. The shape of the rubber chip 125 is almost the same as that of the chip to be picked up. FIG. 32b is a bottom view of the collet body 105 (or rubber chip holder). A vacuum suction hole 122 (for example, 4 mm in diameter) is formed centrally and vacuum suction grooves 121 are formed in axial and diagonal directions. In the rubber chip 125 there are formed vacuum suction holes 106a to 106i (for example, 0.8 mm in diameter) correspondingly to the vacuum suction grooves 121 and the stick-up blocks 110a to 110c.

Figure 32:
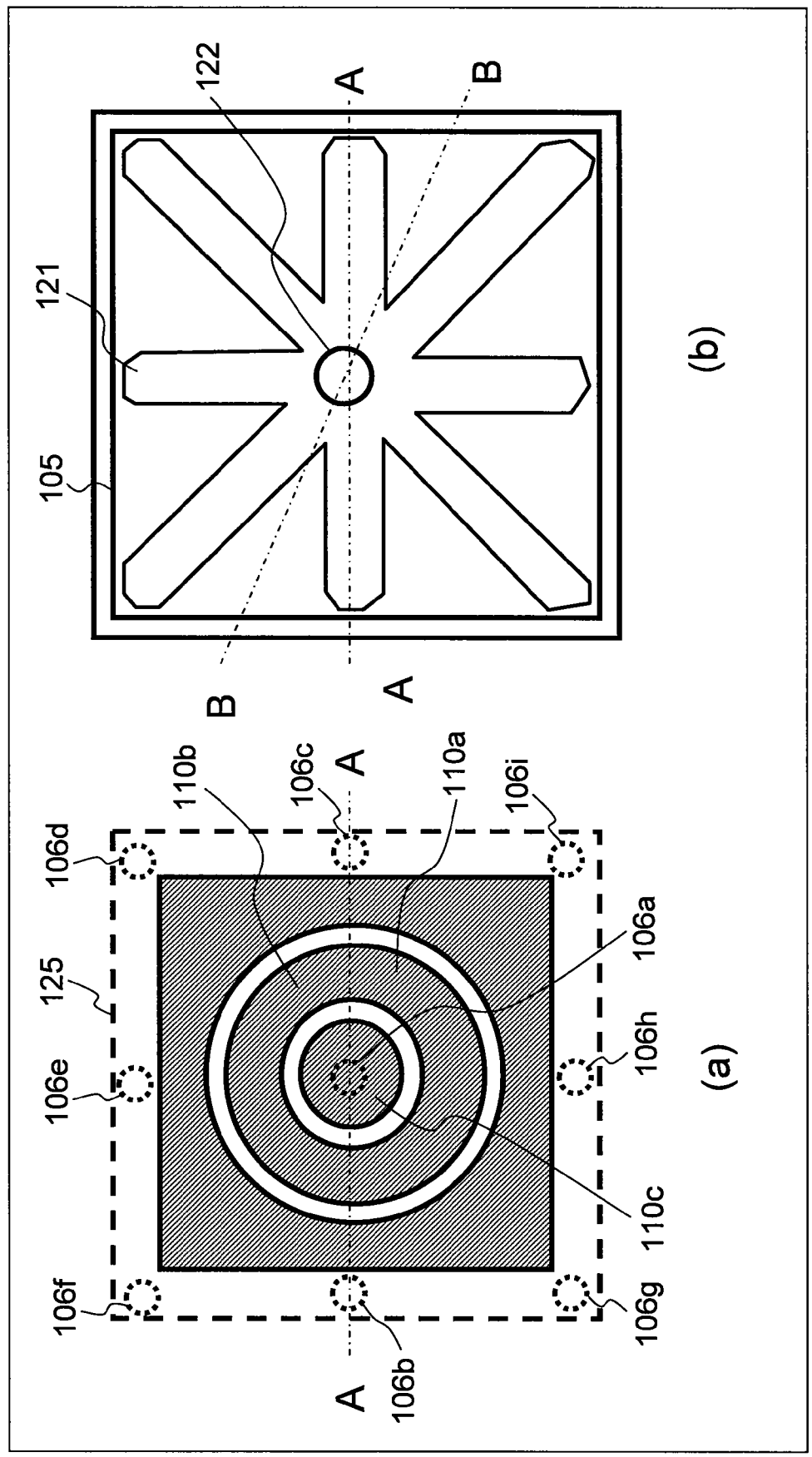
FIGS. 32(a) and 32(b) are plan views showing an example of a rubber chip, an example of stick-up blocks and the structure of a collet body.
Figure 33:
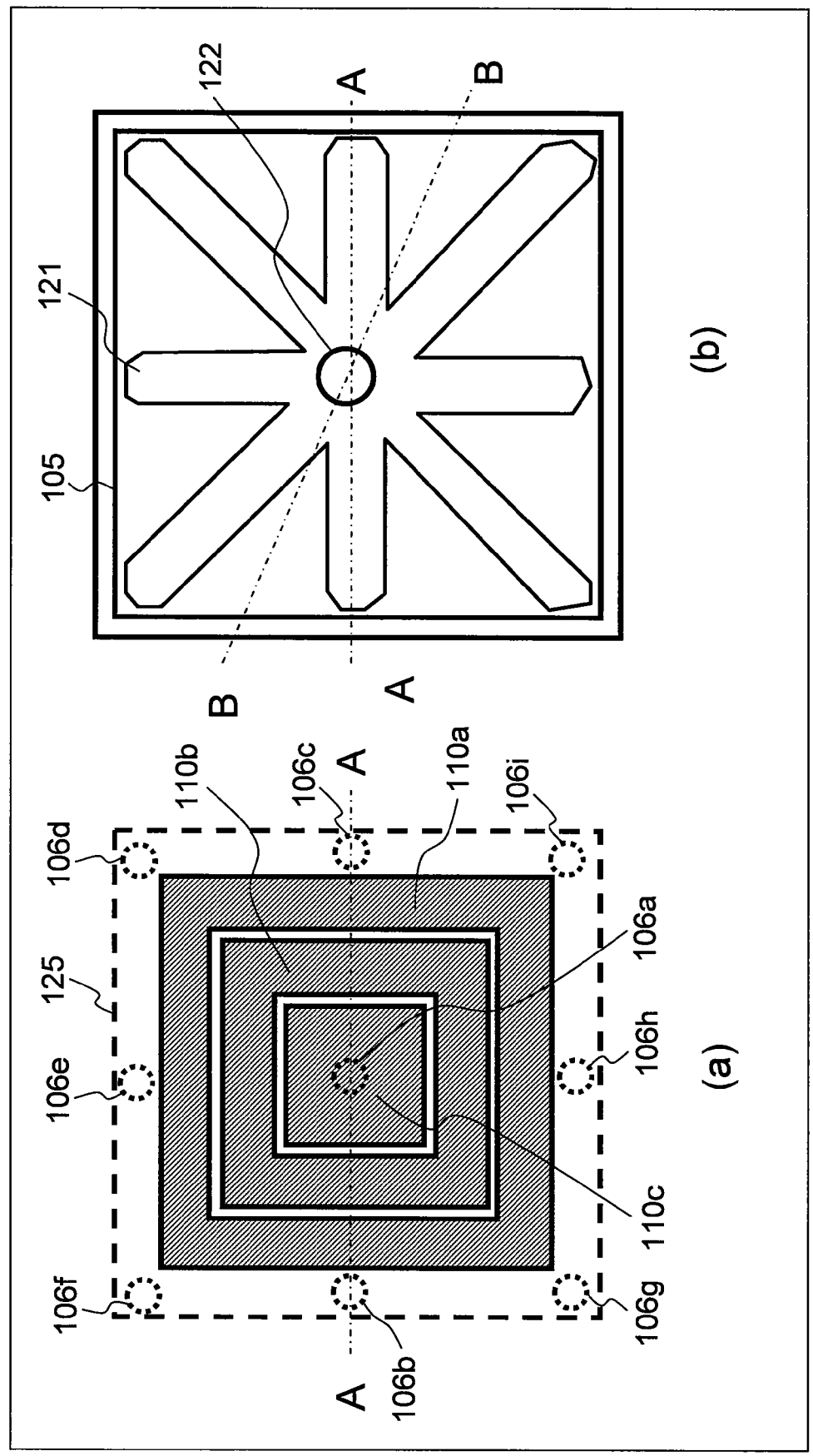
FIGS. 33(a) and 33(b) are plan views showing another example of a rubber chip, another example of stick-up blocks and the structure of the collet body.

FIG. 33 shows a variation of the rubber chip 125, in which two inside stick-up blocks 110b and 110c have about the same upper surface shape as the chip 1. By so doing, it is possible to mitigate the concentration of stress at the corners of the chip. The structure of the rubber chip shown in FIG. 32 or 33 is very important in the peeling process. Particularly, with the vacuum suction hole 106a formed in the central portion (including the vicinity thereof), the chip holding state can be maintained by the central vacuum suction hole 106a even if the chip is bent by the tension of the adhesive tape. Assuming that the chip is 10 mm square (chip thickness: 25 microns, DAF thickness: 25 microns), for example, the first block (segment) is 8.6 mm square, the second block is 6.3 mm square and the third block 4.0 mm square.

Figure 34:
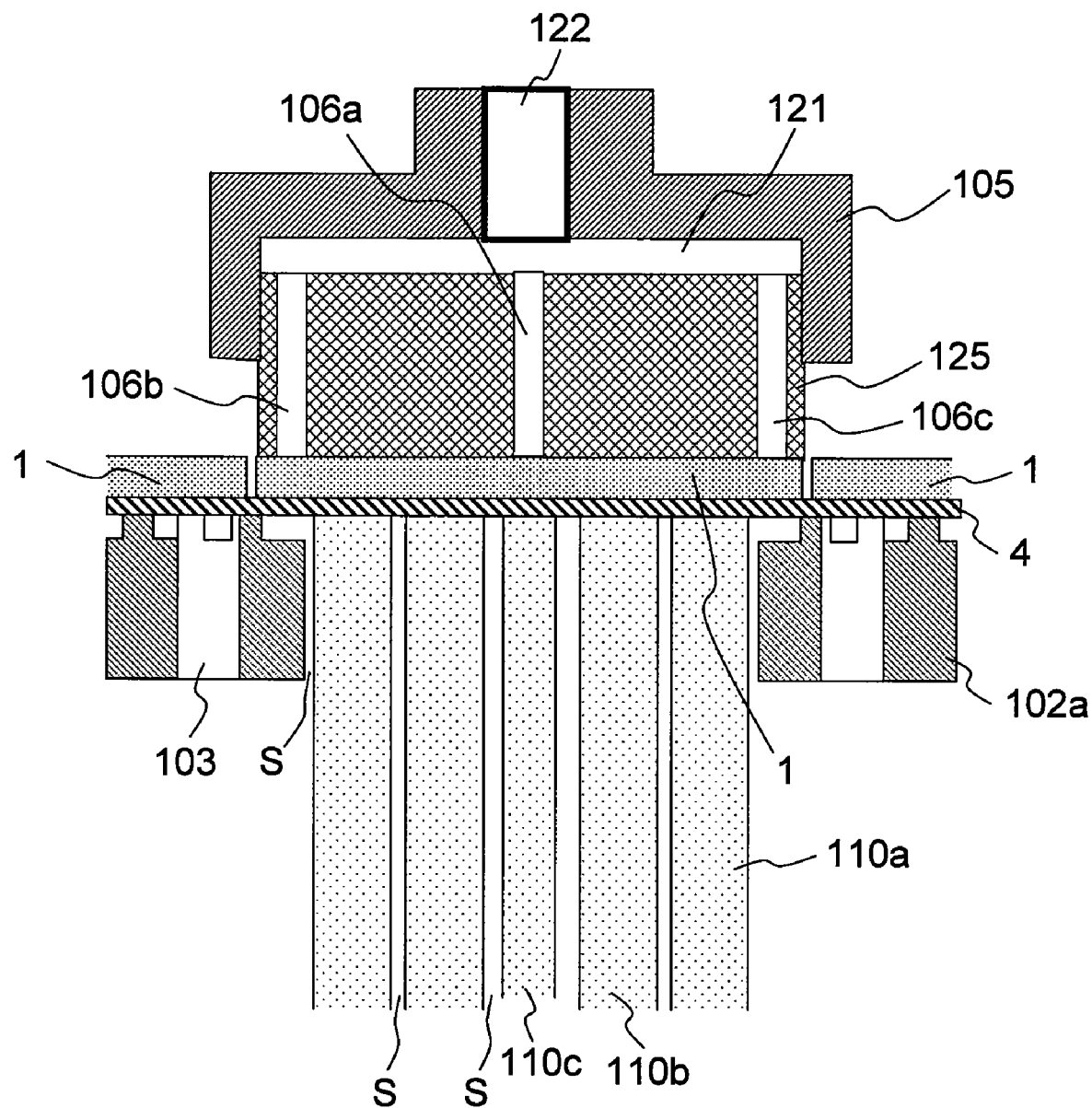
FIG. 34 is a sectional view explaining the state of the section taken on line A-A in FIG. 34.
Figure 35:
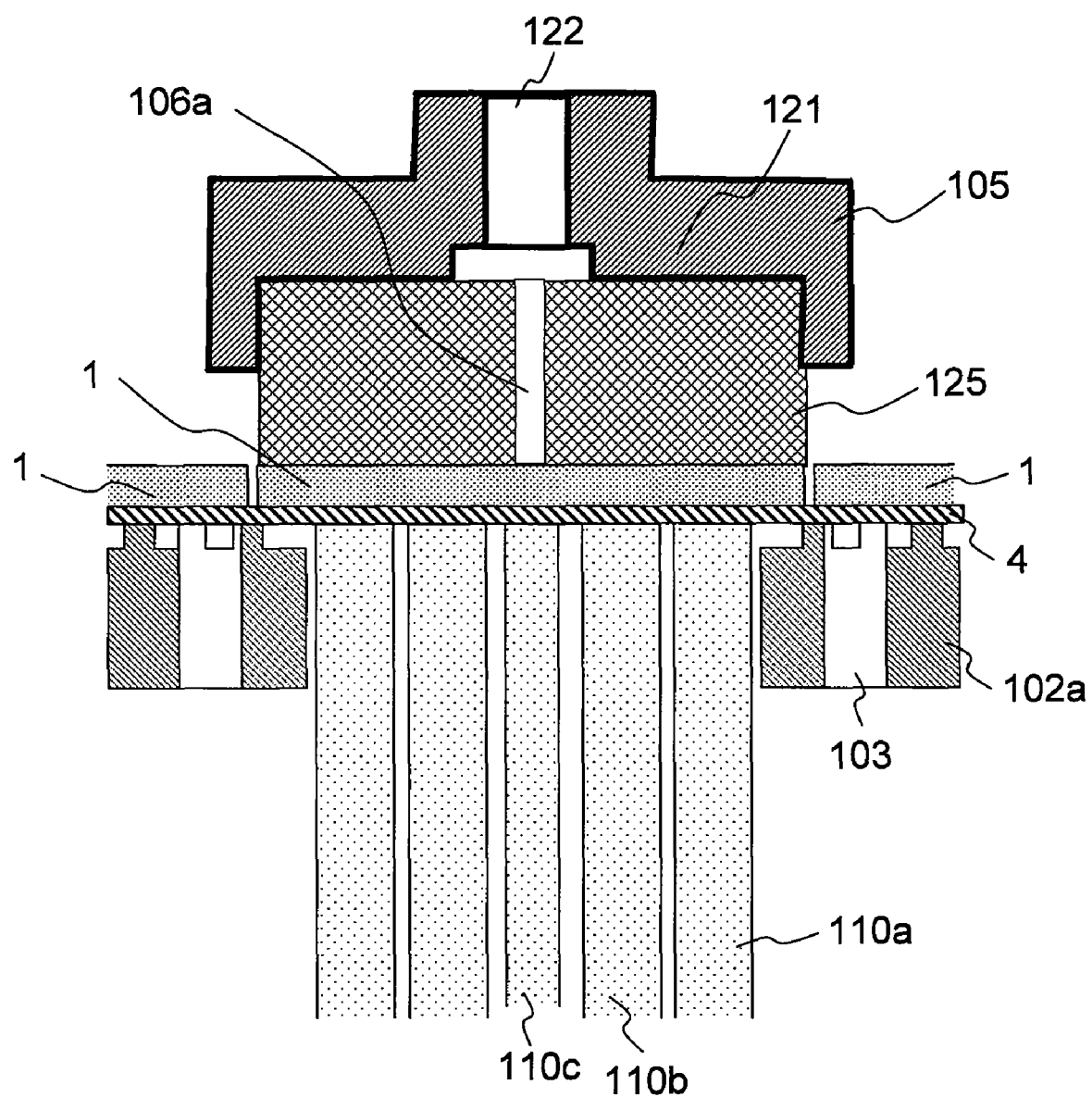
FIG. 35 is a sectional view explaining the state of the section taken on line B-B in FIG. 34.

FIG. 34 is a schematic sectional view taken on line A-A in FIGS. 32 and 33 in a landed state of the collet 105 and FIG. 35 is a schematic sectional view taken on line B-B in FIGS. 32 and 33. At this time, the underside of the dicing tape 4 is chucked though the suction holes 103 formed in the lower base peripheral portion and further through gaps S formed between lower base principal portions 110, while the upper side of the dicing tape 4 is vacuum-sucked through the vacuum suction holes 106.

Figure 36:
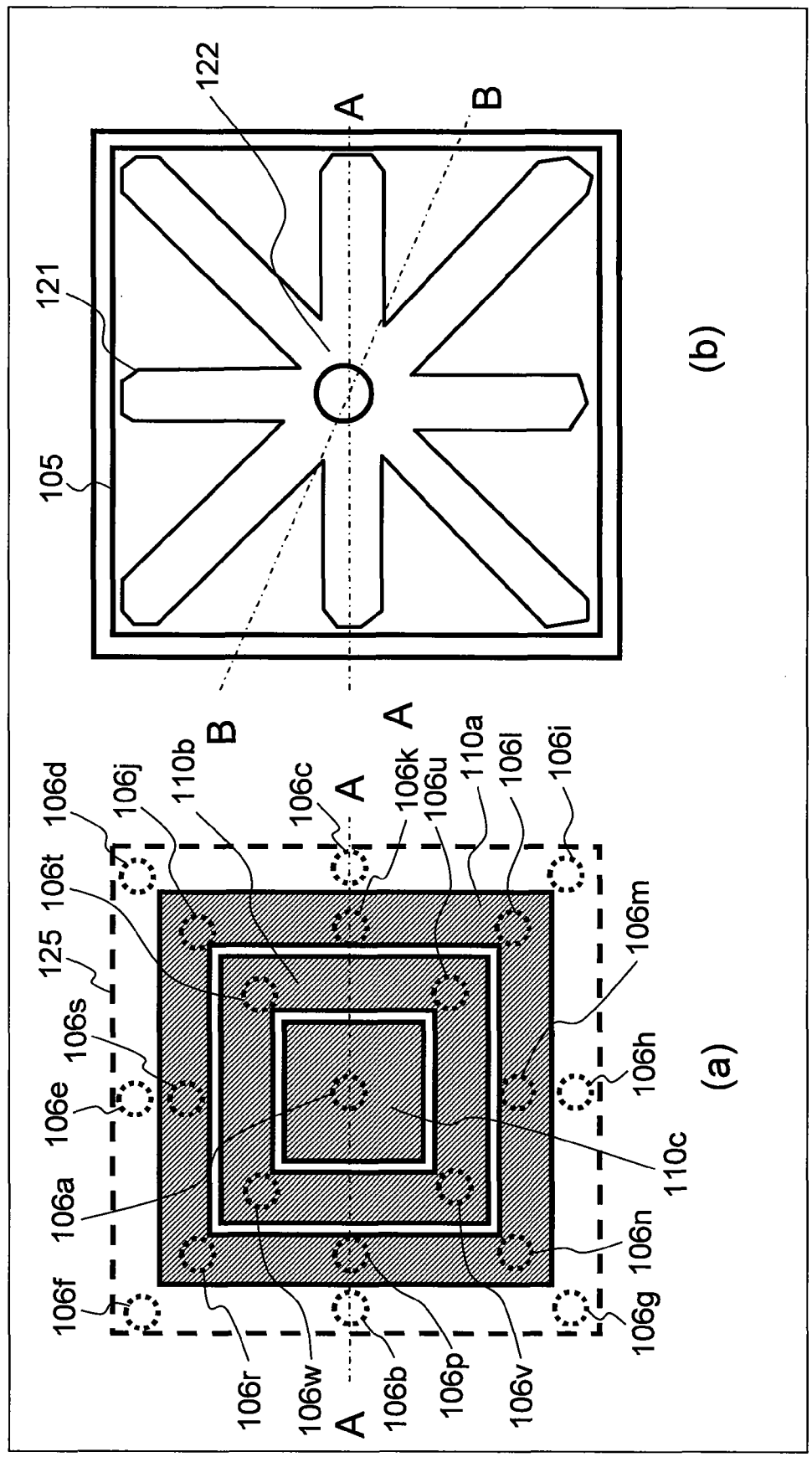
FIG. 36(a) and FIG. 36(b) are plan views showing a further example of a rubber chip, a further example of stick-up blocks and the structure of the collet body.

FIG. 36 shows another variation of the rubber chip 125, which permits leak detection in a more minute manner. More specifically, a large number of vacuum suction holes 106a to 106w are formed within the rubber chip 125 correspondingly to the sub-blocks constituting the stick-up blocks 110 and the innermost portion of a chucking piece 102a. In this arrangement, at least one or plural chucking holes are formed correspondingly to each individual segment (further, an outer portion of the outermost segment) of each stick-up block, so that it is possible to enhance the accuracy of detecting the peeling condition by leak. Besides, in the combination with the rubber chip formed of a relatively soft elastomer it is possible to disperse the chucking force throughout the entire chip and therefore a local concentration of stress does not occur.

Figure 37:
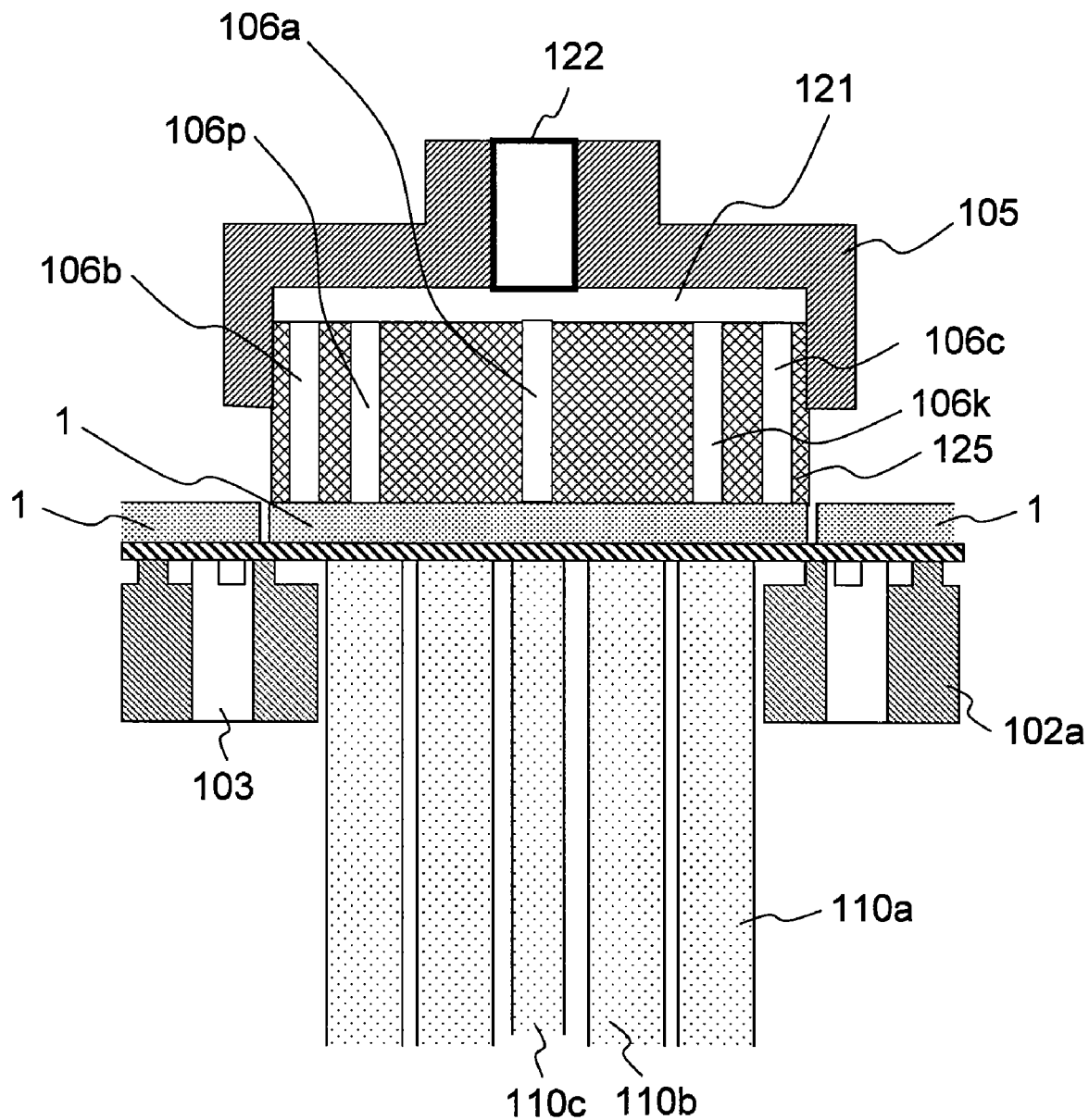
FIG. 37 is a sectional view explaining the state of the section taken on line A-A in FIG. 36.
Figure 38:
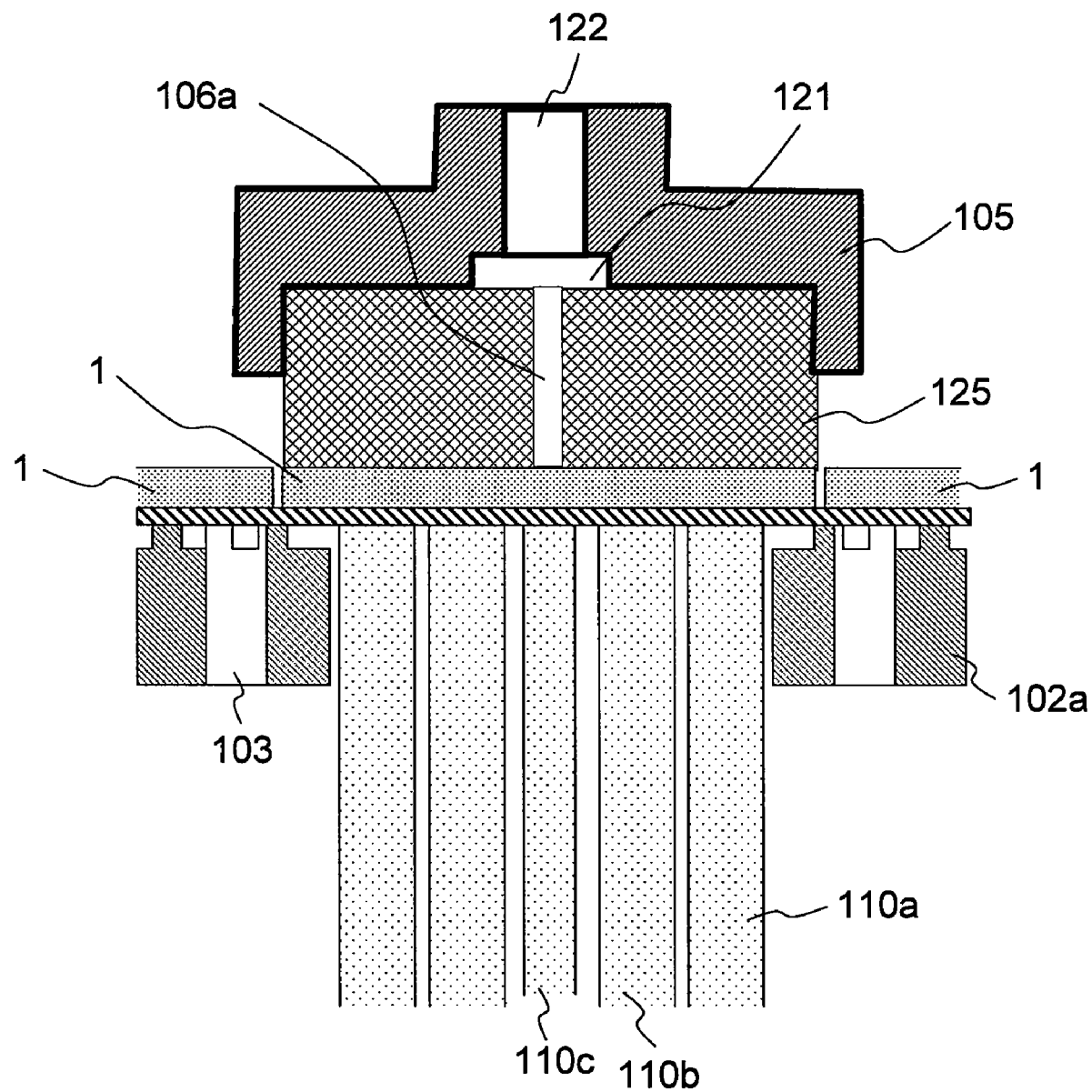
FIG. 38 is a sectional view explaining the state of the section taken on line B-B in FIG. 36.

FIG. 37 is a schematic sectional view taken on line A-A in FIG. 36 in a landed state of the collet 105 and FIG. 38 is a schematic sectional view taken on line B-B in FIG. 36.

Figure 31:
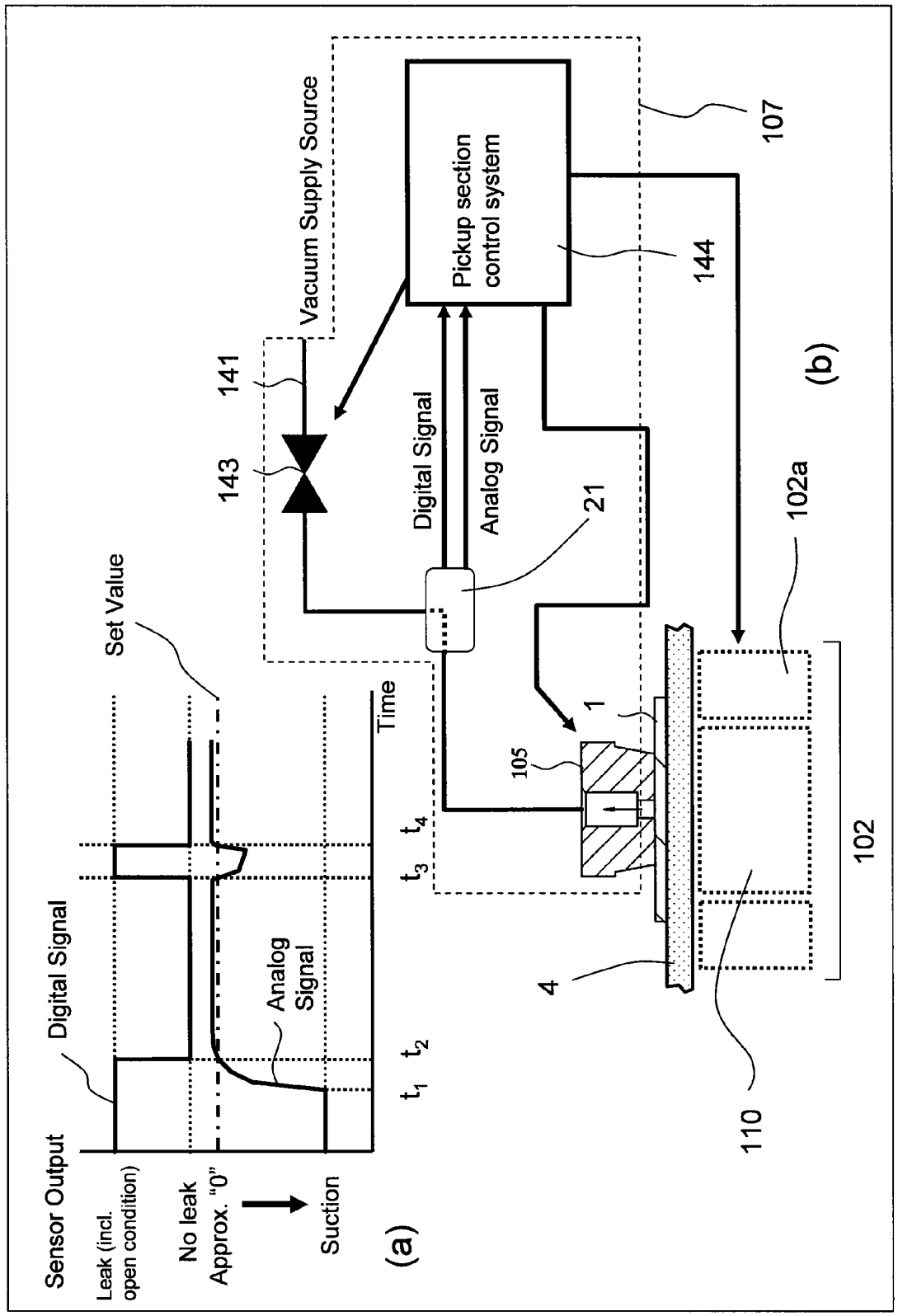
FIGS. 31(a) and 31(b) are explanatory diagrams for explaining the principle of the semiconductor chip peeling method.
Figure 46:
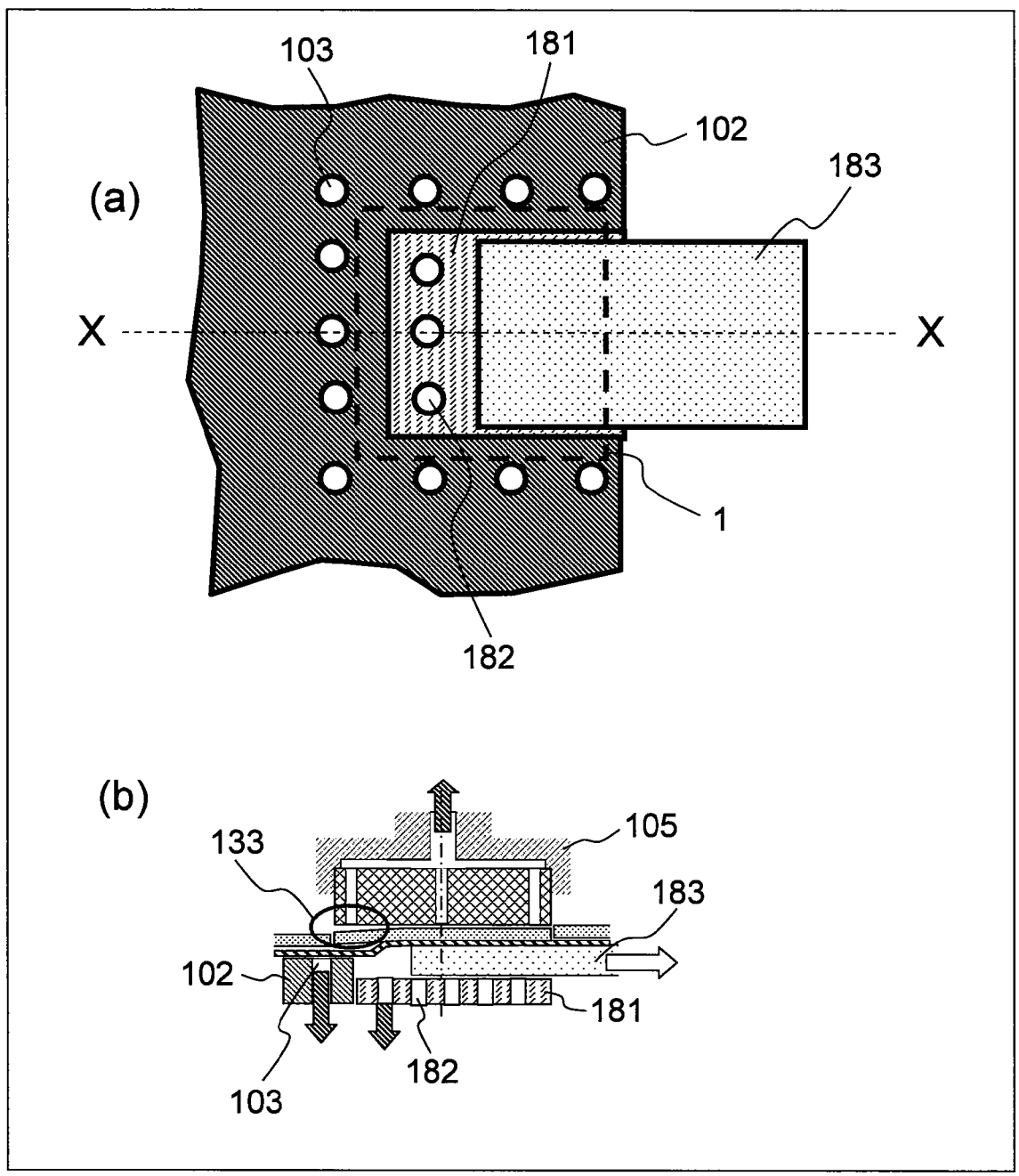
FIGS. 46(a) and 46(b) are top views of a principal portion of a peeling device for explaining the structure of the peeling device used in the peeling process 4 in the semiconductor integrated circuit device manufacturing method embodying the present invention.
Figure 47:
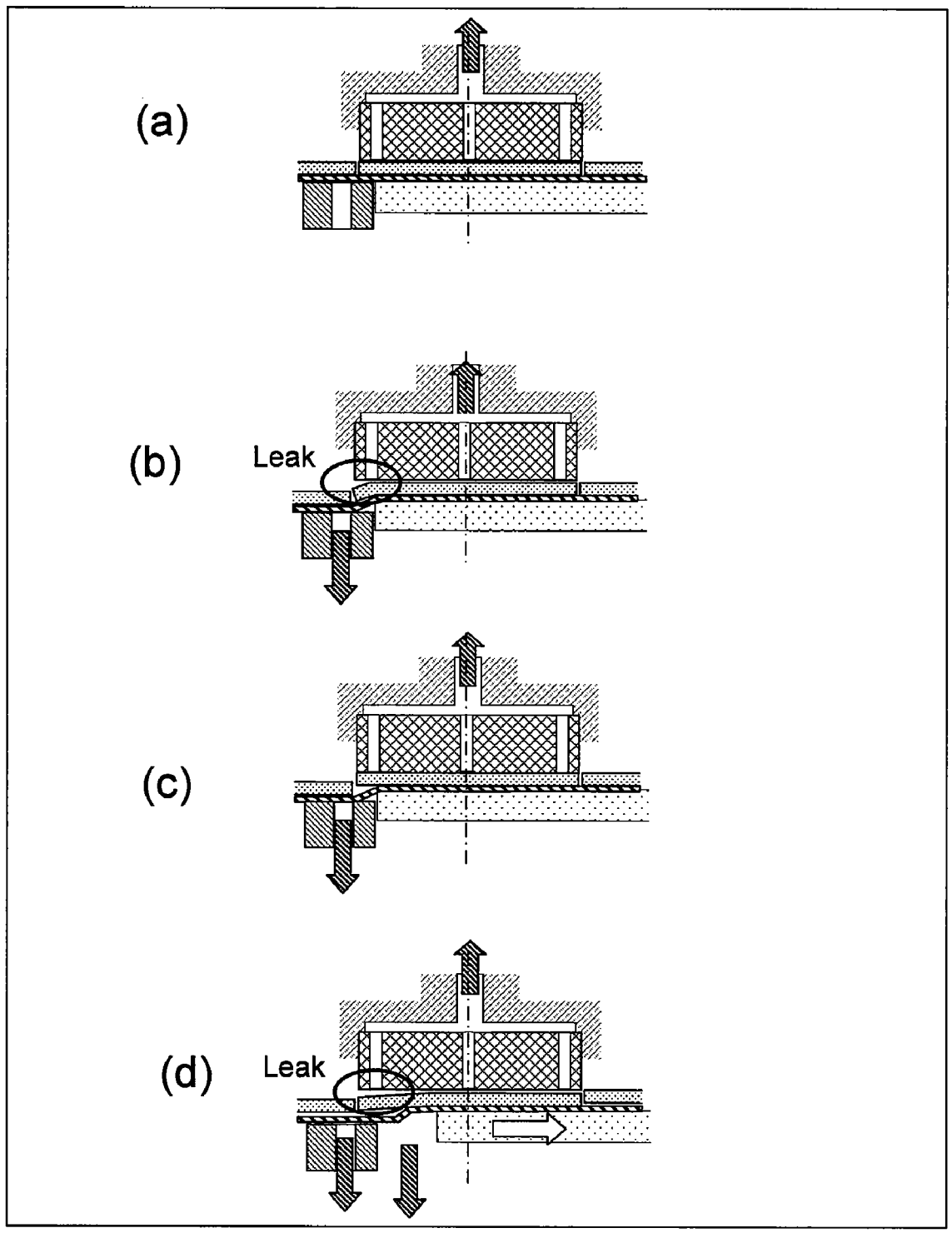
FIGS. 47(a) to 47(d) are flow diagrams in schematic section showing the peeling process 4 in the semiconductor integrated circuit device manufacturing method embodying the present invention.
Figure 48:
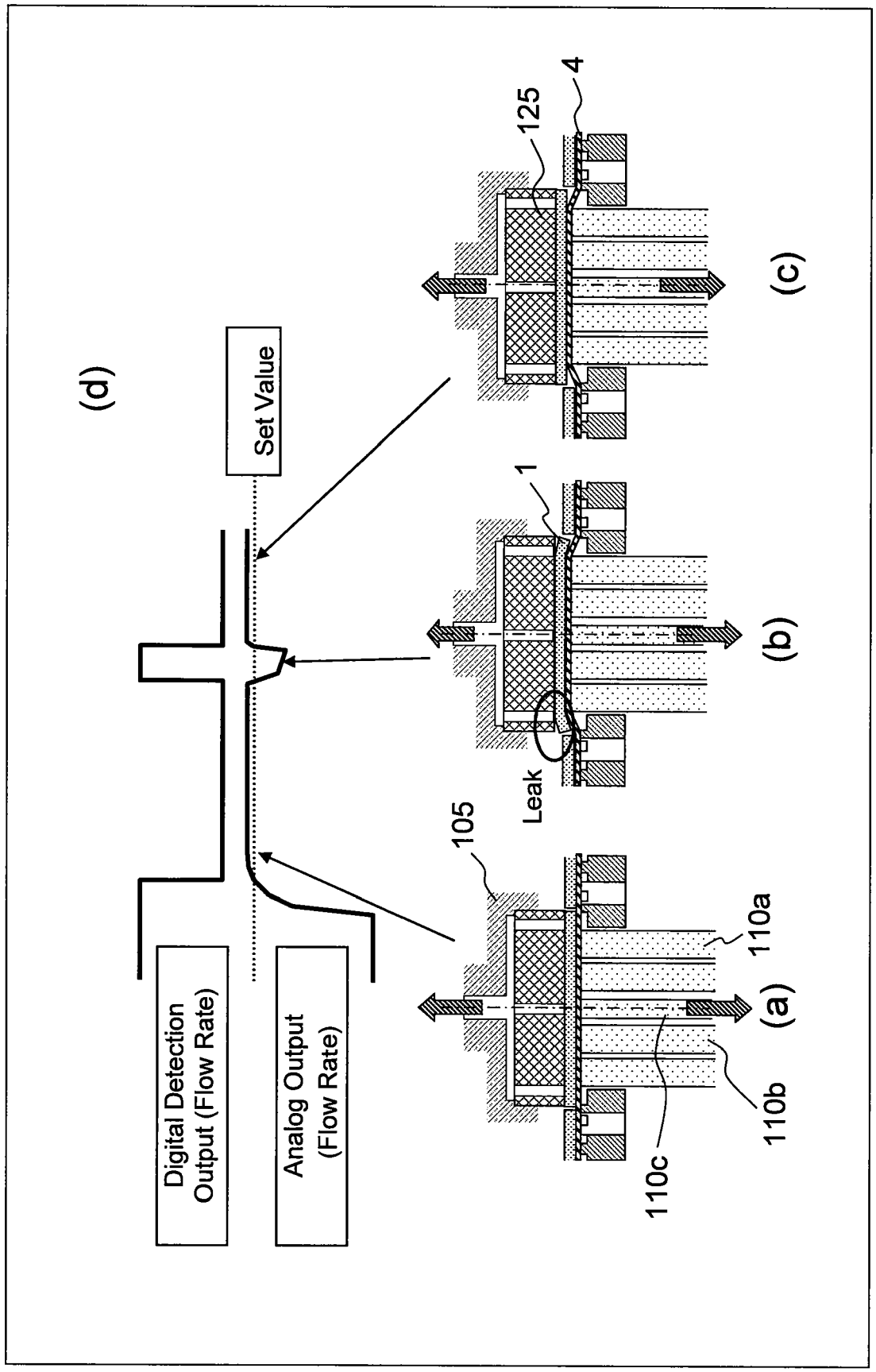
FIGS. 48(a) to 48(d) are flow diagrams in schematic section showing an automatic initial parameter setting method 1 in the semiconductor integrated circuit device manufacturing method embodying the present invention.
Figure 49:
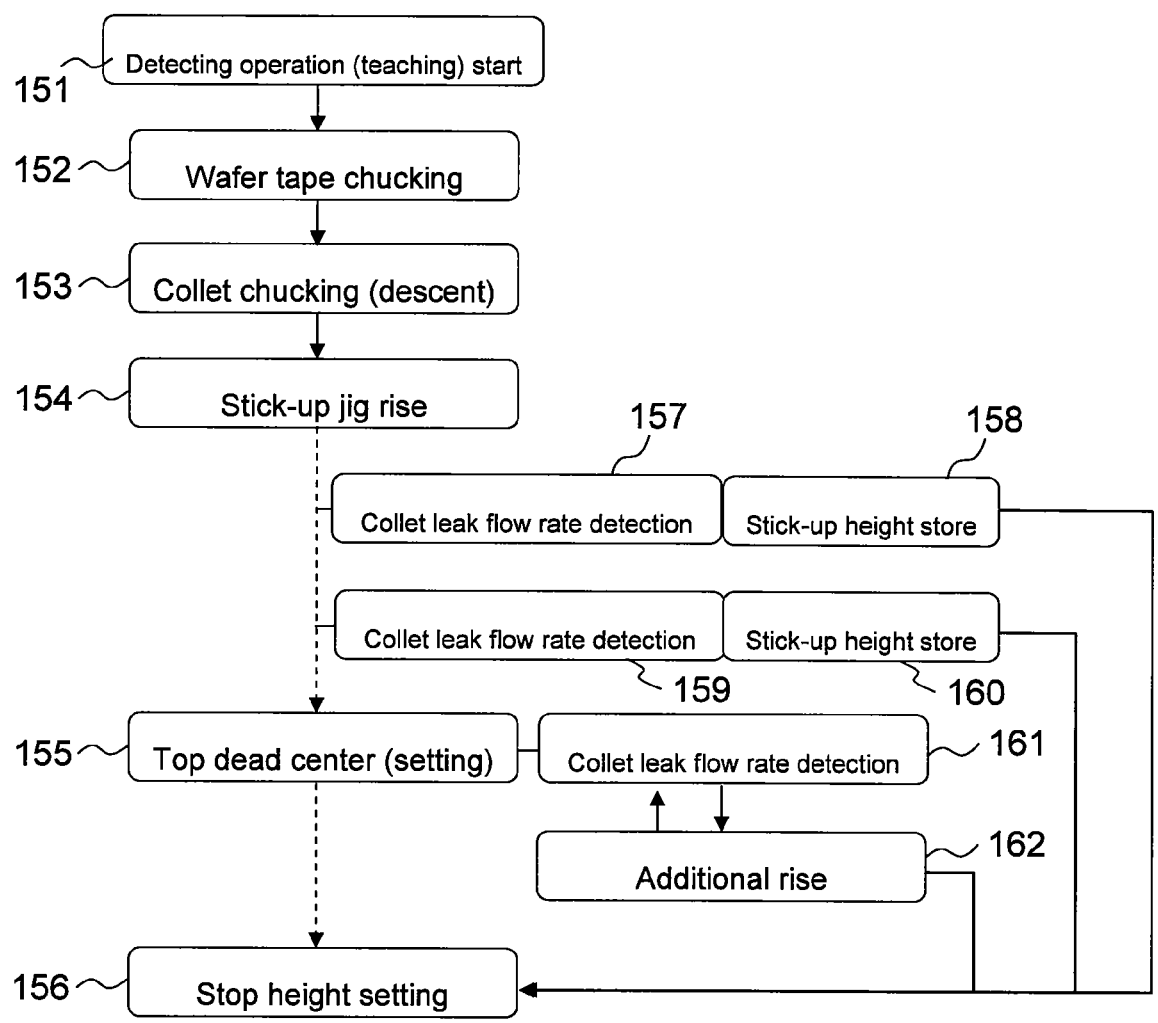
FIG. 49 is a process flow chart showing the automatic initial parameter setting method in the semiconductor integrated circuit device manufacturing method embodying the present invention.

The central hole 106a shown in FIGS. 31, 32 and 36 is not always essential. For example, in such a slide type peeling method as shown in FIG. 46, the presence of a central chucking hole is not specially important. In the case where there are a large number of suction holes as in FIG. 36, the presence of a central chucking hole is not always necessary. It can be substituted by a group of intermediate holes (e.g., 106t).

3. Details of Each Peeling Process (Mainly FIGS. 39 to 47)

The following peeling processes are applicable each alone or in combination of plural such processes by suitable selection to the entire process described above in section 1.

3-1. Stick-Up Block Stand-by/Retreat Process ("Peeling Process 1," FIGS. 39 to 40)

Figure 39:
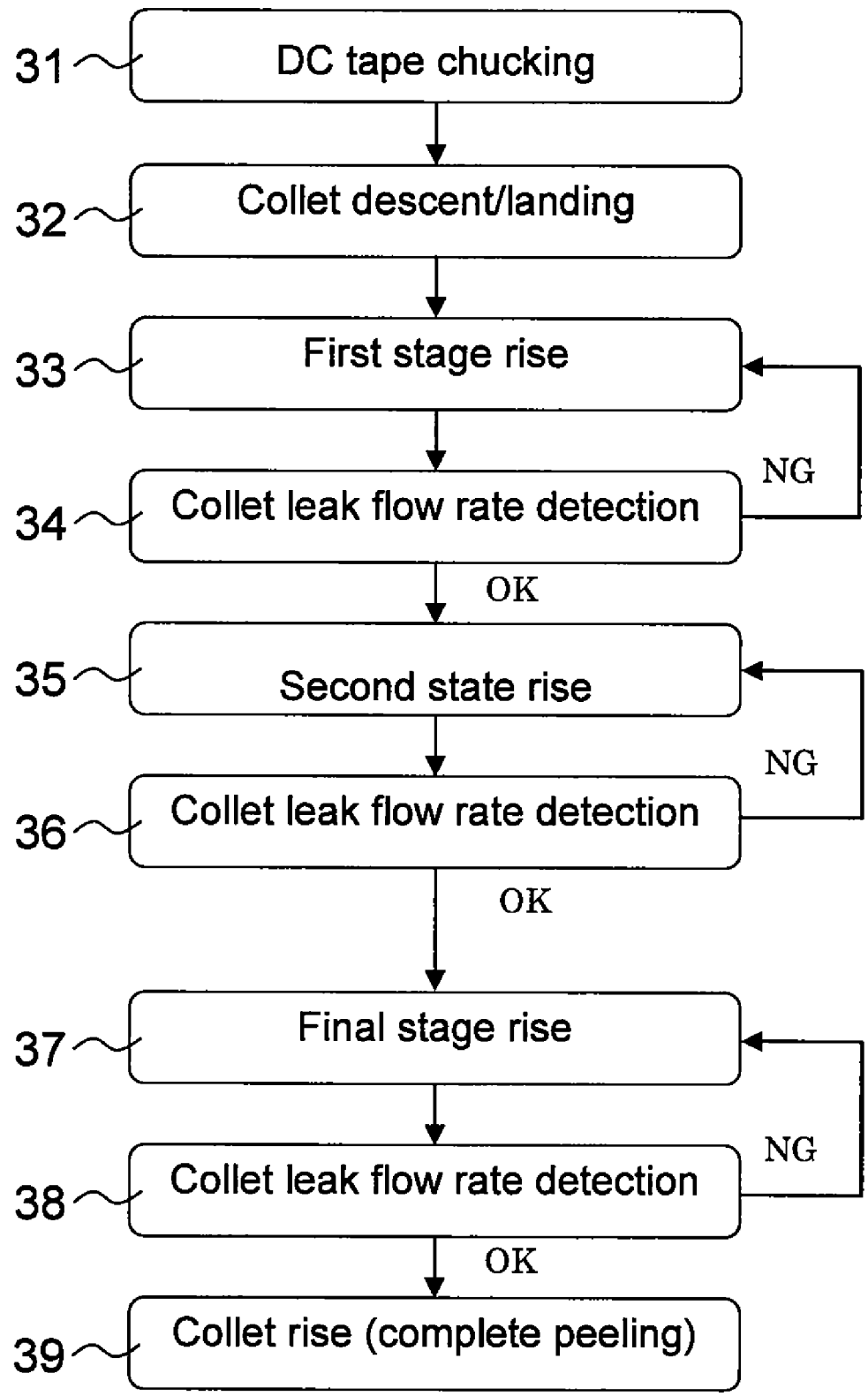
FIG. 39 is a process flow chart showing a peeling process 1 in the semiconductor integrated circuit device manufacturing method embodying the present invention.

FIG. 39 is a process flow chart showing concrete processing steps with respect to a method utilizing leak detection at the time of sticking up in order the sub-blocks 110a to 110c constituting the stick-up blocks 110 to peel the dicing tape 4. FIGS. 40(a) to 40(c) are sectional flow diagrams of a principal portion thereof. Concrete steps will now be described with reference to these figures. In the following description, for clear explanation, reference will be made first to an example involving leak and secondly to an example not involving leak for each elementary peeling process.

(1) The dicing tape 4 is vacuum-chucked to the upper surface of the lower base 102 (tape chucking step 31).

(2) The collet 105 lands onto the upper surface (generally the device surface although no limitation is made thereto) of the chip 1 while performing vacuum suction (collet chucking step 32). The landed state is shown in FIG. 40a.

(3) The stick-up blocks rise all together (first-stage rise step 33). The chip 1 and the collet 105 are also pushed up at the same time. At this time, the lower base peripheral portion 102a does not move, so that there acts a peeling tension for the dicing tape 4 located on the outer periphery of the chip 1. In this step, leak monitoring is started.

(4) Leak is detected (leak detecting step 34; see FIG. 40b). If there is no leak, the processing flow advances to step (9). The state of having detected leak 133 is shown in FIG. 40b.

(5) The block rising motion (3) is decelerated (including stop) for a predetermined time or until extinction of leak (see FIG. 40c). That is, this step is a "stand-by step." Also during this period, leak monitoring is performed continuously or intermittently. When leak becomes extinct, the processing flow advances to step (7). This step can be omitted if a shift is made from (4) to the following step (6). The omission may shorten the processing time. Generally, peeling from the adhesive tape is a rheological phenomenon. Even when peeling is difficult at high speed, it can be done easily in many cases if time is elapsed under the application of a weak tension. This is also true in the following examples. Thus, stop and stand-by, or deceleration and stand-by, is effective in many cases.

(6) The processing flow returns to the state before the start of step (3), or the processing (3) is retreated until extinction of leak by leak monitoring. That is, the stick-up blocks 110 are brought down all together. Thus, this step is a "retreat step." Tension is eased by chip bending and as a result there accrues effectiveness in the case where peeling does not proceed at all even with the lapse of time. This is also the case in the following examples. Upon return to the original state, the adhesive tape again adheres to the back surface of the chip. But it is generally considered that the tackiness in re-adhering is weaker than in the initial adhering. In the case of a UV curing type tape irradiated with UV, its tackiness in re-adhering is greatly decreased.

(7) The stick-up blocks 110 again rise all together (first-stage rise).

(8) It is detected that there is no leak. The leak-free state is shown in FIG. 40c. If "no leak" does not result even after repetition by a predetermined number of times, then by setting, the chip concerned is skipped, or the initial rise quantity is deceased so as not to cause leak, followed by re-execution, or alarm is indicated (or an alarm signal is transmitted to a host), followed by stop. One or plural of these measures are selected.

(9) The stick-up blocks 110b and 110c rise together (second-stage rise step 35). At this time, the stick-up block 110a and the lower base peripheral portion 102a do not move.

(10) There is leak (leak detecting step 36). If there is no leak, the processing flow advances to step (15).

(11) The rising motion (9) is decelerated (including stop) for a predetermined time or until extinction of leak. That is, this step is a "stand-by step." Leak monitoring is performed continuously or intermittently also during this period. Upon extinction of leak, the processing flow advances to step (13). This step can be omitted if a shift is made from step (10) to the following step (12). This omission may shorten the processing time.

(12) The processing flow returns to the state before the start of step (9), or the processing (9) is retreated until extinction of leak by leak monitoring. That is, the stick-up blocks 110b and 110c are brought down together.

(13) The second stage is raised again (second-stage re-rise)

(14) There is no leak. If "no leak" does not result even after repetition by a predetermined number of times, then by setting, the chip concerned is skipped, or the initial rise quantity is decreased so as not to cause leak, followed by re-execution, or alarm is displayed (or an alarm signal is transmitted to a host), followed by stop. One or plural of these measures are selected.

(15) The final stage, i.e., the stick-up block 110c, alone is raised (final-stage rise step 37). As a matter of course, the chip 1 and the collet 105 rise together with the stick-up block 110c.

(16) There is leak (leak detecting step 38). If there is no leak, the processing flow advances to step (21).

(17) The rising motion (15) is decelerated (including stop) for a predetermined time or until extinction of leak. That is, this step is a "stand-by step." Leak monitoring is performed continuously or intermittently also during this period. Upon extinction of leak, the processing flow advances to step (19). But this step can be omitted in case of a shift being made from step (16) to the following step (18). The omission may shorten the processing time.

(18) The processing flow returns to the state before the start of step (15), or the processing (15) is retreated until extinction of leak by leak monitoring. That is, the stick-up block 110c alone is brought down. As a matter of course, the chip 1 and the collet 105 descend together with the block 110c.

(19) The final stage is raised again (final-stage re-rise).

(20) There is no leak. If "no leak" does not result even after repetition by a predetermined number of times, then by setting, the chip concerned is skipped, or the initial rise quantity is decreased so as not to cause leak, followed by re-execution, or alarm is indicated (or an alarm signal is transmitted to a host), followed by stop. One or plural of these measures are selected.

(21) The collet rises to effect complete peeling (complete peeling step 39).

In step (1) and steps (2) to (21), vacuum suction for chucking is continued on the collet side and also on the lower base side. That is, an ON condition is maintained.

This peeling process is advantageous in that no matter what shape each chip has, it is possible to effect a stick-up motion corresponding to that shape.

3-2. Collet Stand-by/Retreat Process ("Peeling Process 2," FIGS. 41 to 42)

Figure 41:
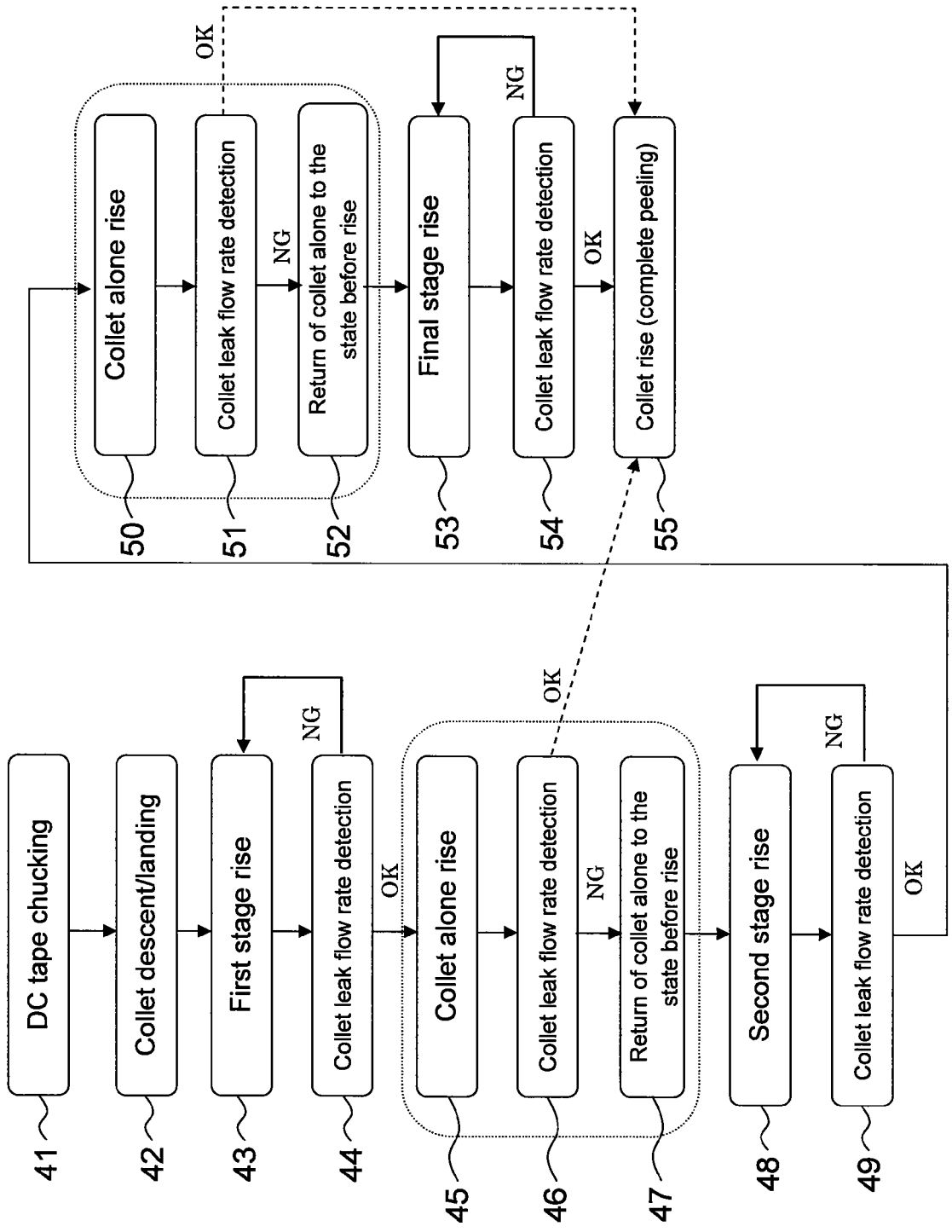
FIG. 41 is a process flow chart showing a peeling process 2 in the semiconductor integrated circuit device manufacturing method embodying the present invention.
Figure 42:
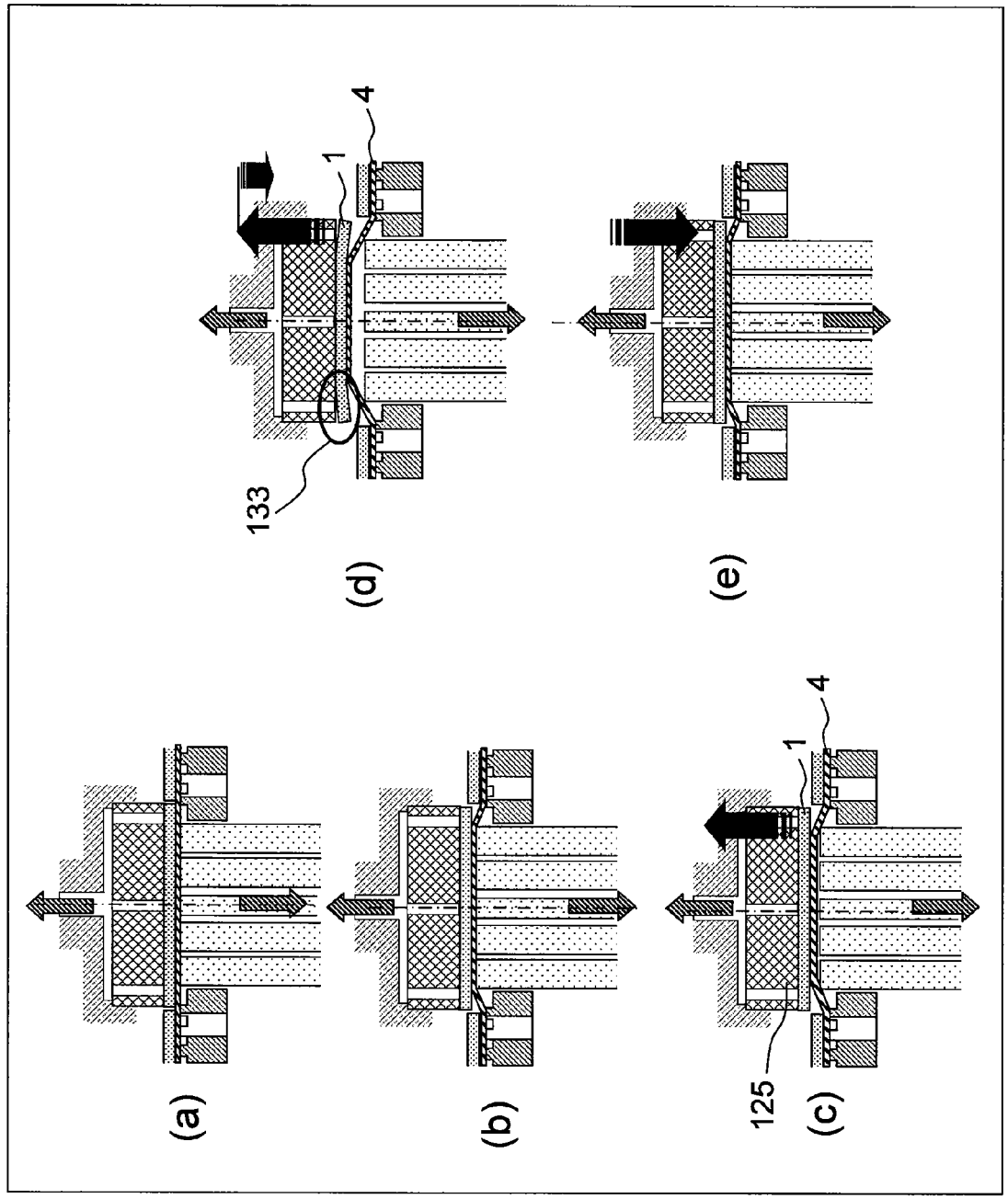

FIG. 41 is a process flow chart showing concrete processing steps with respect to a method which utilizes leak detection at the time of peeling the dicing tape 4 by repeating ascent and descent of mainly the collet 105. FIGS. 42(a) to 42(e) are sectional flow diagrams of a principal portion thereof. Concrete steps will be now described below with reference to these figures.

(1) The dicing tape 4 is vacuum-chucked to the upper surface of the lower base 102 (tape chucking step 41).

(2) The collet 105 lands onto the upper surface (generally the device surface although no limitation is made thereto) of the chip 1 while performing vacuum suction (collet chucking step 42). The landed state is shown in FIG. 42a.

(3) The stick-up blocks 110 rise all together (first-stage rise step 43; see FIG. 42b). The chip 1 and the collet 105 are also pushed up at the same time. At this time, the lower base peripheral portion 102a does not move, so that there acts a peeling tension for the dicing tape 4 located on the outer periphery of the chip 1. In this step, leak monitoring is started.

(4) Leak is detected (leak detecting step 44). If there is no leak, the processing flow advances to step (9).

(5) The block rising motion (3) is decelerated (including stop) for a predetermined time or until extinction of leak. That is, this step is a "stand-by step." Also during this period, leak monitoring is performed continuously or intermittently. When leak becomes extinct, the processing flow advances to step (7). This step can be omitted if a shift is made (4) to the following step (6). The omission may shorten the processing time.

(6) The processing flow returns to the state before the start of step (3), or the processing (3) is retreated until extinction of leak by leak monitoring. That is, the stick-up blocks 110 is brought down all together. Thus, this step is a "retreat step."

(7) The stick-up blocks 110 rise all together (first stage re-rising).

(8) It is detected that there is no leak. If "no leak" does not result even after repetition by a predetermined number of times, then by setting, the chip concerned is skipped or the initial rise quantity is decreased so as not to cause leak, followed by re-execution, or alarm is indicated (or an alarm signal is transmitted to a host), followed by stop. One or plural of these measures are selected.

(9) The collet 105 is raised in a vacuum-chucked state of the chip 1 (collet alone rise step; see FIGS. 42c and 42d).

(10) Leak is detected (leak detecting step 46). If there is no leak, peeling is performed completely.

(11) The rising motion (9) is decelerated (including stop) for a predetermined time or until extinction of leak. That is, this step is a "stand-by step." Also during this period, leak monitoring is performed continuously or intermittently. Upon extinction of leak, the processing flow advances to step (13). This step can be omitted if a shift is made from step (10) to the following step (12). The omission may shorten the processing time.

(12) The processing flow returns to the state before the start of step (9) (collet descent step 47; see FIG. 42e), or the processing (9) is retreated until extinction of leak by leak monitoring. That is, the collet 105 is brought down. Thus, this step is a "retreat step."

(13) The stick-up blocks 110b and 110c rise together (second-stage rise step 48). At this time, the stick-up block 110a and the lower base peripheral portion 102a do not move.

(14) There is leak (leak detecting step 49). If there is no leak, the processing flow advances to step (19).

(15) The rising motion (13) is decelerated (including stop) for a predetermined time or until extinction of leak. That is, this step is a "stand-by step." Also during this period, leak monitoring is performed continuously or intermittently. Upon extinction of leak, the processing flow advances to step (17). This step can be omitted if a shift is made from step (14) to the following step (16). The omission may shorten the processing time.

(16) The processing flow returns to the state before the start of step (13), or the processing (13) is retreated until extinction of leak by leak monitoring. That is, the stick-up blocks 110b and 110c are brought down together.

(17) The second stage is raised again (second-stage re-rising).

(18) There is no leak. If "no leak" does not result even after repletion by a predetermined number of times, the chip concerned is skipped, the initial rise quantity is decreased so as not to cause leak, followed by re-execution, or alarm is indicated (or an alarm signal is transmitted to a host), followed by stop. One or plural of these measures are selected.

(19) The collet 105 is raised in a vacuum-chucked state of the chip 1 (collet alone rise step).

(20) Leak is detected (leak detecting step 51). If there is no leak, peeling is performed completely.

(21) The rising motion (19) is decelerated (including stop) for a predetermined time or until extinction of leak. That is, this step is a "stand-by step." Also during this period, leak monitoring is performed continuously or intermittently. Upon extinction of leak, the processing flow advances to step (23). This step can be omitted if a shift is made from step (20) to the following step (22). The omission may shorten the processing time.

(22) The processing flow returns to the state before the start of step (19) (collet descent step 52), or the processing (19) is retreated until extinction of leak by leak monitoring. That is, the collet 105 is brought down. Thus, this step is a "retreat step."

(23) The final stage, i.e., the stick-up block 110c, alone is raised (final-stage rise step). As a matter of course, the chip 1 and the collet 105 rise together with the block 110c.

(24) There is leak (leak detecting step 54). If there is no leak, the processing flow advances to step (29).

(25) The rising motion 23) is decelerated (including stop) for a predetermined time or until extinction of leak. That is, this step is a "stand-by step." Also during this period, leak monitoring is performed continuously or intermittently. Upon extinction of leak, the processing flow advances to step (27). This step can be omitted if a shift is made from step (24) to the following step (26). The omission may shorten the processing time.

(26) The processing flow returns to the state before the start of step (23), or the processing (23) is retreated until extinction of leak by leak monitoring. That is, the stick-up block 110c alone is brought down. As a matter of course, the chip 1 and the collet 105 descend together with the block 110c.

(27) The final stage is raised again (final-stage re-rise).

(28) There is no leak. If "no leak" does not result even after repetition by a predetermined number of times, then by setting, the chip concerned is skipped, or the initial rise quantity is decreased so as not to cause leak, followed by re-execution, or alarm is indicated (or an alarm signal is transmitted to a host), followed by step. One of plural of these measures are selected.

(29) The collet rises to effect peeling completely (complete peeling step 55).

In step (1) and steps (2) to (29), vacuum suction for chucking is continued on the collet side and the lower base side. That is, an ON condition is maintained.

This peeling process is advantageous in that in case of peeling being easy, the execution of peeling can be done in a relatively simple manner mainly by only the motion of the collet.

3-3. Stick-Up Blocks Alone Descent Peeling Process ("Peeling Process 3," FIGS. 43 to 44)

Figure 43:
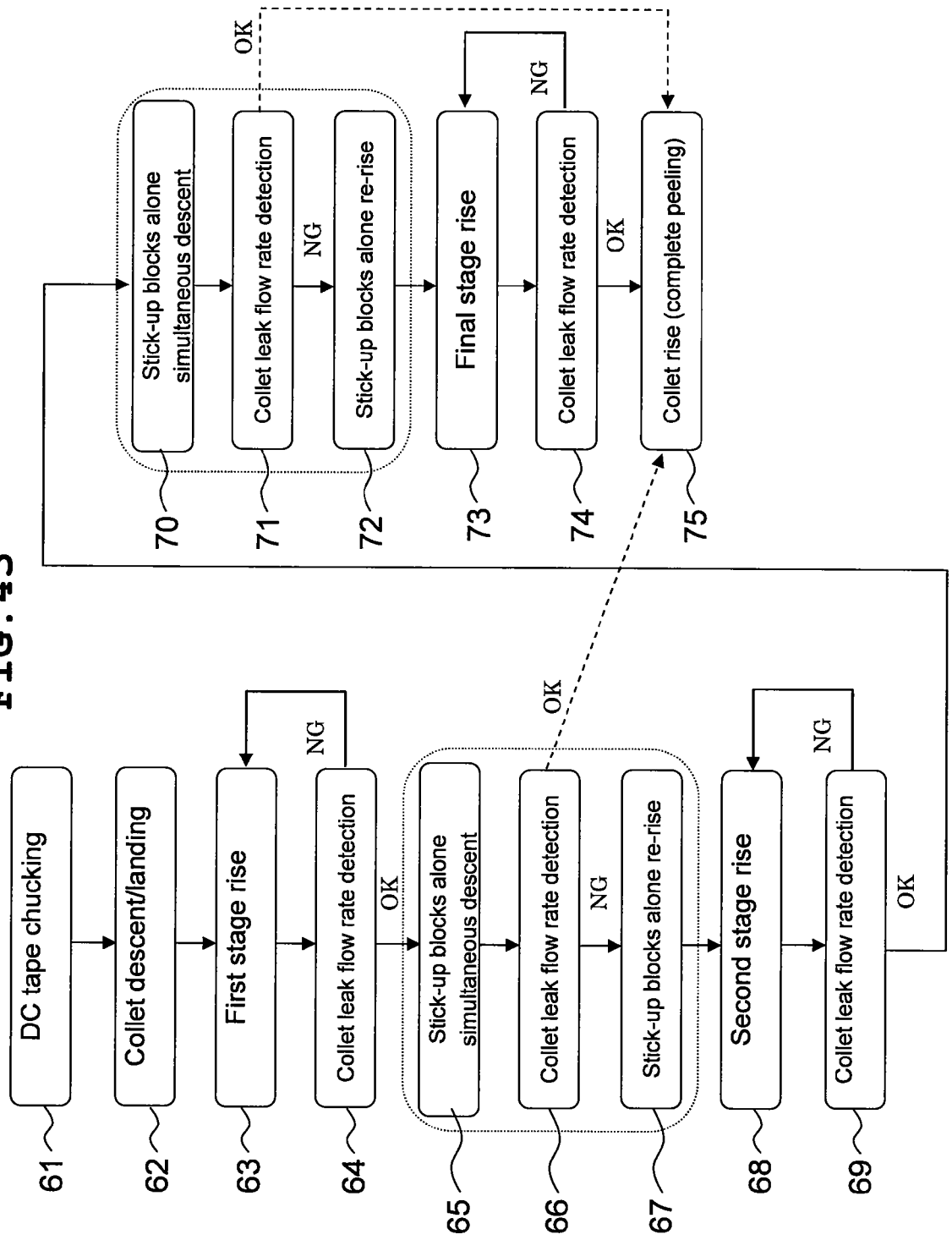
FIG. 43 is a process flow chart showing a peeling process 3 in the semiconductor integrated circuit device manufacturing method embodying the present invention.
Figure 44:
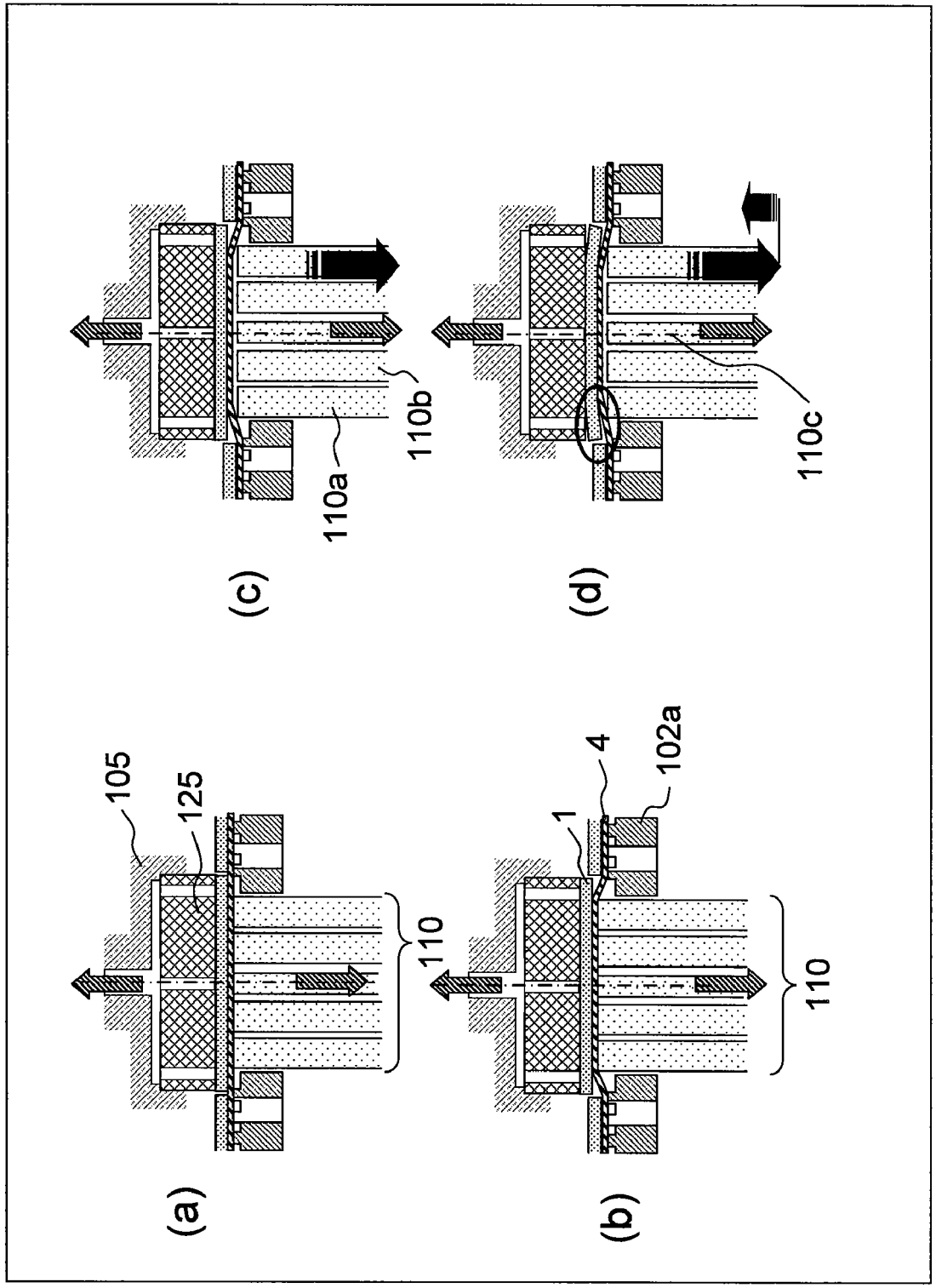
FIGS. 44(a) to 44(d) are flow diagrams in schematic section showing a peeling process 3 in the semiconductor integrated circuit device manufacturing method embodying the present invention.

FIG. 43 shows a process in which peeling is allowed to proceed by once rise of the stick-up blocks 110 and subsequent descent of the stick-up blocks alone in a chucked state of the chip 1 by the collet 105. FIGS. 44(a) to 44(d) are sectional flow diagrams of a principal portion thereof. Concrete steps will be described below with reference to these figures.

(1) The dicing step 4 is vacuum-chucked to the upper surface of the lower base 102 (tape chucking step 61).

(2) The collet 105 lands onto the upper surface (generally the device surface although no limitation is made thereto) of the chip 1 while performing vacuum suction (collet landing step 62). The landed state is shown in FIG. 44*a*.

(3) The stick-up blocks 110 rise all together (first-stage rise step 63; see FIG. 44*b*). The chip 1 and the collet 105 are also pushed up together with the blocks 110. At this time, the lower base peripheral portion does not move, so that there acts a peeling tension for the dicing tape 4 located on the outer periphery of the chip 1. In this step, leak monitoring is started.

(4) Leak is detected (leak detecting step 64). If there is no leak, the processing flow advances to step (9).

(5) The rising motion (3) is decelerated (including stop) for a predetermined time or until extinction of leak. That is, this step is a "stand-by step." Also during this period, leak monitoring is performed continuously or intermittently. Upon extinction of leak, the processing flow advances to step (7). This step can be omitted if a shift is made from step (4) to the following step (6). The omission may shorten the processing time.

(6) The processing flow returns to the state before the start of step (3), or the processing (3) is retreated until extinction of leak by leak monitoring. That is, the stick-up blocks 110 are brought down all together. Thus, this step is a "retreat step."

(7) The stick-up blocks 110 rise again all together (first-stage re-rise).

(8) It is detected that there is no leak. If "no leak" does not result even after repletion by a predetermined number of times, then by setting, the chip concerned is skipped, or the initial rise quantity is decreased so as not to cause leak, followed by re-execution, or alarm is indicated or an alarm signal is transmitted to a host), followed by stop. One or plural of these measures are selected.

(9) The stick-up blocks 110 alone are brought down in a vacuum-chucked state of the chip 1 by the collet 105 (simultaneous stick-up blocks descent step 65; see FIG. 44*c*)

(10) Leak is detected (leak detecting step 46). If there is no leak, the processing flow advances to step (13).

(11) The descending motion (9) is decelerated (including stop) for a predetermined time or until extinction of leak. That is, this step is a "stand-by step." Also during this period, leak monitoring is performed continuously or intermittently. Upon extinction of leak, the processing flow advances to step (13). However, this step can be omitted if a shift is made from step

(10) to the following step (12). The omission may shorten the processing time.

(12) The processing flow returns to the state before the start of step (9) (stick-up block re-rise step 67; see FIG. 44*d*), or the processing (9) is retreated until extinction of leak by leak monitoring. That is, only the stick-up blocks 110 are brought down. Thus, this step is a "retreat step."

(13) The stick-up blocks 110*b* and 110*c* rise together (second-stage rise step 68). At this time, the stick-up block 110*a* and the lower base peripheral portion 102*a* do not move.

(14) There is leak (leak detecting step 69). If there is no leak, the processing flow advances to step (19).

(15) The rising motion (13) is decelerated (including stop) for a predetermined time or until extinction of leak. That is, this step is a "stand-by step." Also during this period, leak monitoring is performed continuously or intermittently. Upon extinction of leak, the processing flow advances to step (17). However, this step can be omitted if a shift is made from step

(14) the following step 16). The omission may shorten the processing time.

(16) The processing flow returns to the state before the start of step (13), or the processing (13) is retreated until extinction of leak by leak monitoring. That is, the stick-up blocks 110*b* and 110*c* are brought down together.

(17) Only the stick-up blocks 110*b* and 110*c* are brought down in a vacuum-chucked state of the chip 1 by the collet 105 (simultaneous stick-up blocks descent step 70).

(18) Leak is detected (leak detecting step 71). If there is no leak, the processing flow advances to step (21).

(19) The descending motion (17) is decelerated (including stop) for a predetermined time or until extinction of leak. That is, this step is a "stand-by step." Also during this period, leak monitoring is performed continuously or intermittently. Upon extinction of leak, the processing flow advances to step (21). This step can be omitted if a shift is made from step (18) to the following step (20). The omission may shorten the processing time.

(20) The processing flow returns to the state before the start of step (17) (stick-up block re-rise step 72), or the processing (17) is retreated until extinction of leak by leak monitoring. That is, only the stick-up blocks 110*b* and 110*c* are brought down. Thus, this step is a "retreat step."

(21) The final stage, i.e., the stick-up block 110*c*, alone is raised (final-stage rise step 73). As a matter of course, the chip 1 and the collet 105 rise together with the block 110*c*.

(22) There is leak (leak detecting step 74). If there is no leak, the processing flow advances to step (27).

(23) The rising motion (21) is decelerated (including stop) for a predetermined time or until extinction of leak. That is, this step is a "stand-by step." Also during this period, leak monitoring is performed continuously or intermittently. Upon extinction of leak, the processing flow advances to step (27). However, this step can be omitted if a shift is made from step (22) to the following step (24). The omission may shorten the processing time.

(24) The processing flow returns to the state before the start of step (21), or the processing (21) is retreated until extinction of leak by leak monitoring. That is, the stick-up block 110*c* is brought down together with the other blocks. As a matter of course, the chip land the collet 105 descend together with the blocks.

(25) The final stage is raised again (final-stage re-rise).

(26) There is no leak. If "no leak" does not result even after repetition by a predetermined number of times, then by setting, the chip concerned is skipped or the initial rise quantity is decreased so as not to cause leak, followed by re-execution, or alarm is indicated (or an alarm signal is transmitted to a host), followed by stop. One or plural of these measures are selected.

(27) The collet rises to effect peeling completely (complete peeling step 75).

In step (1) and steps (2) to (27), vacuum suction for chucking is continued on the collet side and the lower base side. That is, an ON condition is maintained.

This peeling process is advantageous in that a total stroke of the stick-up blocks can be shortened.

3-4. Slide Peeling Process ("Peeling Process 4," FIGS. 45 to 47)

Figure 45:
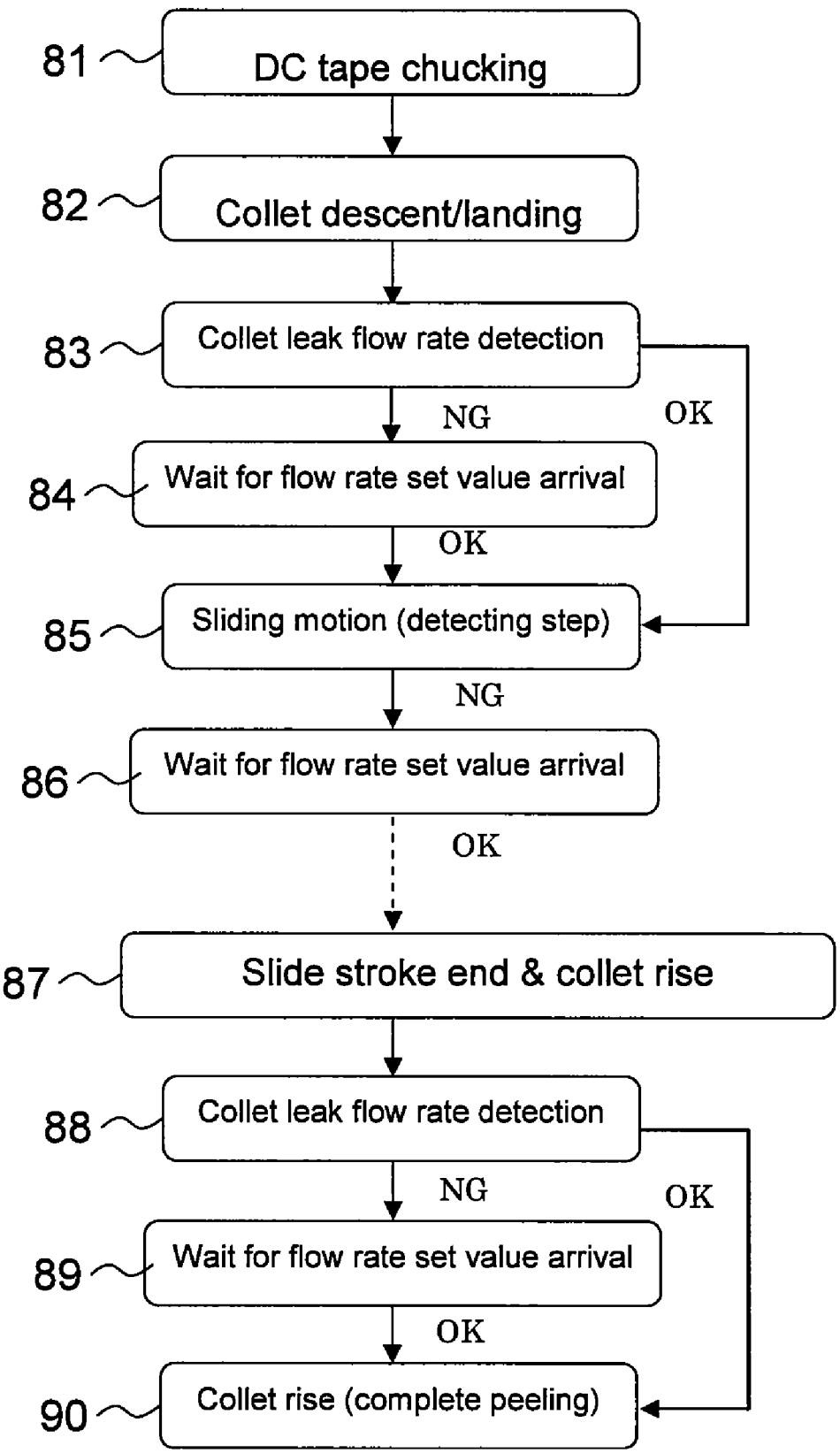
FIG. 45 is a process flow chart showing a peeling process 4 in the semiconductor integrated circuit device manufacturing method embodying the present invention.

In the peeling device described above up to the preceding section, the stick-up blocks 110 underlie the chip 1, but in another device, as shown in FIG. 46*b*, the stick-up blocks 110 are substituted by a slide plate 183. The slide plate 183 is adapted to slide in the horizontal direction to effect peeling. The structure of this peeling device will now be described with reference to the same figure. FIG. 46*a* is a top view of the peeling device as viewed from the chip 1 concerned side. A chucking piece 102 is formed with a recess 181 for receiving therein the slide plate 183. Vacuum suction holes 182 are formed in a bottom of the recess 181. As in the previous peeling device, vacuum suction holes 103 are formed in the chucking piece 102 at positions outside the recess 181. FIG. 45 is a process flow chart showing concrete steps in a method which utilizes leak detection when peeling the dicing tape 4 by this peeling device. FIGS. 47(a) to 47(d) are sectional flow diagrams of a principal portion thereof. Concrete steps will be described below with reference to FIGS. 45 to 47.

(1) The dicing tape 4 is vacuum-chucked to the upper surface of the lower base 102 (tape chucking step 81).

(2) The collet 105 lands onto the upper surface (generally the device surface although no limitation is made thereto) of the chip 1 while performing vacuum suction. The landed state is shown in FIG. 47a.

(3) Collet leak is detected (lead detecting step 83; FIG. 47b).

(4) Stand by (flow rate set value arrival waiting step 84; FIG. 47c). When the amount of leak reaches an allowable range, the processing flow advances to the next step.

(5) The slide plate 183 is started to slide in a direction to decrease overlap with the chip 1 (slide step 85; FIG. 47d). The sliding motion is continued until collet leak is detected.

(6) Leak is detected.

(7) The sliding speed is decreased (or stopped, the wait) until the amount of leak reaches the allowable range. That is, this step is a stand-by step 86.

(8) It is detected that there is no leak.

(9) Sliding motion is resumed. A slid stroke end is reached and the collet begins o rise (slide end & collet rise step 87).

(10) Leak is detected (leak detecting step 88).

(11) The collet rising speed is decreased (or stopped, then wait) until the amount of leak reaches the allowable range. That is, this step is a stand-by step 89.

(12) It is detected that there is no leak.

(13) The collet rises to effect peeling completely (complete peeling step 90).

This peeling process is advantageous in that it can be carried out with a relatively simple step construction.

4. Details of Teaching Processes (Mainly FIGS. 48 to 50 and FIG. 31)

The following teaching processes are applicable each alone selectively or in combination of plural of them to the various peeling processes described above in section 3, various collet structures described above in section 2 and the entire process described above in section 1.

The following teaching processes can be carried out using any of good product chip, bad product chip, or non-product chip (a chip having on the upper side thereof the same shape as surrounding products, with patterns not formed completely). Even by pseudo-pick-up (a pick-up not causing complete peeling) using a product chip, a return is made to the original state if complete peeling is not performed. Thus, although there is a certain risk in point of product reliability, there arises no serious problem.

4-1. Stick-Up Block Motion Teaching ("Teaching Method 1," FIGS. 48 to 49 and FIG. 31)

FIGS. 48(a) to 48(d) are explanatory diagrams for explaining leak detection and automatic acquisition of process parameters using leak detection, i.e., the principle of teaching process. FIGS. 48(a), (b) and (c) are sectional flow diagrams of a principal portion thereof and FIG. 48(d) is a timing diagram showing a relation to the principle of leak detection described above in connection with FIG. 31. Concrete steps will be described below with reference to these figures.

(1) Alignment is made so that the chip 1 to be detected for leak is positioned centrally of both chucking piece (lower base) 102 and chucking collet 105. Flow rate detection turns ON at this stage (detecting operation start step, i.e., teaching start step 151).

(2) The dicing tape 4 is vacuum-chucked to the upper surface of the lower base 102 (tape chucking sep 152).

(3) The collet 105 lands onto the upper surface (generally the device surface although no limitation is made thereto) while performing vacuum suction (collet landing step 153). The landed state is shown in FIG. 48a.

(4) All the stick-up blocks (stick-up jigs) rise at a very low speed (initial speed) so that their upper surfaces are flush with one another (stick-up block rise step 154).

(5) Leak is detected (leak detecting step 157). The stick-up height ("leak detection starting height") is stored.

(6) All the stick-up blocks descend at a very low speed (initial speed) until an allowable range of leak in such a manner that their upper surfaces are flush with one another. The height of the blocks ("leak detection end height") is stored. This stored as a "provisional first-stage rise height" (stick-up height storage step 158).

(7) Only the stick-up blocks (stick-up jigs) 110b and 110c out of the stick-up blocks rise at a very low speed (initial speed) so that their upper surfaces are flush with each other (second-stage stick-up block rise step).

(8) Leak is detected (lead detecting step 159). The stick-up height ("leak detection starting height") is stored.

(9) Only the stick-up blocks (stick-up jigs) 110b and 110c out of the stick-up blocks descend until a leak allowable range at a very low speed (initial speed) in such a manner that their upper surfaces are flush with each other. The height of the blocks ("leak detection end height") is stored. This is stored as a "provisional second-stage rise height" (stick-up height storage step 160).

(10) Only the stick-up block (stick-up jig) 110c out of the stick-up blocks rises at a very low speed (initial speed) (three-stage stick-up block rise step).

(11) Leak is detected. The stick-up height of the blocks ("leak detection starting height") is stored.

(12) Only the stick-up block (stick-up jig) 110c out of the stick-up blocks descends until a leak allowable range at a very low speed (initial speed) while keeping its upper surface level. Its height ("leak detection end height") is stored. This is stored as a "provisional third-stage rise height").

(13) Whether there is no leak at the "provisional third-stage rise height" (leak detecting step 161) is checked by additional rise (additional rise 162) of only the stick-up block (stick-up jig) 110c.

(14) Then, a "set provisional third-stage rise height" corresponding to a final absence of leak, i.e., "top dead center" (third-stage rise height set value), is stored (top dead center setting step 155).

(15) "Provisional first-stage rise height," "provisional second-stage rise height" and "set provisional third-stage rise height" are set as stop heights (stop height setting step 156).

(16) Next, any of the pick-up operations in corresponding section 3 is carried out at the stop heights set in step (15). The rise speed is gradually increased or decreased each time and an optimum speed is stored, then a change is made thereto. This can be done also with a non-product chip, but it is effective to perform this operation while performing pick-up of a product chip.

4-2. Slide Motion Teaching ("Teaching Method 2," FIGS. 46 to 47 and FIG. 50)

Figure 50:
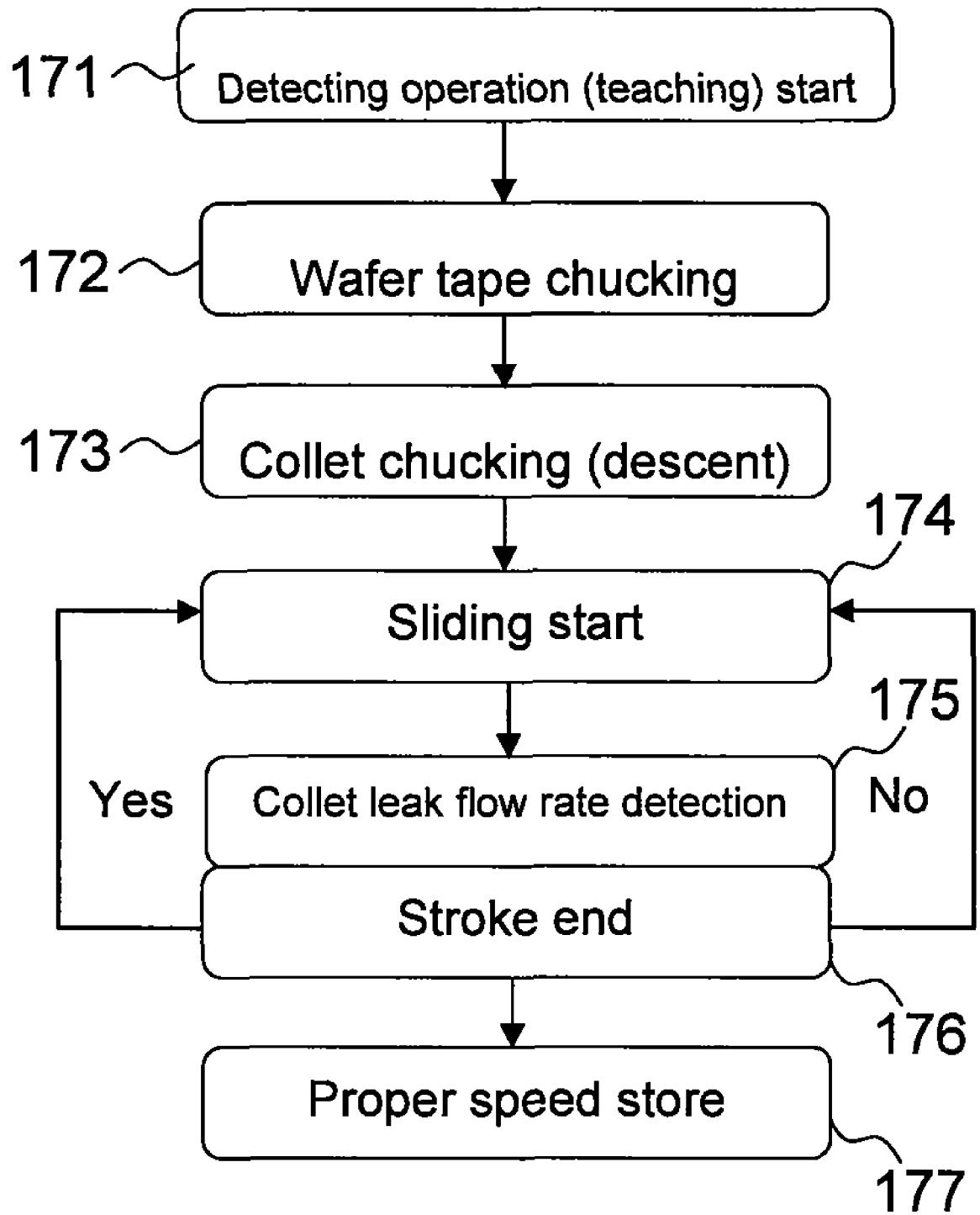
FIG. 50 is a process flow chart showing an automatic initial parameter setting method 2 in the semiconductor integrated circuit device manufacturing method embodying the present invention.

Here a description will be given about a teaching method of the sliding speed in the device configuration described above in section 3-4. FIG. 50 is a process flow chart thereof. Concrete steps will be described below with reference to FIGS. 46 to 47 and FIG. 50.

(1) Alignment is made so that the chip 1 concerned is positioned centrally of both chucking piece (lower base) 102 and chucking collet 105. Flow rate detection turns ON at this stage (detecting operation start step, i.e., teaching start step 171).

(2) The dicing tape 4 is vacuum-chucked onto the upper surface of the lower base 102. (tape chucking step 172).

(3) The collet 105 lands onto the upper surface (generally the device surface although no limitation is made thereto) of the chip 1 while performing vacuum suction (collet landing step 173).

(4) Sliding motion is started for the first chip at a very low speed (initial speed) (slide starting step 174). The sliding motion is performed up to a stroke end if there is no leak (stroke end step 176). In the case of a product chip, the sliding motion proceeds up to the completion of peeling. The sliding speed in that sliding motion is stored.

(5) Sliding motion is started for the second chip at a little higher speed. The sliding motion is performed until a stroke end if there is no leak. In the case of a product chip, the sliding motion proceeds up to the completion of peeling. The sliding speed in that sliding motion is stored.

(6) This is repeated and leak is detected at the nth chip (leak detecting step 175).

(7) The sliding speed for the $n^{th}$ chip is stored.

(8) Stand-by until the leak reaches an allowable range thereof.

(9) Sliding motion is resumed and the processing flow returns to step (8) upon detection of leak, while if there is no leak, the processing flow advances to the next step.

(10) Sliding up to a stroke end. In case of selecting or calculating an optimum speed from the speeds stored in (7) or before (7) in accordance with a predetermined rule, the subsequent step is unnecessary.

(11) Where required, the speed is further increased and the steps (6) to (10) are repeated, then an optimum speed is set from data obtained therein and is stored (optimum speed storing step 177).

5. Suitable Combinations of Peeling Processes and Features Thereof

The peeling processes in section 3 have been described in a classified manner into types with respect to typical examples, but actually if a suitable one is selected or if they are mutually combined suitably, followed by execution thereof, it is possible to expect improvement of pick-up efficiency or of product reliability. For example, if the collet rise segments (steps 45 to 47 or 50 to 52 in FIG. 41), i.e., a collection of steps, in section 3-2 are applied after step 67 in the peeling process 3 or applied in parallel with an appropriate step in the peeling process 4, it is effective in shortening the pick-up time.

6. Chip Conveyance, Physical Chucking Landing, and Die Bonding Process (see Mainly FIGS. 51 to 60)

Generally, the processing from chip peeling up to completion of landing onto the wiring substrate is carried out while vacuum-chucking the chip to the collet. According to this method, however, in the case of a thin-film chip (especially a chip not larger than 100 μm in thickness), the chip lands while being locally deformed by vacuum chucking (it is preferable to make reference to FIGS. 54 to 56 for chip strain caused by vacuum chucking) and is bonded and fixed onto the substrate. Therefore, voids and strains are apt to remain after bonding. This tendency is conspicuous particularly in the method wherein an adhesive layer (using DAF) is formed beforehand on the back surface of the chip. In the case where the chip is chucked in a state in which the device surface, i.e., the chip surface (a main surface opposite to the back surface) on which main components such as transistors and multi-layer wiring are formed, faces upward (a so-called face-up product), it is important also from the standpoint of device reliability that bonding be done without leaving voids, strains or deformations. Generally, voids present in the peripheral portion are extinguished in the molding process, but those present in the central portion are not extinguished.

In this section, for solving the above-mentioned problems, a description will be given about the case where a method of turning OFF the vacuum chucking in an early stage is applied to the landing portion onto the wiring substrate or to the environs thereof in a bonding process described in another section. By turning OFF the vacuum chucking it is meant, unless other mentioned and except the case where a negative answer is evident contextually, that vacuum chucking is completely OFF and the chip is chucked by only physical chucking (in a state in which the three-way change-over valve 143 switches over from one position to another in accordance with a command provided from the pick-up section control system 144 shown in FIG. 31, whereby the vacuum suction system of the chucking collet is decoupled from the vacuum supply source and is opened to the atmosphere). This is also the case with other sections. The landing technique in this section is an alternative or detailed process of the portion concerned in any of the processes described in other sections. It goes without saying that the landing technique in question is not essential for the processes described in other sections.

Figure 51:
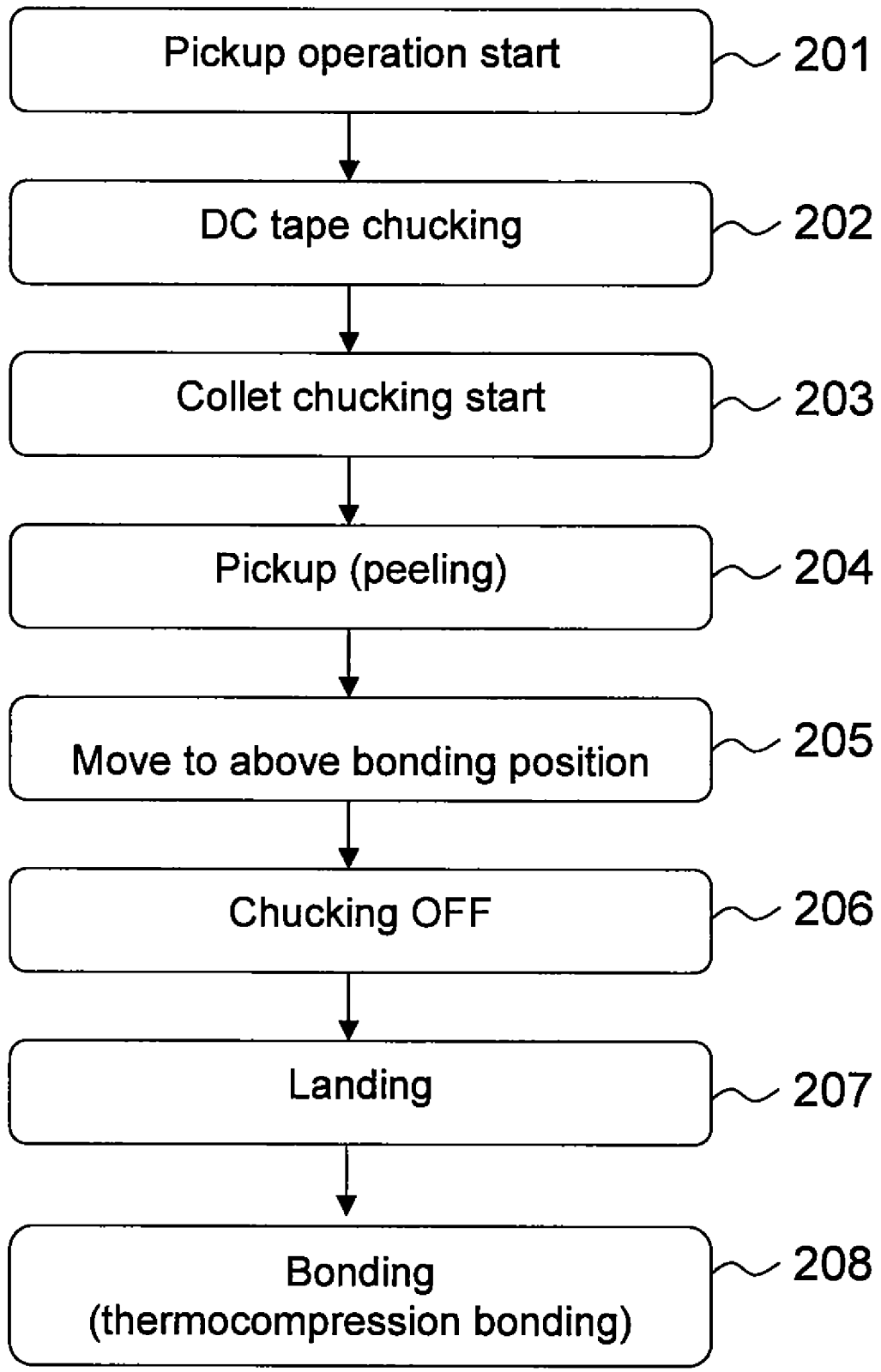
FIG. 51 is a step flow chart explaining a die bonding procedure in the semiconductor integrated circuit device manufacturing method embodying the present invention.
Figure 57:
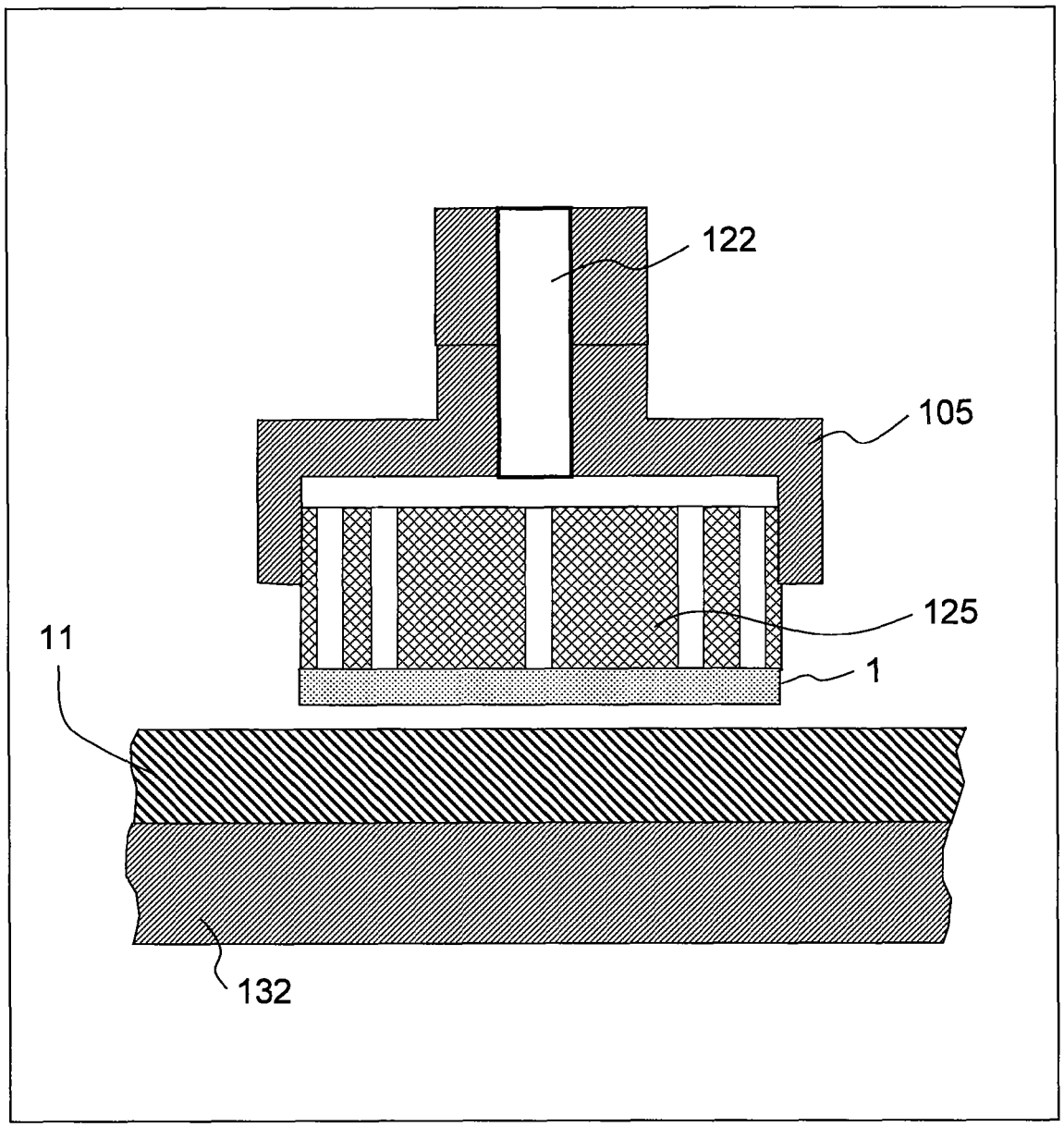
FIG. 57 is a flow diagram 5 in schematic section explaining the die bonding procedure in the semiconductor integrated circuit device manufacturing method embodying the present invention.
Figure 58:
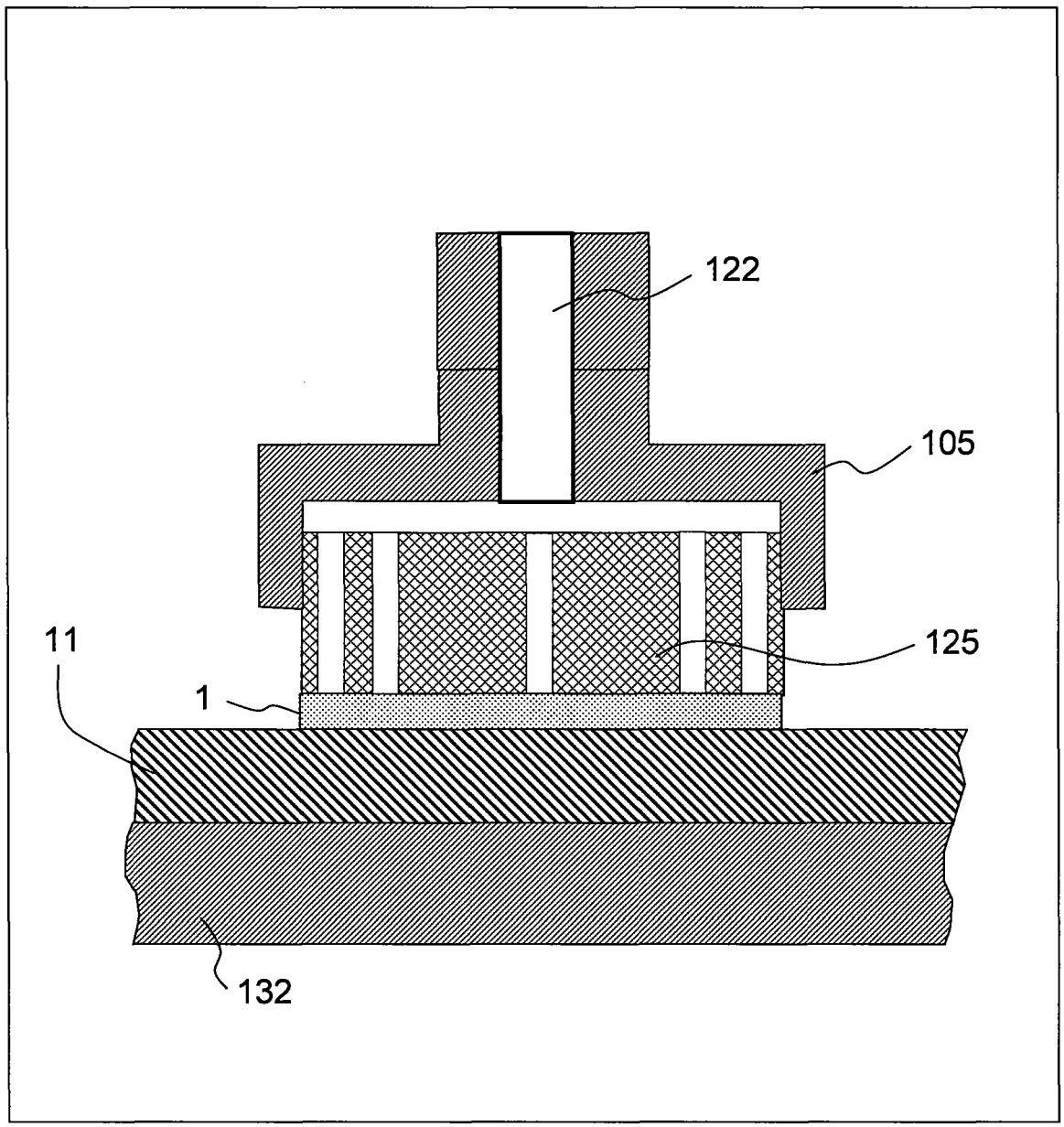
FIG. 58 is a flow diagram 6 in schematic section explaining the die bonding procedure in the semiconductor integrated circuit device embodying the present invention.
Figure 59:
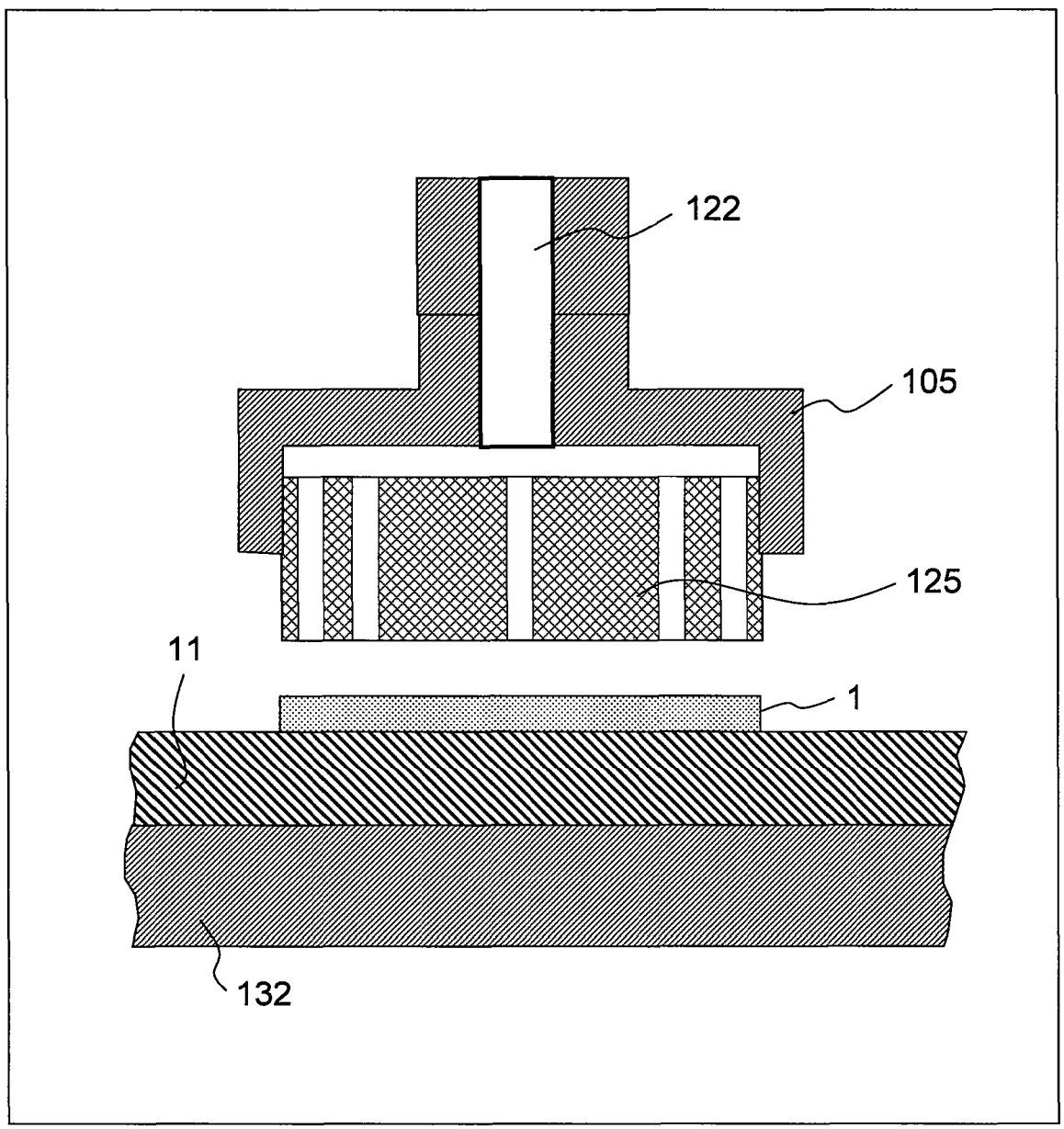
FIG. 59 is a flow diagram 7 in schematic section explaining the die bonding procedure in the semiconductor integrated circuit device manufacturing method embodying the present invention.
Figure 60:
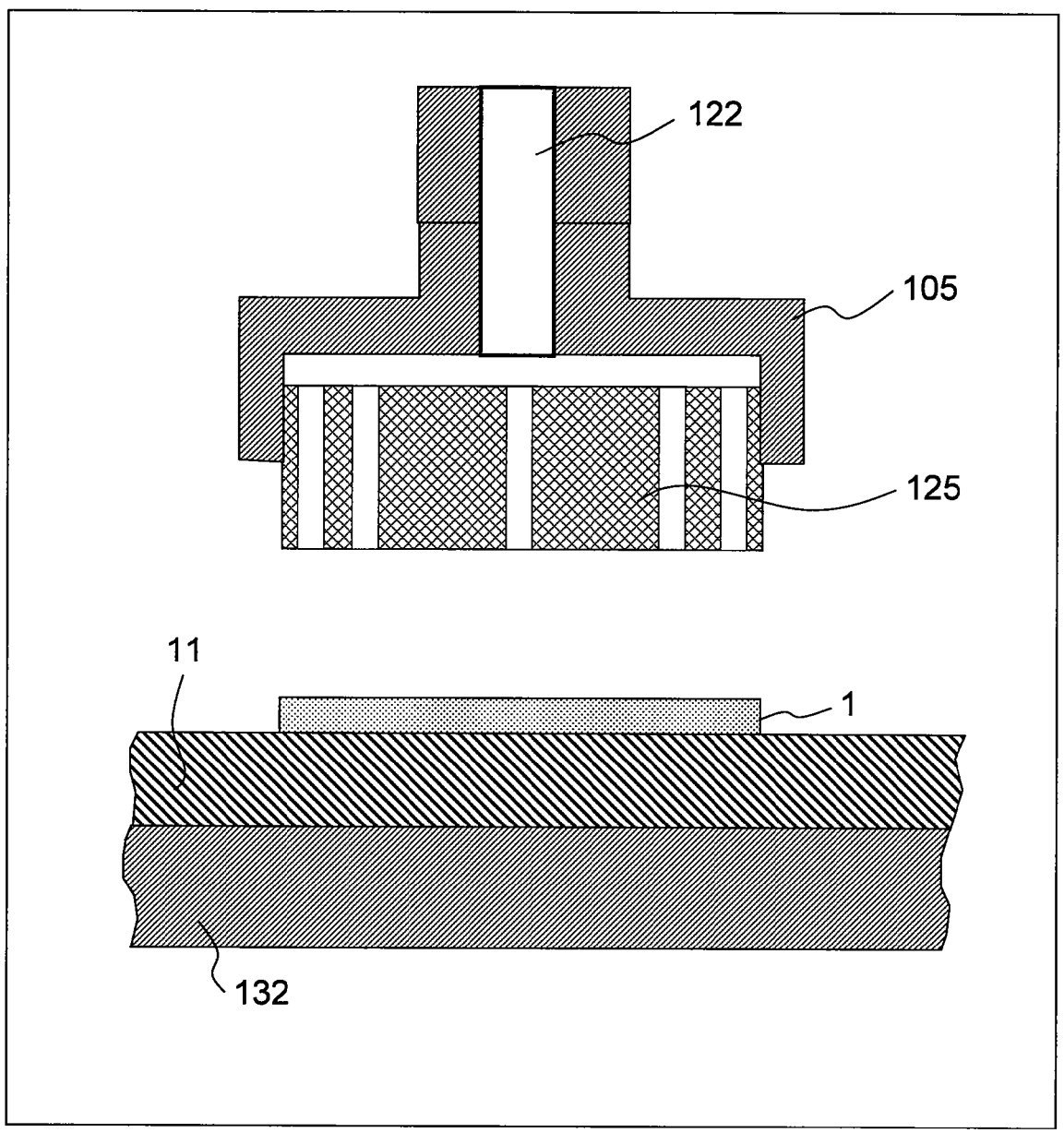
FIG. 60 is a flow diagram 8 in schematic section explaining the die bonding procedure in the semiconductor integrated circuit device manufacturing method embodying the present invention.

A detailed flow of the process after chip peeling up to die bonding will now be described mainly with reference to FIGS. 51 to 60. In FIG. 51, as described previously, a pick-up motion is started in the pick-up section (pick-up motion starting step 201 in FIG. 51, the following steps are also shown in FIG. 51). First, the dicing tape 4 is chucked to the lower base 102 (DC tape chucking step 202). When the collet 105 arrives at a position over the chip 1 concerned at time $t_{11}$ in FIG. 52, it begins to descend. At time $t_{12}$ switching is made to a low-speed descent. At time $t_{13}$ vacuum suction by the collet 105 is started. At time $t_{14}$ the collet 105 descends while making vacuum suction and lands onto the chip 1 (collet chucking start step 203). FIG. 53 shows a schematic section in this state. Immediately thereafter, at time t15, both stick-up motion and rise of the collet 105 are started. At time $t_{16}$ the stick-up motion ends and at time $t_{17}$ the stick-up blocks return to the original state (during the period of $t_{15}$-$t_{17}$, for example, 100 milliseconds). If there is no problem, the collet 105 continues to rise and completes the peeling work. After complete peeling, at time $t_{18}$, the collet 105 increases its rising speed and at time $t_{19}$ it reaches a predetermined parallel movement height. That is, the collet 105 rises while holding the chip by vacuum chucking through the rubber chip 125 (pick-up step 204). It is FIG. 54 that schematically illustrates the section in this state. After rise up to the predetermined height, the collet 105 moves to above the die bonding position, i.e., above the wiring substrate 11 over the bonding stage 132 (above-the-bonding-position moving step 205). It is FIG. 55 that schematically illustrates the section in this state. At time $t_{20}$ the collet 105 begins to descend while holding the chip by vacuum chucking through the rubber chip 125. It is FIG. 56 that schematically illustrates the section in this state. At time $t_{21}$ switching is made to a low-speed descent. The collet now assumes a final landing attitude. At time $t_{22}$ the vacuum suction by the collet is turned OFF (chucking OFF step 206) and the chip 1 descends while being held substantially with only an inter-molecular force (physical chucking) by the rubber chip 125. It is FIG. 57 that schematically illustrates the section in this state. (a comparison of FIGS. 54 to 56 with FIG. 57 shows that the strain caused by vacuum suction of the chip has been extinguished in FIG. 57). At time $t_{23}$ the chip 1 lands onto the wiring substrate 11 (landing step 207; the speed and time between $t_{21}$-$t_{23}$ are, for example, 20 mm/sec and about 40 milliseconds, respectively) In the case where the chip descends through such a route efg as in FIG. 52 (the speed and time between fg are, for example, 2 mm/sec and about 40 milliseconds, respectively), it is preferable that vacuum suction be turned OFF just after the time point of having entered the final landing attitude in that method, i.e., "f" point (may be turned OFF at another time point) When landing is confirmed at time $t_{24}$, a bonding load (for example, 5N) is imposed on the collet 105 (bonding step 208). It is FIG. 58 that schematically illustrates the section in this state. When bonding is completed at time $t_{25}$ (the time between $t_{23}$-$t_{25}$ is, for example, about 1 second), the collet begins to rise. It is FIG. 59 that schematically illustrates the section in this state. At time $t_{26}$ the collet reaches a predetermined parallel movement altitude. It is FIG. 60 that schematically illustrates the section in this state. Thereafter, the collet 105 again moves to the pick-up section for peeling the next chip.

Figure 52:
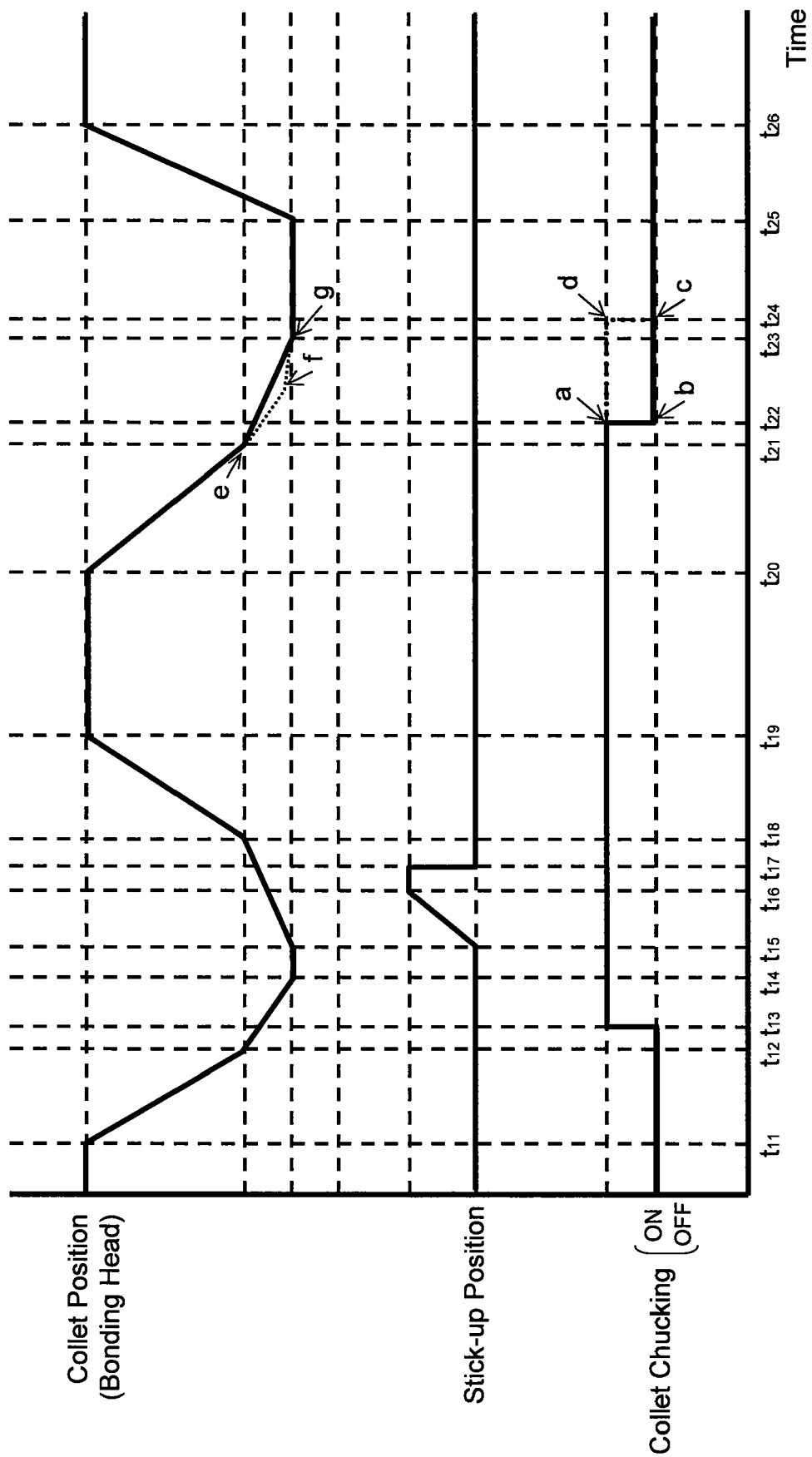
FIG. 52 is a time chart explaining the die bonding procedure in the semiconductor integrated circuit device manufacturing method embodying the present invention.
Figure 53:
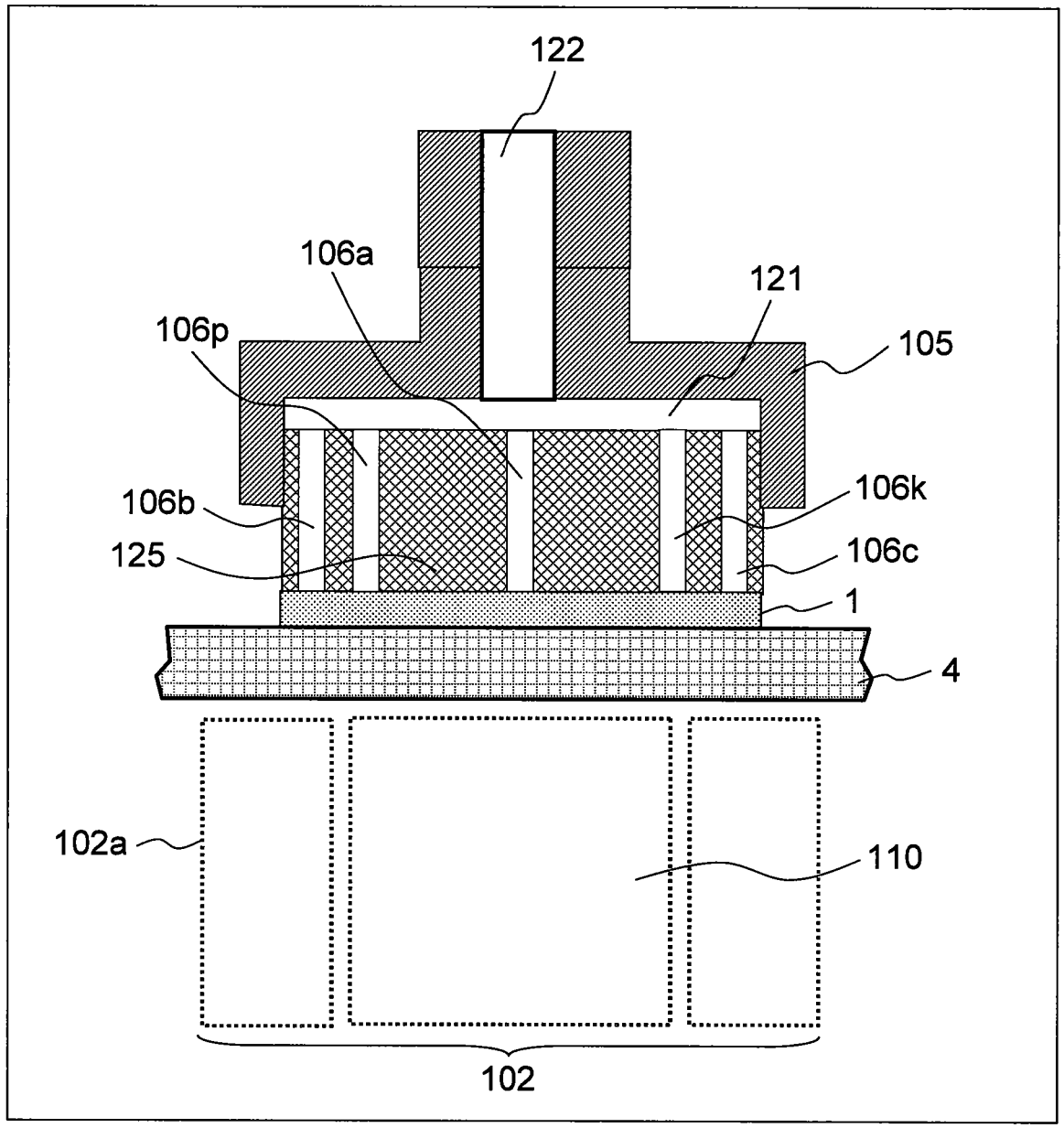
FIG. 53 is a flow diagram 1 in schematic section explaining the die bonding procedure in the semiconductor integrated circuit device manufacturing method embodying the present invention.
Figure 54:
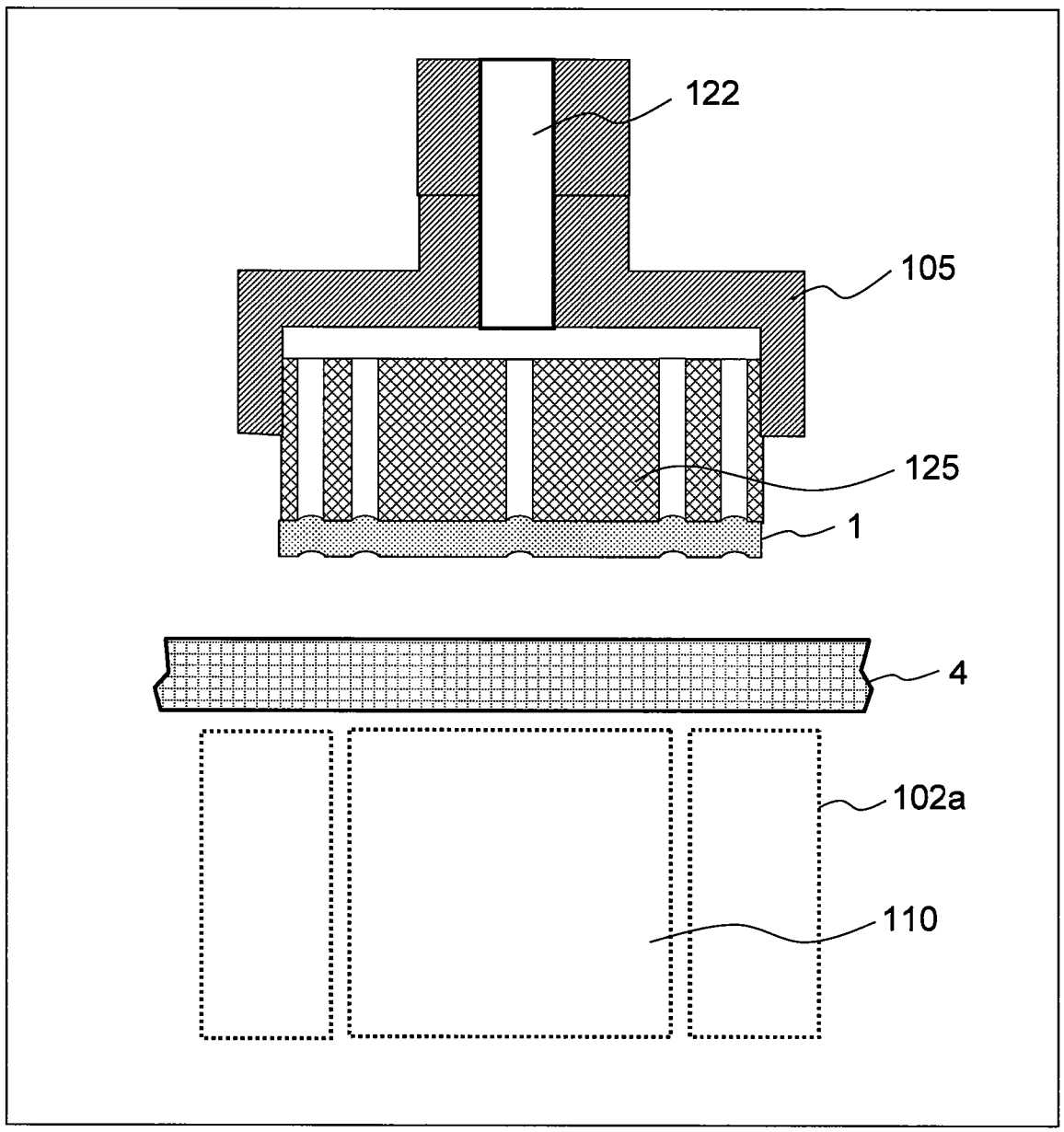
FIG. 54 is a flow diagram 2 in schematic section explaining the die bonding procedure in the semiconductor integrated circuit device manufacturing method embodying the present invention.
Figure 55:
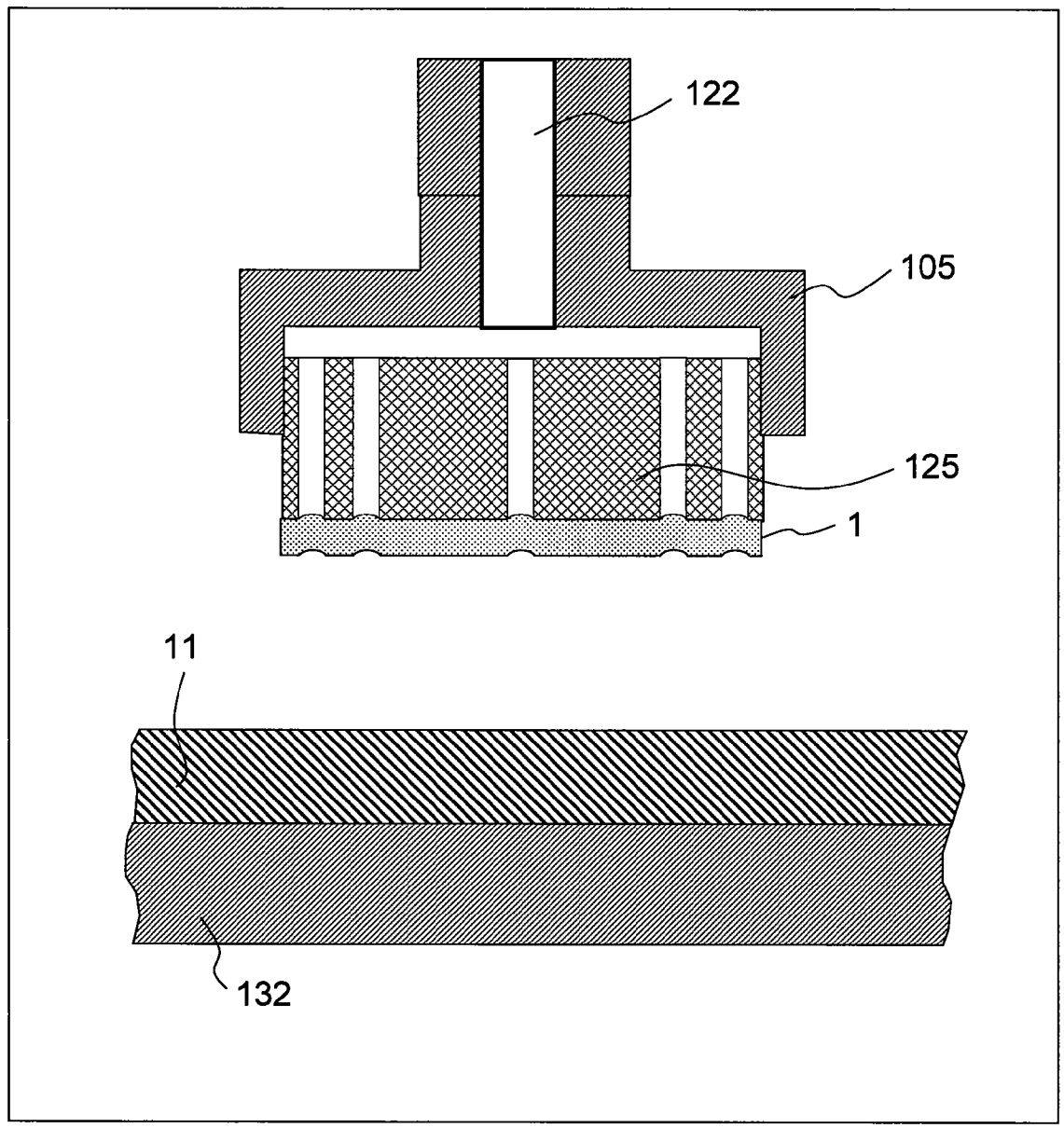
FIG. 55 is a flow diagram 3 in schematic section explaining the die bonding procedure in the semiconductor integrated circuit device manufacturing method embodying the present invention.
Figure 56:
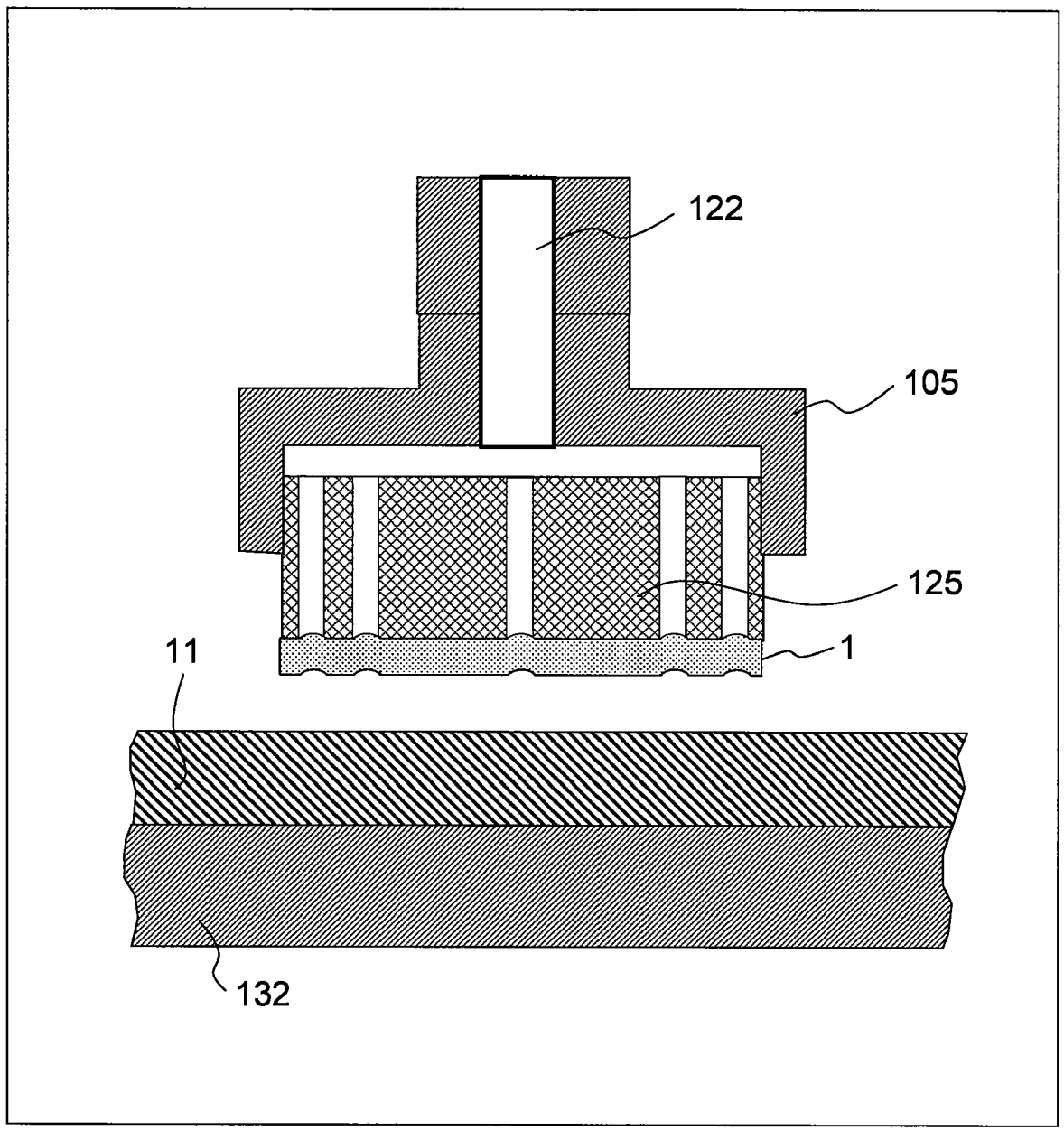
FIG. 56 is a flow diagram 4 in schematic section explaining the die bonding procedure in the semiconductor integrated circuit device manufacturing method embodying the present invention.

In this process, the route abc is followed in FIG. 52, that is, vacuum chucking is turned OFF before landing (including making vacuum chucking very weak in comparison with that in parallel movement), therefore, as compared with the case of following the route adc in FIG. 52, deformation or stress caused by chucking is not found in the chip 1 when landing, thus affording good bonding characteristics. Besides, since any unnecessary force induced by chucking is imposed on the chip 1 when landing, the chip smoothly follows the bonding surface of the wiring substrate. As a result, there remain neither voids nor undesirable strain. Such an effect is particularly advantageous to the process using DAF (including the type of film being affixed to the wafer back surface and the type of film being affixed beforehand to the dicing tape) wherein chip deformation in die bonding is apt to become an issue.

Since vacuum suction is turned OFF after the switching from high-speed descent to low-speed descent (final landing speed), though this is not always essential, it is not likely that the chip 1 may drop due to an impact force induced by the switching. (Vacuum chucking may be turned OFF before the switching of speed on condition that a satisfactory physical chucking is ensured. There also is a case where it is preferable not to make switching of speed). That is, since the mass of each chip is relatively small, a physical chucking force is generally considered strong in comparison with gravity. However, it is generally considered that the impact force can be approximately equal to the physical chucking force.

In case of turning vacuum suction ON and OFF, it is not always necessary to turn OFF vacuum suction completely (open to the atmosphere). For example, assuming that the suction pressure in ON condition is minus 80 to 90 kilopascal, it suffices for the pressure in OFF condition to be sufficient low in absolute value, e.g., several % or less. (However, turning OFF completely without using vacuum chucking, that is, adopting only physical chucking effectively, is more effective in improving the die bonding characteristics of the thin-film chip, that is, in diminishing voids. The pressure in question is, for example, 0.05 to 0.0005 kilopascal or less in terms of an absolute value. Turning vacuum chucking OFF completely is simpler in point of control and is advantageous in pressure response speed.) Without turning OFF completely, switching may be made in terms of strength. More particularly, it is also effective to select a suction strength of 30% or less, preferably 15% or less, of that in ON condition. Taking stable holding of each chip into consideration, a minus pressure, i.e., a weak suction condition (not a weak discharge condition), is desirable even in case of vacuum suction being not completely turned OFF.

The landing method described above in this section is particularly effective in its combination with the die bonding method using a collet having a rubber chip of low elasticity to be described in the next section. This is because when a chip is vacuum-chucked by a rubber chip of low elasticity, the stress imposed on the chip is dispersed over a wide range, so when vacuum chucking is turned OFF, a quick recovery from chip deformation is ensured. Further, if vacuum chucking is kept OFF at least during thermocompression bonding, the bonding pressure is dispersed sufficiently through the rubber chip of low elasticity and thus it is effective particularly in eliminating a local deformation of chip and voids.

The landing method described above in this section is effective particularly in its combination with a die bonding method using a collet having a rubber chip for a thin-film chip (a chip 150 μm or less, or 100 μm or less, further, 50 μm or less). This is because the thin-film chip is apt to undergo a local deformation, and if it lands as it is, it easily forms a closed space between it and the wiring substrate surface, thus causing voids easily.

Moreover, the landing method described above in this section is effective particularly in its combination with the peeling & die bonding method using a collet having a rubber chip which was described in section 3. This is because when a chip is peeled while repeating bending and recovery, the chip is in many cases chucked while strain is allowed to remain.

Figure 61:
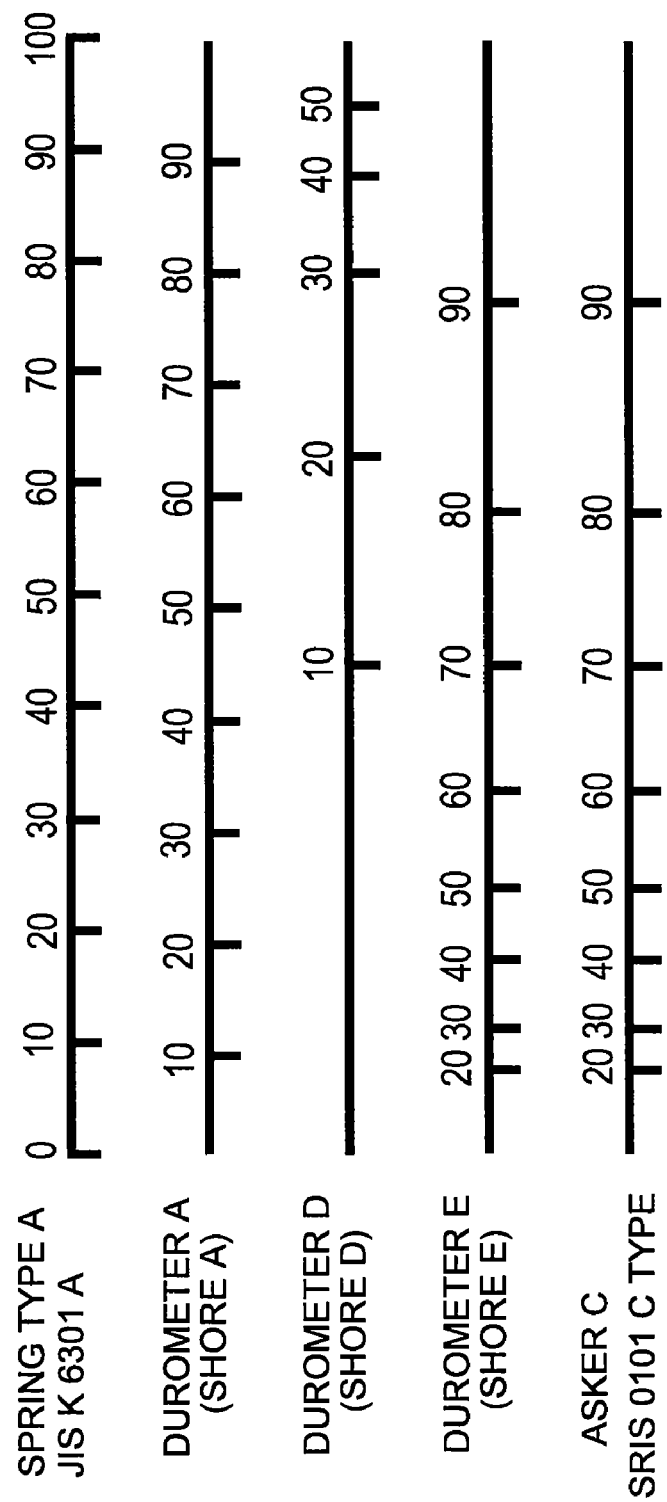
FIG. 61 is a diagram comparing hardness among various standards with respect to the material of a rubber chip used in die bonding in the semiconductor integrated circuit device embodying the present invention.

7. Rubber Chip Material of Low Elasticity (see Mainly FIG. 61)

As the rubber chip material it is easy to select a material of low elasticity and therefore it is firstly effective to select one from among thermosetting elastomers. For example, alpha gel (a registered trademark of Geltec Co.), i.e., a silicone-based gel-like elastomer containing silicone as a principal component, is mentioned as a suitable candidate also from the standpoint of preventing contamination of the chip. In that series, particularly theta gel (a registered trademark of Geltec Co.), theta 5 (hardness: about 56), theta 6 (hardness: about 14) and theta 8 (hardness: about 28) are more preferable. Further, among the theta gels, theta 8 (hardness: about 28) is particularly preferred.

Other examples of the material include such thermosetting elastomers as fluorine rubber, heat-resistant nitrile rubber, natural rubber, isoprene rubber, styrene-butadiene rubber and neoprene rubber.

When recycling is taken into account, polyimide-based thermoplastic elastomers as thermoplastic resins are also employable.

The range of hardness from not lower than 10 to lower than 70 is preferable for utilizing elasticity. The range from not lower than 15 to lower than 55 is particularly preferred for utilizing elasticity. The range from not lower than 20 to lower than 40 is particularly preferred for handling a thin-film chip. However, other ranges are not excluded. Among the embodiments of the present invention there also are included application fields for which such hard collets or rubber chips as conventional elastomers, metals and ceramics about 80 in hardness are suitable. It goes without saying that examples of physical chucking and of the detection of chip bending by leak are not limited to the above range.

Since such a rubber chip of low elasticity is easy to follow concaves and convexes (the chip upper surface is not always flat), leak is difficult to occur in the peeling process and hence it is possible to enhance the peeling effect.

The use of such a rubber chip of low elasticity is advantageous in that even if the chip concerned bends temporarily in the peeling process, the rubber chip also deforms itself to a considerable extent and therefore stress is dispersed, whereby the damage of the chip and the retention of stress can be prevented.

Moreover, the use of such a rubber chip of low elasticity is particularly effective for face-up products or the like because a landing impact in die bonding can be mitigated.

The use of such a rubber chip of low elasticity is particularly effective in a process using DAF or the like because in die bonding it is possible to diminish the retention of strain caused by compression bonding.

The use of such a rubber chip of low elasticity is advantageous in that even if vacuum suction is turned OFF before landing in die bonding, it is possible to ensure a sufficient physical chucking force because the area of close contact with the chip surface is large.

Further, if there is used such a rubber chip of low elasticity, it is possible to diminish damage to the chip in compression bonding irrespective of whether vacuum suction is turned OFF or not before landing in die bonding.

Generally, the physical chucking force is based on van der Waal's force, but its arrival distance is in the range of 0.2 to 10 mm. The physical chucking force between the upper surface of a semiconductor chip and the rubber chip is based on London force (attraction between induced double poles) included in van der Waal's force and is relatively weak. Therefore, it is necessary that as large an area as possible lie within the arrival distance. To meet this requirement it is necessary to provide a material having excellent followability. Besides, since impact is apt cause drop, it is preferable to use a material whose impact absorbability is as high as possible.

The rubber chip is relatively low in thermal conductivity, so generally in die bonding using a collet having a rubber chip, heating is conducted from the wiring substrate side, i.e., from the bonding stage side.

8. Two-Stage Die Bonding Process (see Mainly FIGS. 62 to 65)

In the method described above thermocompression bonding is completed using one bonding tool (collet 105), but if there is adopted a method involving temporarily bonding plural chips (for example, five chips) with a first bonding tool (collet 105) and subsequently compression-bonding the chips eternally with a second bonding tool, it is possible to make the throughput several times as much. In the temporary compression bonding performed in combination with the rubber chip of low elasticity, which was described above in section 7, it is possible to carry out the temporary compression bonding at high speed because there is little damage to the chip even in high-speed operation. (It goes without saying that the rubber chip of low elasticity is employable also in an eternal compression bonding tool 305). A more detailed description will be given below.

Figure 62:
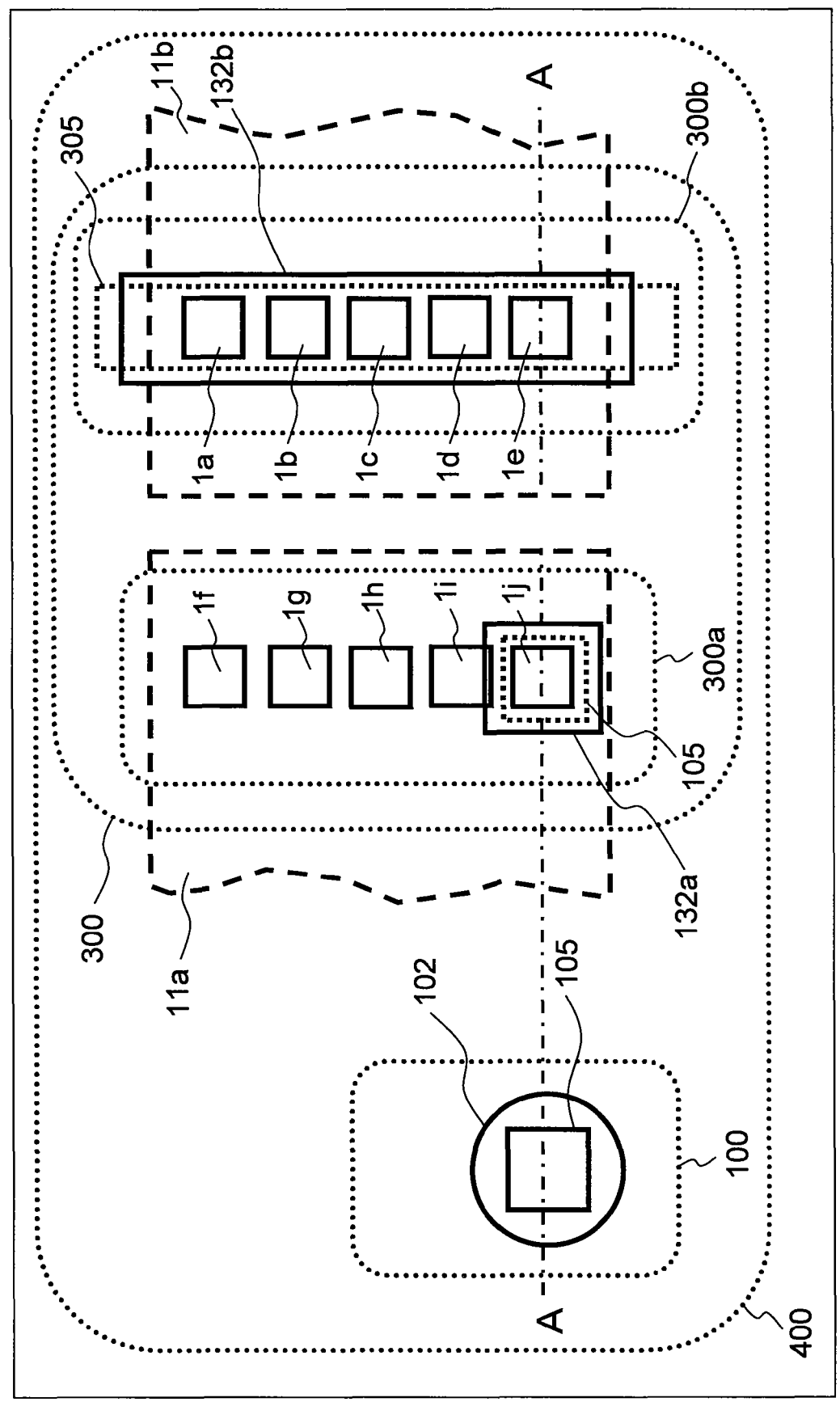
FIG. 62 is a schematic top view showing the construction of a chip peeling/die bonding device used in a step die bonding method in the semiconductor integrated circuit device manufacturing method embodying the present invention.

FIG. 62 is a top view showing the construction of a peeling/die bonding device 400. The chip peeling section 100 (pick-up section) described above is disposed on the left side of the same figure, while a die bonding section 300 is disposed on the right side, in which there are included a temporary bonding section 300a and an eternal compression bonding section 300b. In the temporary bonding section 300a is provided a temporary bonding stage 132a. On the other hand, an elongated eternal compression bonding stage 132b is provided in the eternal compression bonding section 300b.

Figure 63:
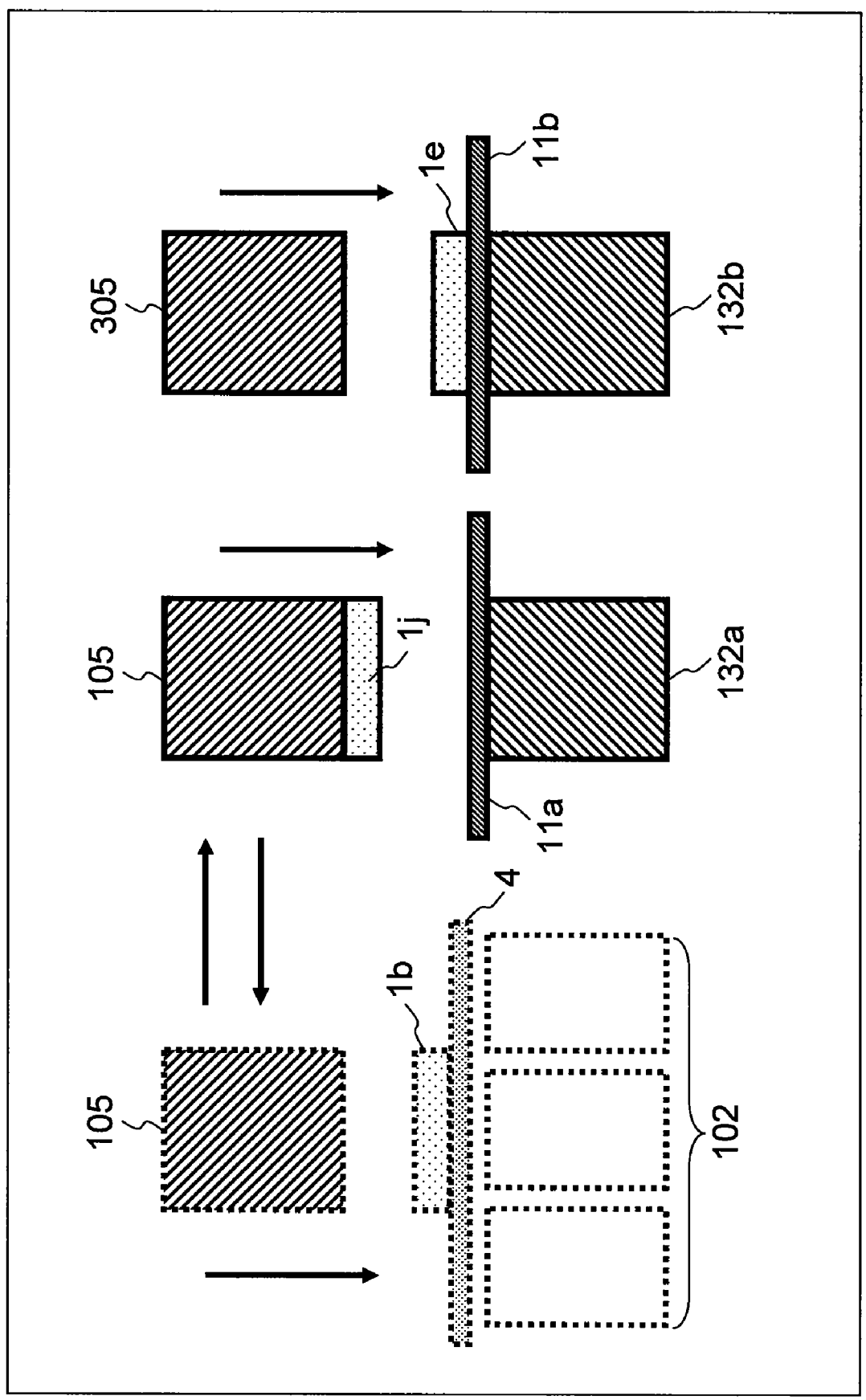
FIG. 63 is a sectional step flow diagram 1 showing a flow of the step die bonding method in the semiconductor integrated circuit device manufacturing method embodying the present invention.
Figure 64:
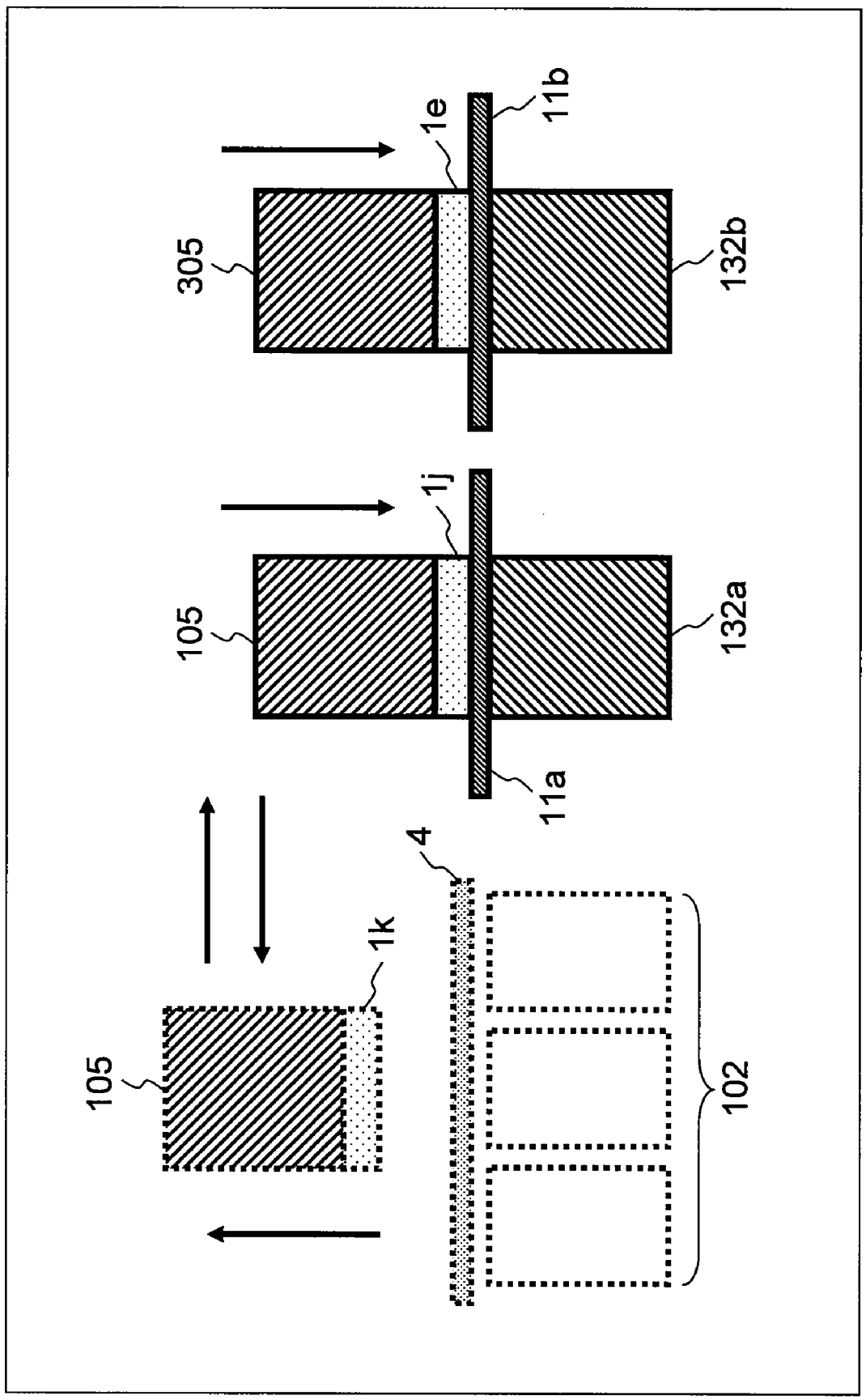
FIG. 64 is a sectional step flow diagram 2 showing the flow of a step die bonding method in the semiconductor integrated circuit device manufacturing method embodying the present invention.
Figure 65:
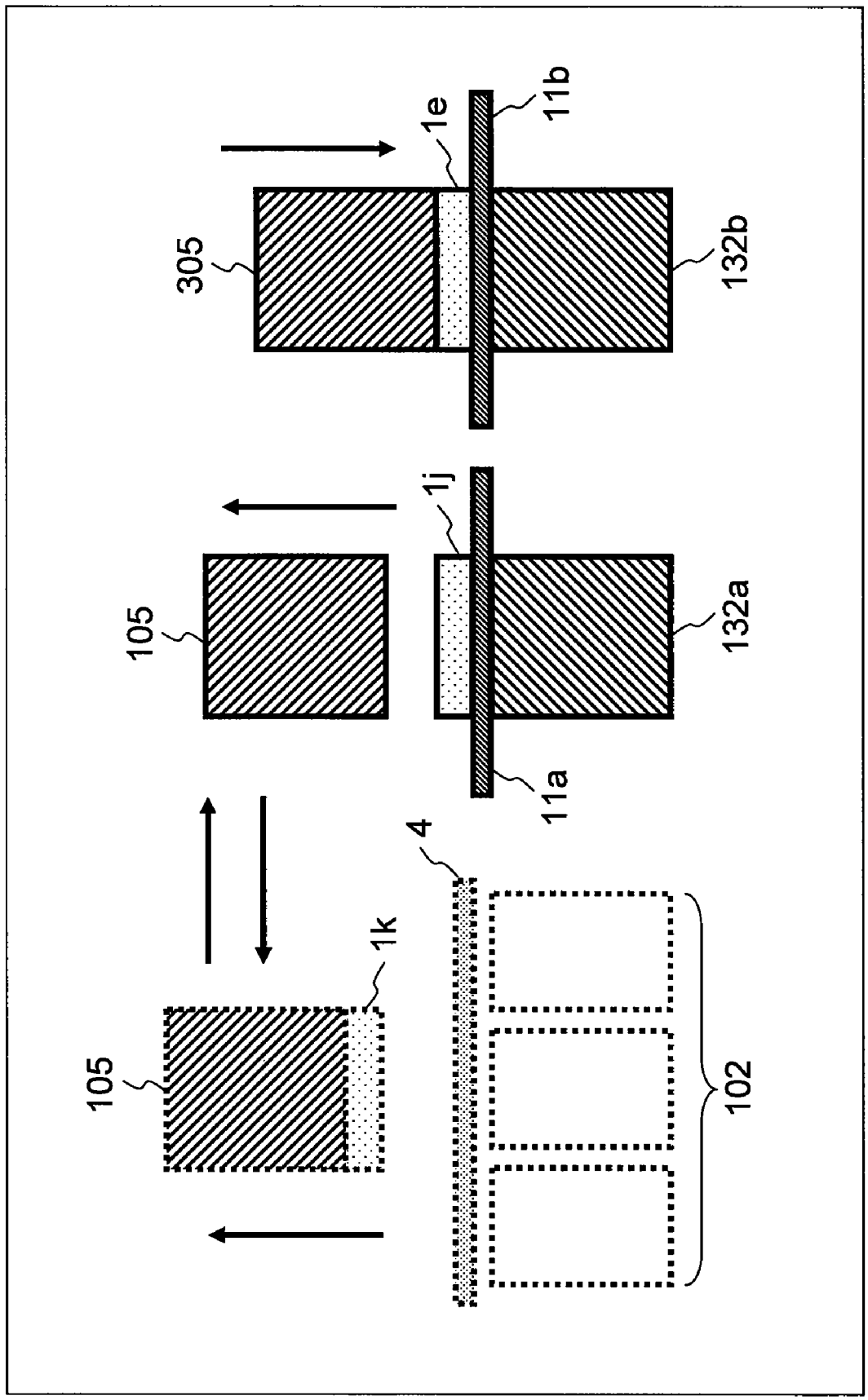
FIG. 65 is a sectional step flow diagram 3 showing a flow of the step die bonding method in the semiconductor integrated circuit device manufacturing method embodying the present invention.

A section taken on line A-A in FIG. 62 is shown in FIGS. 63 to 65, illustrating a two-stage die bonding process. As shown in FIG. 63, a peeled chip 1j is conveyed to above a wiring substrate 11a over the temporary die bonding stage 132a by means of the collet 105. Next, as shown in FIG. 64, the collet 105 descends and temporary compression bonding (a compression-bonded state to such an extent that the position is fixed by an adhesive layer) in a short time (pressurizing time: for example, 0.1 second or so). If timing matches at this time, eternal compression bonding to a substrate 11b of chips 1a to 1e is performed by the eternal compression bonding tool 305. The eternal bonding requires a longer time (pressurizing time: for example, 4 seconds or so) than in the temporary compression bonding, so during that period the collet 105 reciprocates several times between the pick-up section 100 and the temporary bonding section 300a, whereby the temporary compression bonding of chips 1f to 1j can be completed (see FIG. 65). Then, the collet 105 moves to the peeling stage for peeling the next chip 1k.

As in the previous description, the temporary and eternal compression bonding stages are heated to a temperature of about 100° to 150° C. (since the glass transition temperature of the organic wiring substrate is generally about 240° to 330° C., the substrate heating temperature may be about 100° to 200° C., but in order to minimize deformation of the substrate, a temperature of about 100° to 150° C. is desirable, provided it is necessary that the temperature in question be at least not higher than the glass transition temperature of the substrate). The eternal compression bonding tool 305 is also heated to the same temperature or a temperature higher about 50° C. Therefore, unlike the temporary compression bonding collet, the lower end portion of the eternal compression bonding tool 305 can be constructed of a material relatively high in thermal conductivity. For example silicon which configures the chip is a material relatively high thermal conductivity, thus permitting efficient heating and hence permitting smooth execution of thermocompression bonding.

9. Modified Example of Collet Vacuum Suction System (see Mainly FIGS. 66, 67 and 52)

Figure 67:
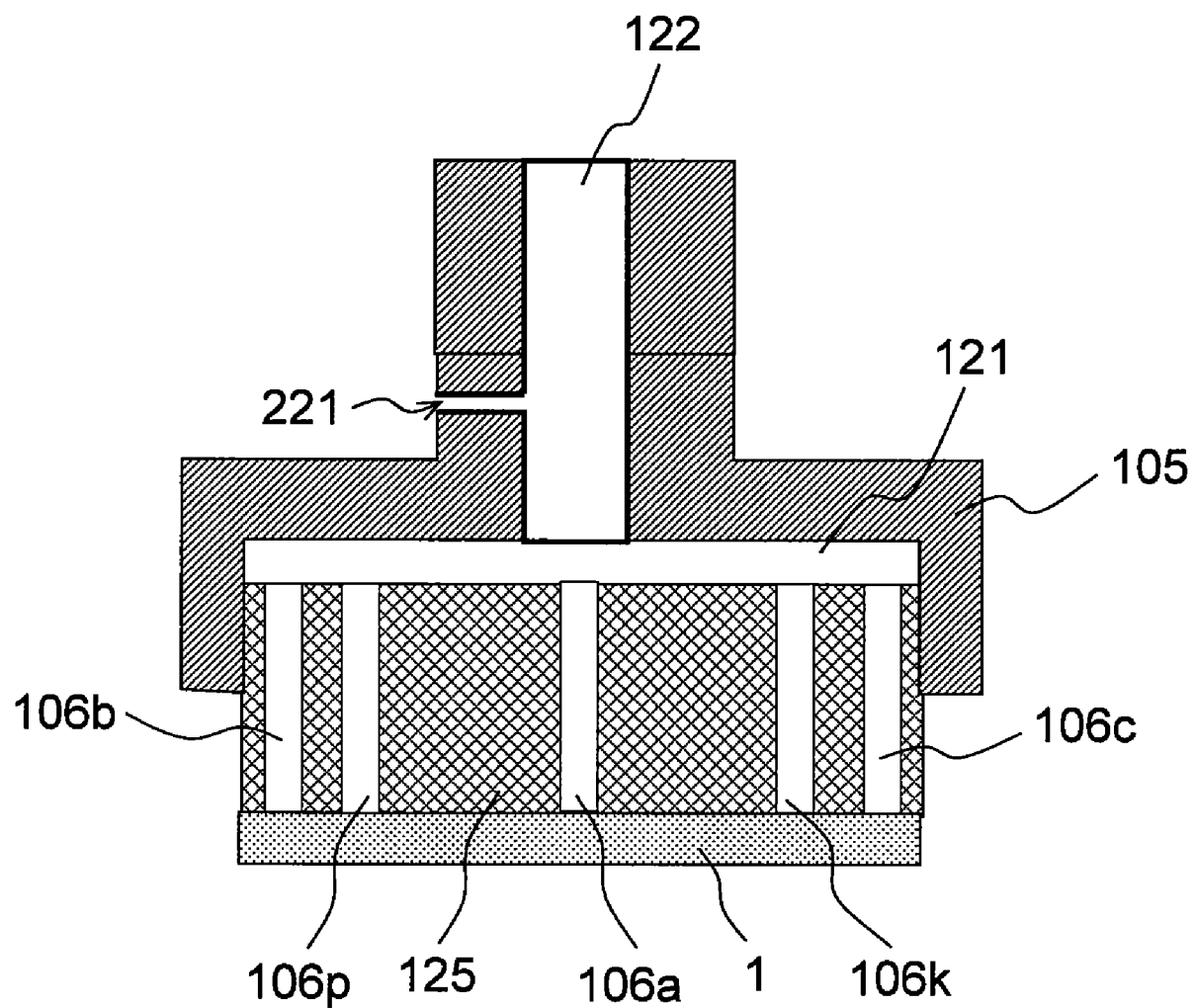
FIG. 67 is a sectional view of a collet used in the modified example of the die bonding procedure in the semiconductor integrated circuit device manufacturing method embodying the present invention.

The vacuum suction system of the collet 105 described above is a complete closed type (coupled to a vacuum source in ON condition, but decoupled from the vacuum source and open to the atmosphere in OFF condition, by the valve 143 shown in FIG. 31). A vacuum suction system to be described here is a modified type thereof as shown in FIG. 67, in which a leak hole 221 is formed in a position relatively close to the rubber chip of the collet body 105. This is effective in that the pressure response speed at the tip of the collet upon turning OFF of chucking becomes high. (Of course, also in the vacuum suction system of the collet 105 described above, the vacuum suction system is decoupled from the vacuum source and open to the atmosphere in OFF condition, but generally the switching between connection to the vacuum source and opening to the atmosphere is performed by the change-over valve 143 disposed at a position closer to the vacuum source than the tip of the collet, so a slight delay is unavoidable. Actually, a time of about 40 to 100 milliseconds has so far been taken. That is, if a leak path is provided constantly in the tip of the collet, the pressure response speed increases to a degree corresponding to the conductance of the vacuum flow path up to the change-over valve 143 even if the leak path is relatively thin.) Thus, the leak path is provided constantly. (For example, it is assumed that the hole diameter of the leak path is about 0.3 mm and the arrival flow rate and arrival pressure are 0.4 L/min and 84 KPa, respectively, with the leak path alone open. For reference, the arrival flow rate with all the rubber chip chucking holes about 0.8 mm in diameter open is about 7.0 L/min.) Therefore, it is possible to lessen the influence on the chip caused by impact when the vacuum suction system is closed with the chip. That is, in the case where such a relatively soft elastomer as that described in section 7 is used as the rubber chip, the vacuum sealability is very high, so that there is a fear of a relatively large impact being generated when the bending of the chip inducing a leaking state is remedied and the vacuum suction system is closed. In this case, however, since the leak path is present constantly, that is, since the vacuum suction system is not completely closed, it is considered that there is little fear of a strong impact being imposed on the chip. Besides, since the response speed is high in the presence of a leak hole, a chip strain-free state can be ensured at the time of landing even if vacuum chucking is turned OFF just before landing. Further, in case of using a rubber chip of low elasticity, recovery from the aforesaid bending, coupled with the recovery force of the low elastic material, is done more smoothly.

Figure 66:
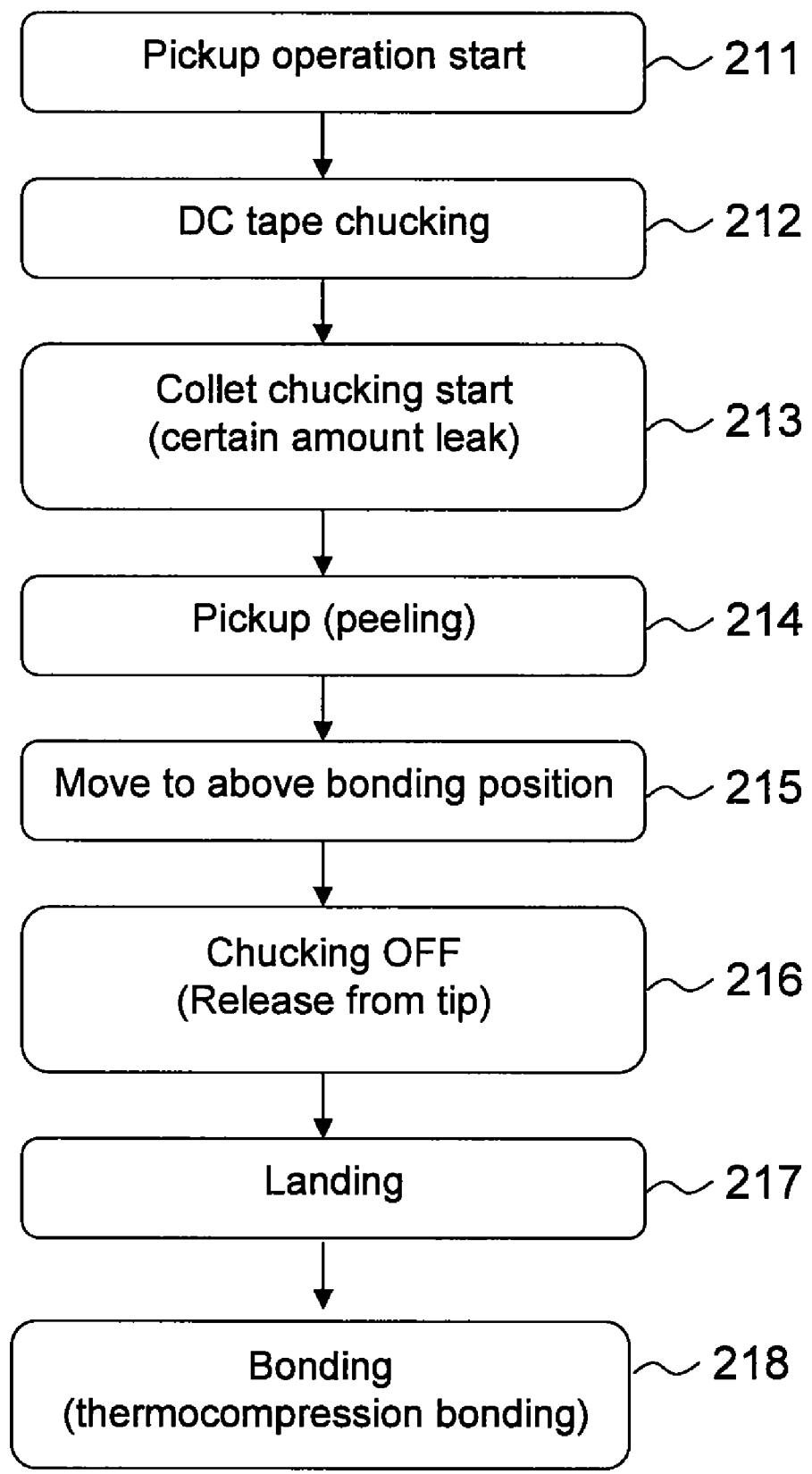
FIG. 66 is a step flow chart explaining a modified example of the die bonding procedure in the semiconductor integrated circuit device manufacturing method embodying the present invention.

Next, a detailed procedure will be described with reference to FIG. 52. In FIG. 66, as described previously, first a pick-up motion is started in the pick-up section (pick-up motion start step 211 in FIG. 66, reference is made to FIG. 66 also for the following steps). First, the dicing tape 4 is chucked to the lower base 102 (DC tape chucking step 212). At time $t_{11}$ in FIG. 52, when the collet 105 arrives at the position above the chip 1 to be picked up, it starts to descend. At time $t_{12}$ switching is made to a lower-speed descent. Then, at time $t_{13}$ the collet 105 starts vacuum suction. At time $t_{14}$ the collet 105 descends while continuing vacuum suction and lands onto the chip 1 (collet chucking start step 213). Immediately thereafter, at time $t_{15}$, both stick-up motion and rise of the collet 105 are started. At time $t_{16}$ the stick-up motion ends and at time $t_{17}$ the stick-up blocks revert to their original state. If there is no problem, the collet 105 continues to rise to complete the peeling operation. After the complete peeling, at time $t_{18}$, the collet 105 increases its rising speed and at time $t_{19}$ it reaches a predetermined parallel movement height. That is, the collet 105 rises while holding the chip by vacuum chucking with the rubber chip 125 (pick-up step 214). After rise to the predetermined height, the collet 105 moves to above the die bonding position, i.e., above the wiring substrate 11 over the bonding stage 132 (above-the-bonding-position moving step 215). At time $t_{20}$ the collet 105 begins to descend while holding the chip by vacuum chucking with the rubber chip 125. At time $t_{21}$ switching is made to a low-speed descent. It follows that the collet has assumed a final landing attitude. At time $t_{22}$ the vacuum suction by the collet is turned OFF (chucking OFF step 216) and the chip 1 descends while being held by the rubber chip 125 substantially with only the intermolecular force (physical chucking). At time $t_{23}$ the chip 1 lands onto the wiring substrate 11 (landing step 217). When the landing is confirmed at time $t_{24}$, a bonding load is imposed on the collet 105 (bonding step 218). When bonding is completed at time $t_{25}$, the collet begins to rise. At time 26 the collet reaches a predetermined parallel movement height. Thereafter, the collet 105 again moves to the pick-up section for peeling the next chip.

10. Modified Example of Rubber chip Shape, etc. (see Mainly FIGS. 68 to 72)

What is described in this section relates to an improvement of the collet rubber chip shape, etc. described above in connection with FIGS. 32 to 37, 39 to 40, 42, 44, 46 to 48, 53 to 60, 63 and 67. According to this improvement, at an outwardly extending portion of the principal portion including the center of the rubber chip there is provided a peripheral portion (flange portion) which is smaller in thickness than the principal portion, thereby enhancing the flexibility of the rubber chip outer end portion and improving the holding characteristic of the rubber chip to prevent the occurrence of leak as far as possible. As a result, it is possible to diminish cracking, etc. of the die during pick-up. Besides, since the stand-by time and the number of retrial decrease, it is possible to shorten the processing time.

The hardness of the elastomer which forms the rubber chip is the same as that described in section 7. However, when the follow-up performance of the peripheral portion is high, there is a tendency that the elastomer hardness is somewhat higher, preferably not lower than 25 and lower than 65. According to the method wherein vacuum suction is stopped before landing, utilizing physical chucking, a micro-average distance between the die and the rubber chip increases and therefore physical chucking becomes unstable if the elastomer hardness exceeds 70.

10-1. Rubber chip Shapes of Reduced Leak (see Mainly FIGS. 68 to 70)

Figure 68:
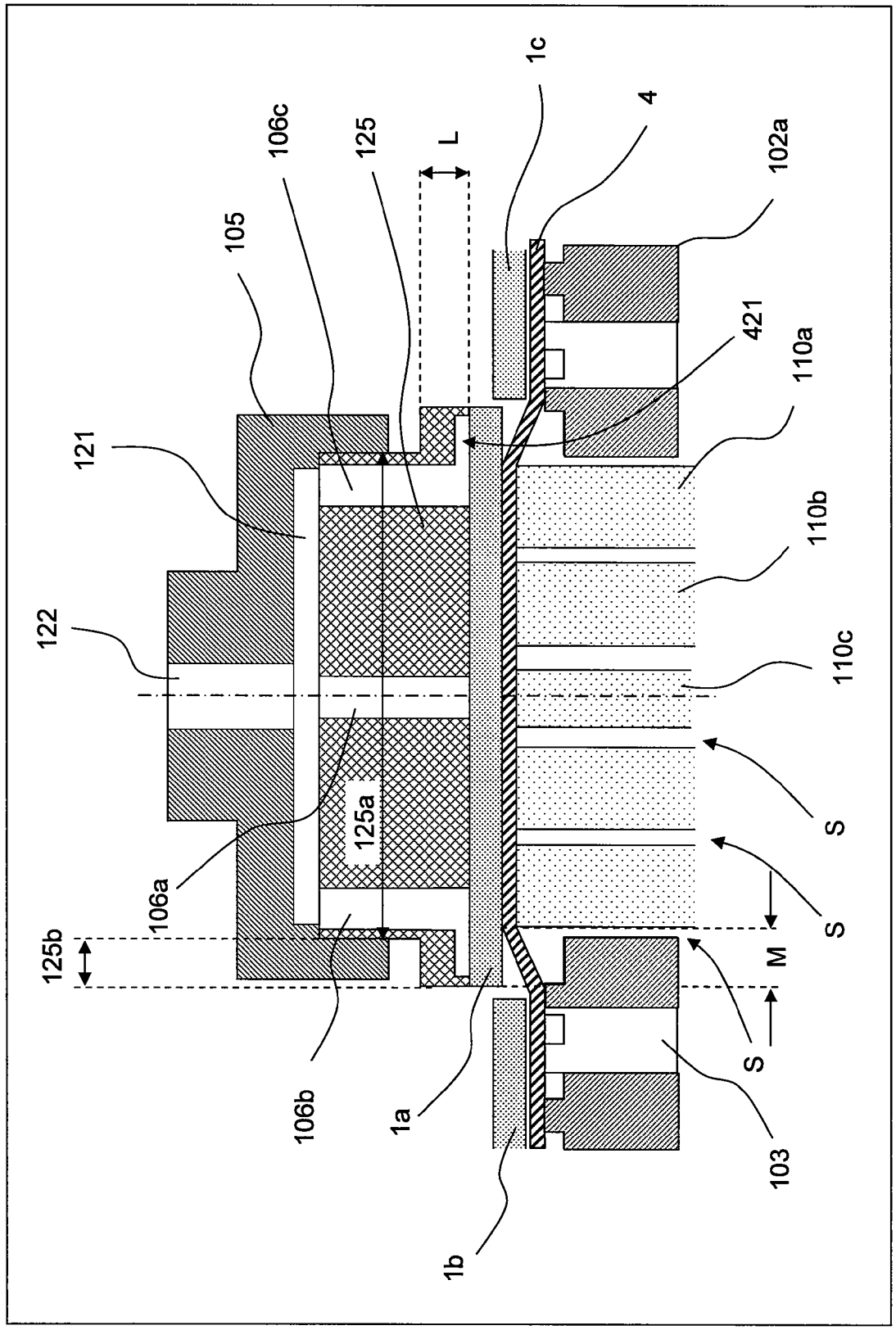
FIG. 68 is a schematic sectional view showing an intermediate state in a die pick-up process (using a rubber chip having a peripheral flange) in the semiconductor integrated circuit device manufacturing method embodying the present invention.
Figure 69:
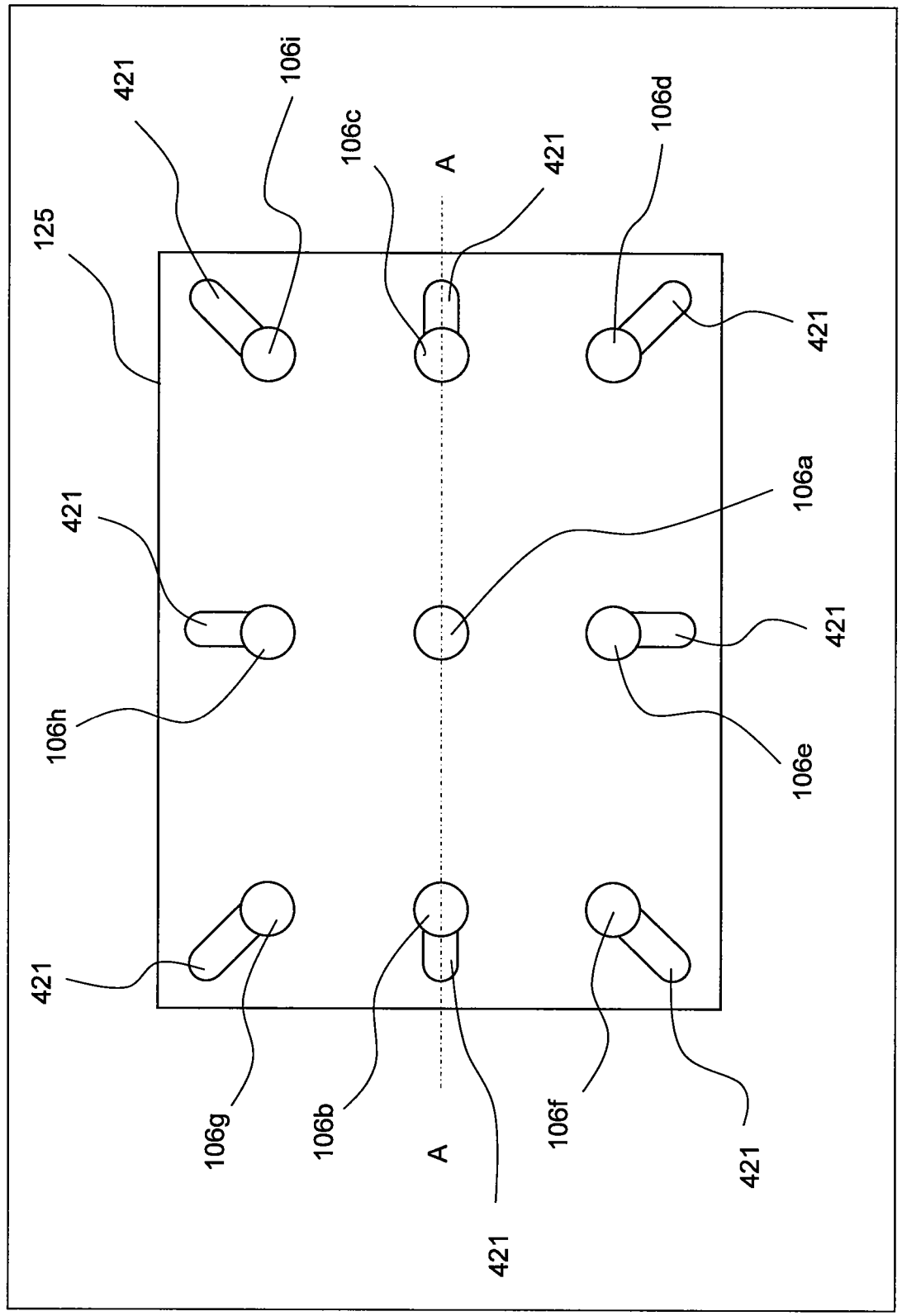
FIG. 69 is a bottom view (concrete example "a") of a rubber chip corresponding to FIG. 68.
Figure 70:
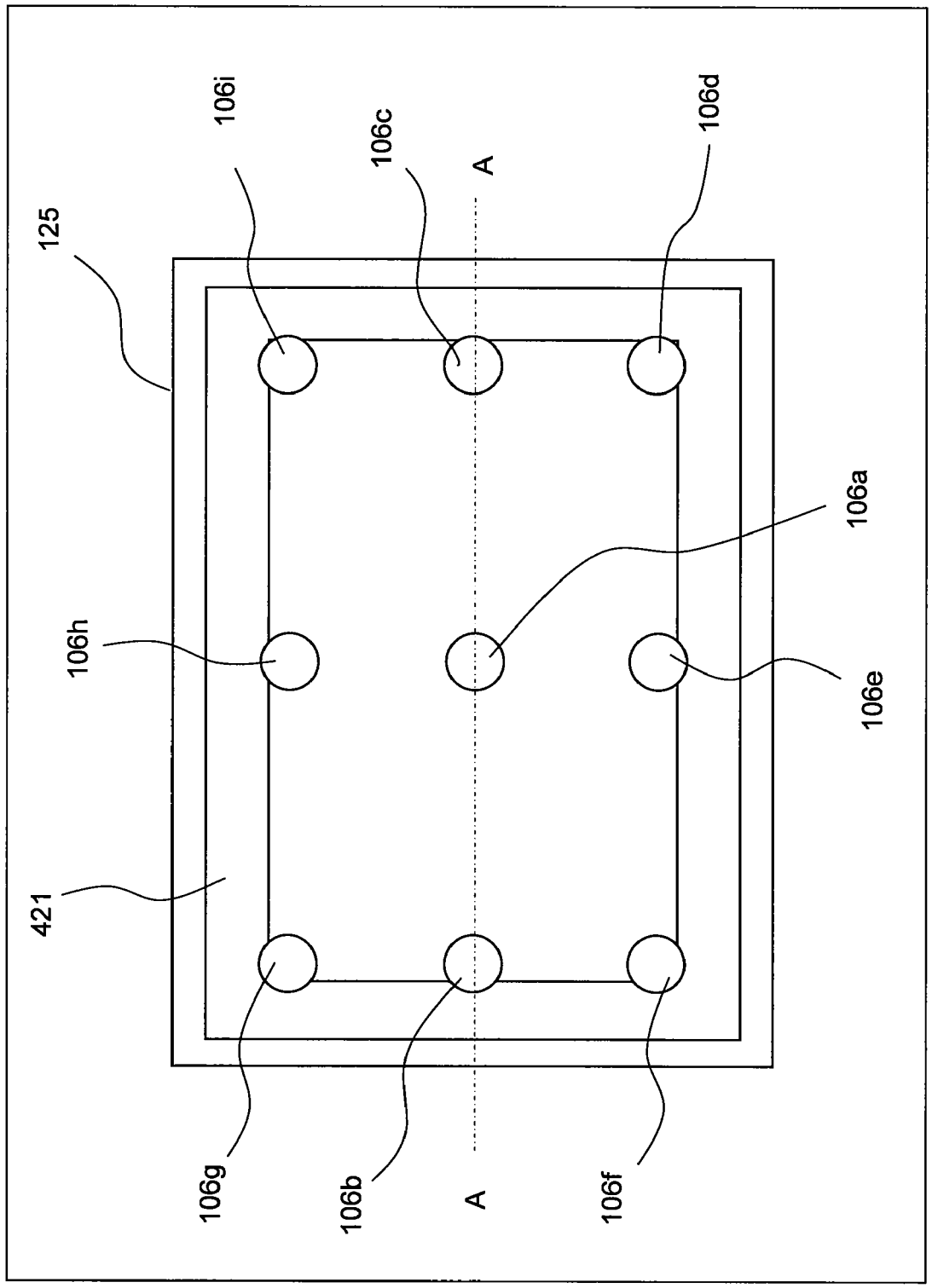
FIG. 70 is a bottom view (concrete example "b") of a rubber chip corresponding to FIG. 68.

FIG. 68 is a schematic sectional view (corresponding to the section taken on line A-A in FIG. 69 or FIG. 70) showing an intermediate state of a die bonding process (using a rubber chip having a peripheral flange) in the semiconductor integrated circuit device manufacturing method embodying the present invention. FIG. 69 is a bottom view (concrete example "a") of a rubber chip corresponding to FIG. 68. FIG. 70 is a bottom view (concrete example "b") of a rubber chip corresponding to FIG. 68. Rubber chip shapes of reduced leak will be described below with reference to these figures.

First, a description will be given about an example in which a die is stuck up from below by means of stick-up blocks 110a, 110b and 110c (stick-upblocks 110, i.e., the portion just under the die 1a of the lower base 102) and is picked up. As shown in FIGS. 68 and 69, the rubber chip is characterized by being divided into a central rubber chip principal portion 125a and a ring-like rubber chip peripheral portion 125b (located on the lower surface side of the rubber chip 125). The rubber chip peripheral portion 125b is smaller in thickness than the rubber chip principal portion 125a. This is for permitting the rubber chip peripheral portion 125b to follow a downward deformation of the peripheral portion of the die 1a when deformed downward by being pulled with the dicing tape 4. Therefore, vacuum suction holes 106b, 106c, 106d, 106e, 106f, 106g, 106h and 106i formed in peripheral positions of the rubber chip principal portion 125a are coupled respectively to vacuum suction grooves 421 formed in the lower surface of the rubber chip peripheral portion 125b.

A suitable width of the rubber chip peripheral portion 125b is approximately equal (for example, about 0.5 to 0.7 mm) to a die deformation margin width (a margin width to prevent cracking of a die as a result of the radius of curvature of the die concerned or adjacent die 1a, 1b or 1c becoming too small due to deformation of the dicing tape 4; this is also true in the slide method) of the outer portion of the stick-up block 110a. A suitable thickness of the lower flange L of the rubber chip peripheral portion 125b is about 0.5 to 2 mm, assuming that the elastomer hardness is 50 or so (the rubber chip thickness is, for example, 3 to 5 mm). These points are substantially true of the rubber chip to be described in sub-section (10-3).

Such a lower surface shape as shown in FIG. 70 is also adoptable. As shown in FIG. 70, a single ring-like vacuum suction groove 421 may be coupled to the vacuum suction holes 106*b*, 106*c*, 106*d*, 106*e*, 106*f*, 106*g*, 106*g* and 106*i*. According to this structure both follow-up performance for die deformation and vacuum chucking performance are improved. Regarding durability, however, the structure shown in FIG. 69 is superior.

Figure 40:
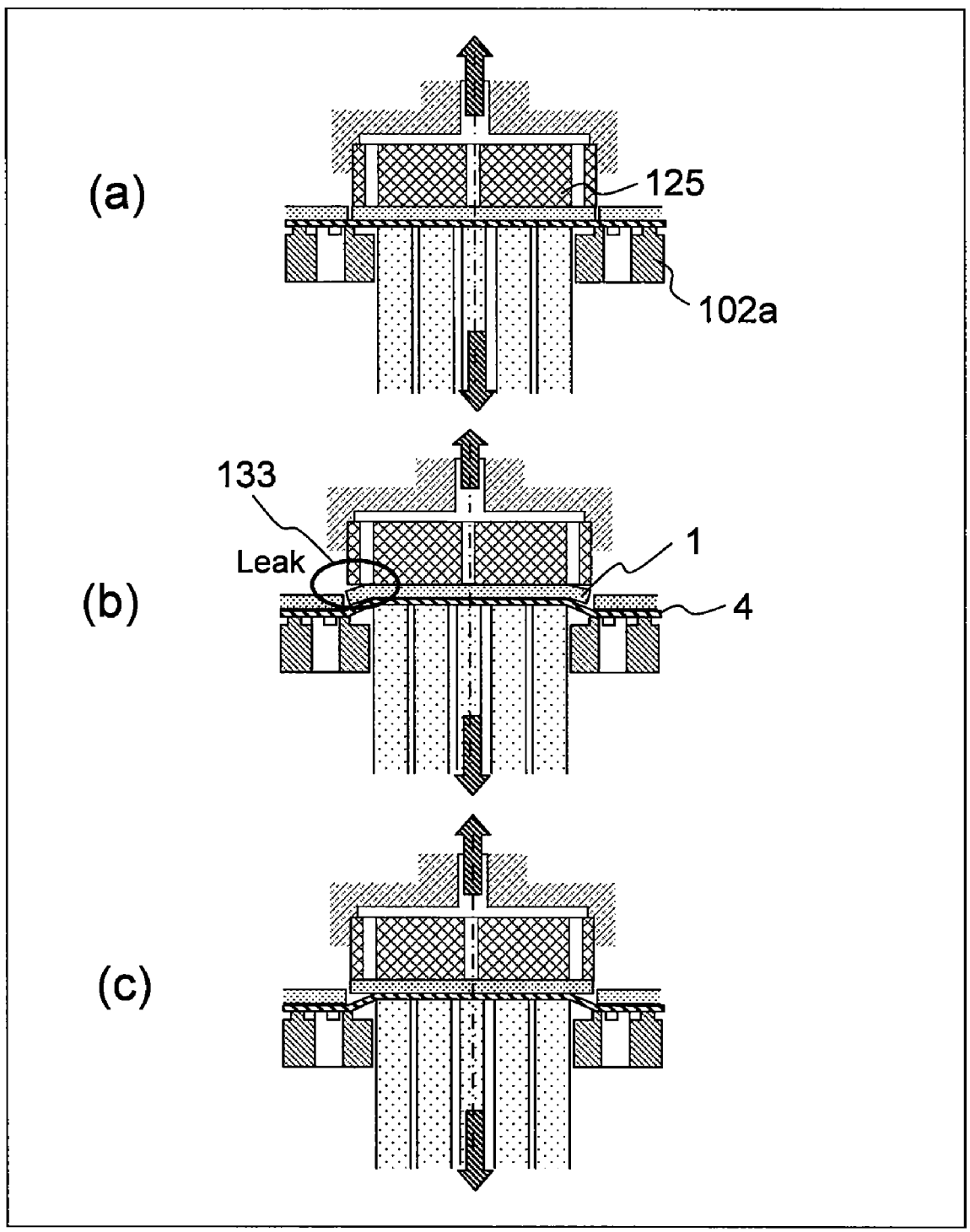
FIGS. 40(a) to 40(c) are flow diagrams in schematic section showing the peeling process 1 in the semiconductor integrated circuit device manufacturing method embodying the present invention.
FIGS. 42(a) to 40(e) are flow diagrams in schematic section showing the peeling process 2 in the semiconductor integrated circuit device manufacturing method embodying the present invention.

That is, according to the rubber chip of such a shape, the chucking force for the die periphery is greatly improved because the chucking area at the periphery of the die 1*a* is large. Thus, usually, as shown in FIGS. 40(*b*), 42(*d*), 44(*d*), or 48(*b*), even in such a condition as causes leak, it is possible to reduce the stand-by time and the number of retrial and thereby improve the processing speed because vacuum chucking can be maintained. Moreover, cracking and chipping of the die can also be diminished because a downwardly deforming stress for the die can be cancelled.

10-2. Application to Slide Peeling (see Mainly FIGS. 71(*a*) to 71(*d*))

Figure 71:
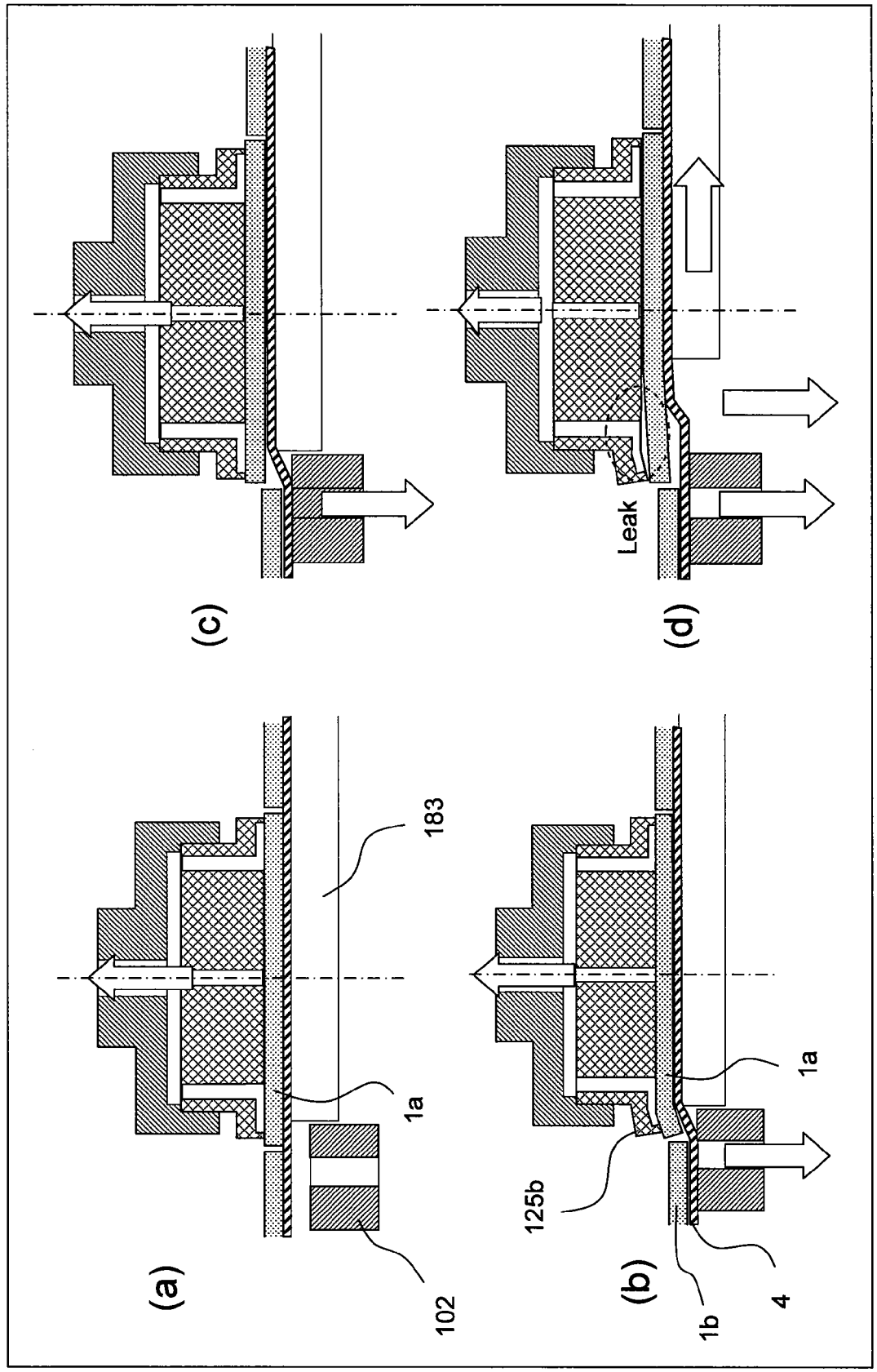
FIGS. 71(a) to 71(d) are sectional flow diagrams in which the rubber chip corresponding to FIG. 68 is applied to the peeling process of section (3-4)

FIGS. 71(*a*) to 71(*d*) are sectional flow diagrams in which the rubber chip corresponding to FIG. 68 is applied to the peeling process described in above in section (3-4). With reference to these flow diagrams, a description will now be given about an example in which the rubber chip shape of less leak described in sub-section (10-1) is applied to the slide peeling of sub-section (3-4). This is just the same also in case of applying the rubber chip shape of reduced leak described in sub-section (10-3) to the peeling process. Explanation will not be repeated.

As shown in FIG. 71(*a*), since the chucking area at the periphery of the die 1*a* is large, the chucking force for the die periphery is greatly improved. That is, according to this rubber chip shape, because of an excellent follow-up performance thereof, even in such a condition as FIG. 47(*b*) in sub-section (3-4), the rubber chip peripheral portion 125*b* (flange portion) follows up deformation and vacuum chucking is maintained without leak (FIG. 71(*b*)). Further, a restoring force acts and a return is made to a flat state easily. Thus, the occurrence of leak is observed only when a slide plate 183 (the portion just under the die 1*a* of the lower base 102) retracts sideways of the lower portion of the die 1*a* too quickly, as shown in FIG. 71(*d*).

The die deformation margin width M in the case of the slide method is provided at the tip and both side portion of the slide plate 183.

10-3. A Further Rubber chip Shape of Reduced Leak (see Mainly FIG. 72)

Figure 72:
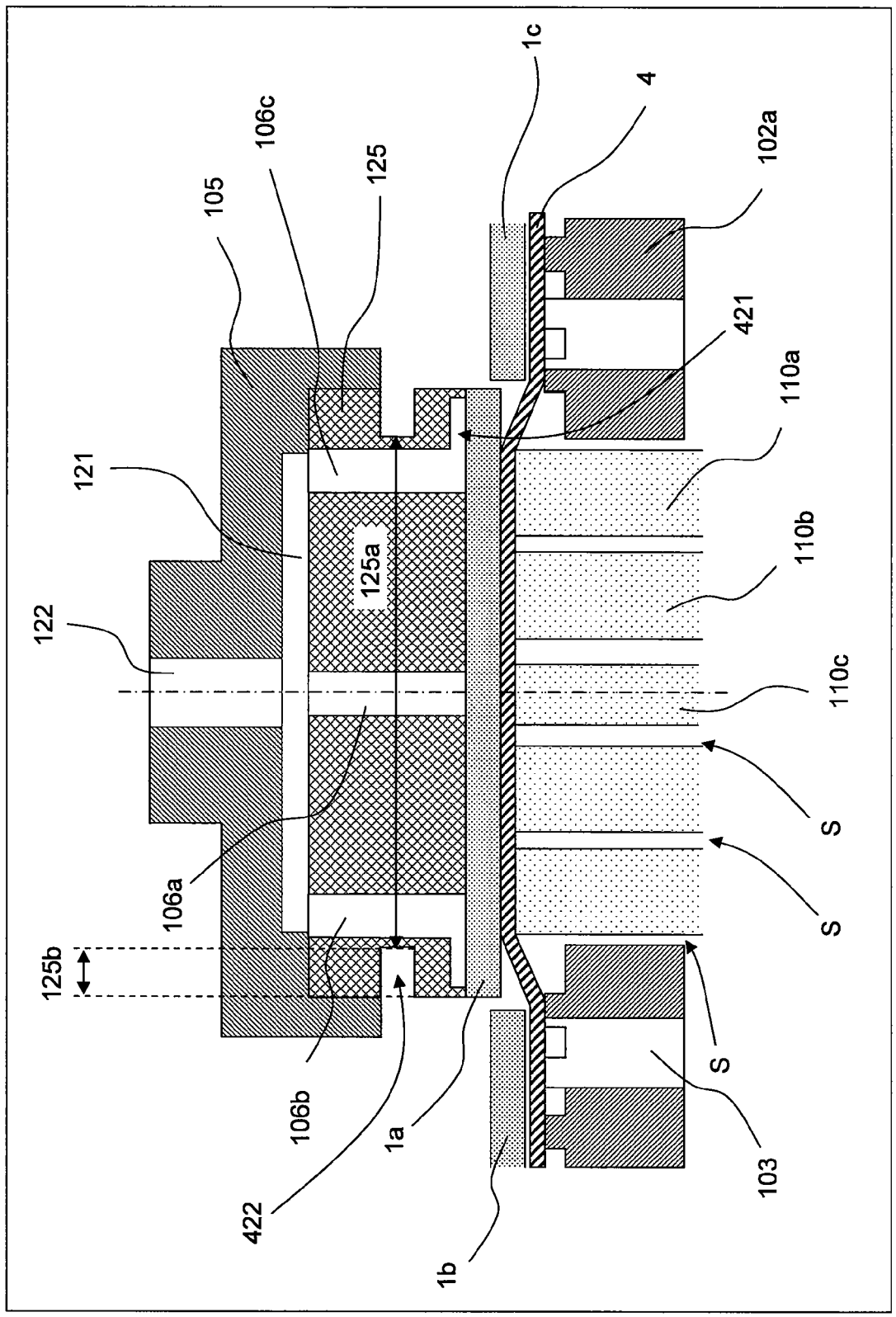
FIG. 72 is a schematic sectional view showing a state halfway in a die pick-up process (using another rubber chip having a peripheral flange) in the semiconductor integrated circuit device manufacturing method.

FIG. 72 is a schematic sectional view showing an intermediate state of the die pick-up process (using the rubber chip having a peripheral flange) in the semiconductor integrated circuit device manufacturing method embodying the present invention. With reference to the same figure, a description will be given about an example of a further rubber chip shape of reduced leak. According to this shape, in comparison with those described in section (10-1), the upper peripheral portion of the rubber chip to be fixed to the collet is thick, so that plotting and fixing are easy. A planar shape of its lower surface is the same as in FIG. 69 or 70 and therefore an explanation thereof is not repeated here.

As shown in FIG. 72, a ring-like groove 422 is formed between upper and lower surfaces of the rubber chip peripheral portion 125*b*. With the ring-like groove 422, the machinability is improved while ensuring the follow-up performance of the lower portion and the mounting (holdability) of the rubber chip to the collet 105 is facilitated. As to the size of the flange portion, it is approximately the same as in the above sub-section (10-1). The size of the ring-like groove 422 is not specially limited insofar as the follow-up performance of the lower flange portion can be ensured.

11. Summary

The present invention has been described above concretely by way of embodiments thereof and with reference to a square silicon chip as an example, but it goes without saying that the present invention is not limited to the above embodiments, but that various changes may be made within the scope not departing the gist of the invention.

For example, it goes without saying that the present invention is also applicable to picking up electronic parts on a rectangular chip, chips of other shapes, chips made of other materials than silicon, e.g., GaAs, and any other chips.

What is claimed is:

1. A method for manufacturing a semiconductor integrated circuit device, comprising the steps of:
   (a) supplying a plurality of chips divided in individual chip regions while being arranged substantially in their original two-dimensional layout upon a wafer, to a chip treating apparatus with their back surfaces fixed to an adhesive tape; and
   (b) vacuum-chucking a surface of a first chip out of the chips with a chucking collet and peeling the adhesive tape from the back surface of the first chip in a state in which the adhesive tape over the back surface of the first chip is vacuum-chucked to an upper surface of a lower base;
   the step (b) comprising a following sub-step of:
   (b1) monitoring a bent state of the first chip before complete separation of the first chip from the adhesive tape by measuring the flow rate of a vacuum chucking system of the chucking collet.

2. A method according to claim 1, wherein the step (b) further comprises the following sub-steps of:
   (b2) continuing or interrupting the peeling operation based on monitor information obtained in the sub-step (b1); and
   (b3) in case of interrupting the peeling operation, resuming the peeling operation based on the monitor information obtained in the sub-step (b1).

3. A method according to claim 1, wherein the step (b) further comprises the following sub-steps of:
   (b4) continuing or decelerating the peeling operation based on monitor information obtained in the sub-step (b1); and
   (b5) in case of decelerating the peeling operation, re-accelerating the peeling operation based on the monitor information obtained in the sub-step (b1).

4. A method according to claim 1, wherein the step (b) further comprises a following sub-step of:
   (b6) based on monitor information obtained in the sub-step (b1), continuing the peeling operation, or retreating the peeling operation until the bent state of the first chip falls under an allowable range.

5. A method according to claim 1, wherein the step (b) further comprises a following step of:
   (b7) based on monitor information obtained in the sub-step (b1), continuing the peeling operation, or decelerating the peeling operation until the bent state of the first chip falls under an allowable range.

6. A method according to claim 1, wherein the step (b) further comprises the following sub-steps of:
   (b8) raising the chucking collet until the bent state of the first chip exceeds an allowable range; and
   (b9) after the sub-step (b8) and based on monitor information obtained in the sub-step (b1), continuing the rise of the chucking collet, or bringing down the chucking collet until the bent state of the first chip falls under the allowable range.

7. A method according to claim 1, wherein the step (b) further comprises the following sub-steps of:
(b10) raising the chucking collet until the bent state of the first chip exceeds an allowable range; and
(b11) after the sub-step (b10) and based on monitor information obtained in the sub-step (b1), continuing the rise of the chucking collet, or making the chucking collet stand by until the bent state of the first chip falls under the allowable range.

8. A method according to claim 1, wherein the step (b) further comprises the following sub-steps of:
(b12) raising the chucking collet until the bent state of the first chip exceeds an allowable range; and
(b13) after the sub-step (b12) and based on monitor information obtained in the sub-step (b1), continuing the rise of the chucking collet, or decelerating the chucking collet until the bent state of the first chip falls under the allowable range.

9. A method according to claim 1, wherein the step (b) further comprises the following sub-steps of:
(b23) causing a slide plate constituting a principal portion of the lower base to slide so as to decrease an overlap thereof with the first chip until the bent state of the first chip exceeds an allowable range; and
(b24) based on monitor information obtained in the sub-step (b1), causing the slide plate to stand by until the bent state of the first chip falls under the allowable range.

10. A method according to claim 1, wherein the step (b) further comprises the following sub-steps of:
(b25) continuing or interrupting the peeling operation based on monitor information obtained in the sub-step (b1); and
(b26) in case of interrupting the peeling operation, resuming the peeling operation, or retreating the peeling operation until the bent state of the first chip falls under an allowable range, based on the monitor information obtained in the sub-step (b1).

11. A method according to claim 1, wherein the step (b) further comprises the following sub-steps of:
(b27) continuing or decelerating the peeling operation based on monitor information obtained in the sub-step (b1); and
(b28) in case of decelerating the peeling operation, re-accelerating the peeling operation, or retreating the peeling operation until the bent state of the first chip falls under an allowable range, based on the monitor information obtained in the sub-step (b1).

12. A method according to claim 1, wherein the step (b) further comprises the following sub-steps of:
(b29) raising the chucking collet until the bent state of the first chip exceeds an allowable range;
(b30) after the sub-step (b29) and based on monitor information obtained in the sub-step (b1), continuing the rise of the chucking collet, or causing the chucking collet to stand by until the bent state of the first chip falls under the allowable range; and
(b31) in case of making the chucking collet stand by until the bent state of the first chip falls under the allowable range, resuming the rise of the chucking collet, or bringing down the chucking collet until the bent state of the first chip falls under the allowable range, based on the monitor information obtained in the sub-step (b1).

13. A method according to claim 1, wherein the step (b) further comprises the following sub-steps of:

(b36) raising the chucking collet until the bent state of the first chip exceeds an allowable range;
(b37) after the sub-step (b36) and based on monitor information obtained in the sub-step (b1), continuing the rise of the chucking collet, or decelerating the chucking collet until the bent state of the first chip falls under the allowable range; and
(b38) in case of decelerating the chucking collet until the bent state of the first chip falls under the allowable range, resuming the rise of the chucking collet, or bringing down the chucking collet until the bent state of the first chip falls under the allowable range, based on the monitor information obtained in the sub-step (b1).

14. A method according to claim 1, wherein an adhesive layer for die bonding is formed beforehand over the back surface of the first chip.

15. A method for manufacturing a semiconductor integrated circuit device, comprising the steps of:
(a) providing a plurality of chips affixed to an adhesive tape; and
(b) vacuum-chucking a surface of a first of the chips with a chucking collet, vacuum-chucking the adhesive tape to an upper surface of a lower base, and peeling the adhesive tape from the first chip;
the step (b) including:
(b1) moving the chucking collet with the first chip away from the lower base,
wherein, in step (b1), a bent state of the first chip is monitored based on a measured flow rate of a vacuum system of the chucking collet so as to prevent excessive bending of the first chip before complete separation of the first chip from the adhesive tape.

16. A method according to claim 15, wherein the step (b) includes:
(b2) continuing or interrupting said peeling the adhesive tape based on the monitored bent state of the first chip; and
(b3) in case of interrupting said peeling, resuming said peeling based on the monitored bent state of the first chip.

17. A method according to claim 15, wherein the step (b) includes:
(b4) continuing or decelerating said peeling the adhesive tape based on the monitored bent state of the first chip; and
(b5) in case of decelerating said peeling, re-accelerating said peeling based on the monitored bent state of the first chip.

18. A method according to claim 15, wherein the step (b) includes:
(b6) based on the monitored bent state of the first chip, continuing said peeling the adhesive tape, or retreating said peeling the adhesive tape such that the bent state of the first chip falls within an allowable range.

19. A method according to claim 15, wherein the step (b) includes:
(b7) based on the monitored bent state of the first chip, continuing said peeling the adhesive tape, or decelerating said peeling the adhesive tape until the bent state of the first chip falls within an allowable range.

20. A method according to claim 15, wherein the step (b1) includes:
raising the chucking collet until the bent state of the first chip is outside of an allowable range; and based on the monitored bent state of the first chip, continuing the rise of the chucking collet, or lowering the chucking collet until the bent state of the first chip falls within the allowable range.

21. A method for manufacturing a semiconductor integrated circuit device, comprising the steps of:
(a) providing a plurality of chips affixed to an adhesive tape; and
(b) vacuum-chucking a surface of a first of the chips with a chucking collet vacuum-chucking the adhesive tape to an upper surface of a lower base, and peeling the adhesive tape from the first chip;
the step (b) including:
(b1) moving the chucking collet with the first chip away from the lower base,
wherein, in step (b1), a bent state of the first chip is monitored based on a measured flow rate of a vacuum system of the chucking collet so as to prevent excessive bending of the first chip before complete separation of the first chip from the adhesive tape, and
said moving in step (b1) is responsive to the monitored bent state of the first chip such that the bent state remains within an allowable range.

22. A method according to claim 21, wherein the moving in step (b1) is continued, suspended, or decelerated such that the bent state of the first chip remains within the allowable range.

23. A method for manufacturing a semiconductor integrated circuit device, comprising the steps of:
(a) providing a plurality of chips affixed to an adhesive tape; and
(b) vacuum-chucking a surface of a first of the chips with a chucking collet vacuum-chucking the adhesive tape to an upper surface of a lower base, and peeling the adhesive tape from the first chip;
the step (b) including:
(b1) moving the chucking collet with the first chip away from the lower base,
wherein, in step (b1), a bent state of the first chip is monitored based on a measured flow rate of a vacuum system of the chucking collet so as to prevent excessive bending of the first chip before complete separation of the first chip from the adhesive tape, and
the adhesive tape is peeled from the first chip by regulating the moving of the chucking collet in step (b1) based on the monitored bent state of the first chip.

24. A method according to claim 23, wherein the regulating the moving of the chucking collet includes continuing, suspending, or decelerating the moving such that the bent state of the first chip remains within the allowable range.

\* \* \* \* \*